US012004298B2

(12) United States Patent
Matsumoto et al.

(10) Patent No.: US 12,004,298 B2
(45) Date of Patent: Jun. 4, 2024

(54) SENSOR DEVICE AND METHODS OF MAKING AND USING THE SAME

(71) Applicant: Shinkawa Electric Co., Ltd., Tokyo (JP)

(72) Inventors: Kotaro Matsumoto, Tokyo (JP); Hiroyuki Matsuda, Kanagawa (JP); Hiroshi Aoki, Hiroshima (JP); Masaru Terada, Cary, NC (US); Ovel Emerson, Dunn, NC (US); Paul A. Lowe, Hillsborough, NC (US)

(73) Assignee: Shinkawa Electric Co., Ltd., Tokyo (JP)

( * ) Notice: Subject to any disclaimer, the term of this patent is extended or adjusted under 35 U.S.C. 154(b) by 375 days.

(21) Appl. No.: 17/392,817

(22) Filed: Aug. 3, 2021

(65) Prior Publication Data

US 2021/0368625 A1    Nov. 25, 2021

Related U.S. Application Data

(63) Continuation of application No. PCT/IB2020/000935, filed on Nov. 4, 2020.
(Continued)

(51) Int. Cl.
*H05K 1/18* (2006.01)
*H05K 5/00* (2006.01)
*H05K 5/03* (2006.01)

(52) U.S. Cl.
CPC ........... *H05K 1/181* (2013.01); *H05K 5/0073* (2013.01); *H05K 5/03* (2013.01);
(Continued)

(58) Field of Classification Search
CPC .................................................... H05K 1/181
(Continued)

(56) References Cited

U.S. PATENT DOCUMENTS 6,169,254 B1 * 1/2001 Pant .................... H01L 23/5387
174/254
9,322,678 B1 * 4/2016 Stawitzky ............ G01D 11/245
(Continued)

FOREIGN PATENT DOCUMENTS

JP      2017538075       * 10/2015
JP      2017538075  A    12/2017
(Continued)

OTHER PUBLICATIONS

WIPO; International Preliminary Report on Patentability for International Patent Application No. PCT/IB2020/000935 dated May 19, 2022, 7 pages.
(Continued)

*Primary Examiner* — Stanley Tso
(74) *Attorney, Agent, or Firm* — NK Patent Law

(57) ABSTRACT

Disclosed herein are devices, methods, and methods of making devices for facilitating condition monitoring of machinery allowing improve efficiencies and increased lifetime of the machinery while also reducing maintenance. In one embodiment, a device includes an enclosure assembly and a printed circuit board (PCB) assembly. The enclosure assembly includes a cap, a base mechanically coupled with the cap, and a support bracket mechanically coupled with the base. The PCB assembly includes a processor, a memory coupled with the processor, a first sensor electrically coupled with the processor, a second sensor electrically coupled with the processor, and a communication interface electrically coupled with the processor. The device, when installed, may generally form a shape of a tapered cylinder having a maximum height of 2.1 inches and a maximum diameter of 1.2 inches.

20 Claims, 78 Drawing Sheets

Related U.S. Application Data

(60) Provisional application No. 63/058,234, filed on Jul. 29, 2020, provisional application No. 62/930,192, filed on Nov. 4, 2019.

(52) U.S. Cl.
CPC .............. *H05K 2201/09827* (2013.01); *H05K 2201/10037* (2013.01); *H05K 2201/10098* (2013.01); *H05K 2201/10151* (2013.01); *H05K 2201/10159* (2013.01); *H05K 2201/10583* (2013.01)

(58) Field of Classification Search
USPC .......................................................... 361/760
See application file for complete search history.

(56) References Cited

U.S. PATENT DOCUMENTS

| | | | | |
|---|---|---|---|---|
| 9,913,006 | B1* | 3/2018 | Wascat | .................... H04W 4/80 |
| 10,697,809 | B1 | 6/2020 | Muller et al. | |
| 2012/0319866 | A1 | 12/2012 | Svoen et al. | |
| 2014/0152451 | A1* | 6/2014 | Murphy | ................ F16C 19/525 |
| | | | | 340/682 |
| 2016/0237657 | A1* | 8/2016 | Carpenter | ............... E02F 9/267 |
| 2018/0144638 | A1* | 5/2018 | Alessi | .................. G05D 1/0214 |
| 2018/0171783 | A1 | 6/2018 | Van Pol | |

FOREIGN PATENT DOCUMENTS

| | | | |
|---|---|---|---|
| WO | WO 2015/144770 | * | 3/2015 |
| WO | 2015144770 A1 | | 10/2015 |

OTHER PUBLICATIONS

ISA/JP; International Search Report and Written Opinion for International Patent Application No. PCT/IB2020/000935 dated May 11, 2021, 14 pages.

Japanese Patent Office, Office Action in Japanese Patent Application No. 2022-524963 dated Jun. 8, 2023, 12 Pages.

EPO, Extended European Search Report for European Patent Application No. 20884014.0 dated Oct. 26, 2023, 8 pages.

Indian Patent Office, Office Action for Indian Patent Application No. 202247029411 dated Nov. 1, 2023, 7 pages.

* cited by examiner

DIAGRAM
800

EXPLODED VIEW

US MARKET VERSION

DIAGRAM
900

NON-PIVOTING BASE

AXIS MARKING

US MARKET VERSION

DIAGRAM
910

NON-PIVOTING BASE

JAPAN MARKET VERSION

DIAGRAM
1200

DIAGRAM
1210

MECHANICAL
DIAGRAM
1410

BATTERY HOLDER

JAPAN MARKET VERSION

MECHANICAL
DIAGRAM
1500

METAL SUPPORT BRACKET

US MARKET VERSION

MECHANICAL
DIAGRAM
1570

METAL SUPPORT BRACKET

JAPAN MARKET VERSION

MECHANICAL
DIAGRAM
<u>1610</u>

NON PIVOTING BASE

JAPAN MARKET VERSION

MECHANICAL
DIAGRAM
1620

NON PIVOTING BASE

US MARKET VERSION

MECHANICAL
DIAGRAM
1630

NON PIVOTING BASE

JAPAN MARKET VERSION

MECHANICAL
DIAGRAM
1640

NON PIVOTING BASE

US MARKET VERSION

MECHANICAL
DIAGRAM
1650

NON PIVOTING BASE

JAPAN MARKET VERSION

MECHANICAL
DIAGRAM
<u>1660</u>

NON PIVOTING BASE

US MARKET VERSION

SENSOR DEVICE AND METHODS OF MAKING AND USING THE SAME

CROSS-REFERENCE TO RELATED APPLICATION

This application is a continuation of International Patent Application No. PCT/IB2020/000935 filed on Nov. 4, 2020, which claims the benefit of U.S. Provisional Patent Application No. 63/058,234 filed on Jul. 29, 2020, and claims the benefit of U.S. Provisional Patent Application No. 62/930,192 filed on Nov. 4, 2019 the entire contents of which are all hereby incorporated herein by reference.

TECHNICAL FIELD

The present invention relates generally to sensors and more specifically to smart sensors for monitoring of machinery.

BACKGROUND

Condition monitoring is an important tool for preventing failures, increasing reliability, and reducing maintenance of machines. Such machines can include engines, compressors, turbines, rollers, gear boxes, fans, pumps, electric motors, and the like. Specifically, vibration and temperature are two key parameters in condition monitoring. By analyzing vibration and temperature data, early detection of machine failures can be realized. Such issues include bearing failures, bent shafts, over speed, resonance, out-of-alignment, out-of-balance, excessive clearance between parts (mechanical looseness), or the like.

As machinery and condition monitoring become more complex, improved methods and devices are needed for collection of performance data that may be used to improve efficiency and increase lifetime of the machinery while also reducing maintenance.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Disclosed herein are devices, methods, and methods of making devices for facilitating condition monitoring of machinery allowing improve efficiencies and increased lifetime of the machinery while also reducing maintenance. In one embodiment, a device includes an enclosure assembly and a printed circuit board (PCB) assembly. The enclosure assembly includes a cap, a base mechanically coupled with the cap, and a support bracket mechanically coupled with the base. The PCB assembly includes a processor, a memory coupled with the processor, a first sensor electrically coupled with the processor, a second sensor electrically coupled with the processor, and a communication interface electrically coupled with the processor. The device, when installed, may generally form a shape of a tapered cylinder having a maximum height of 2.1 inches and a maximum diameter of 1.2 inches.

In some embodiments, the communication interface may be a wireless communication interface and at least a portion of the cap may be substantially radio frequency (RF) transparent. In certain embodiments, the wireless communication interface may be a Bluetooth® interface. More specifically, the wireless communication interface may be a Bluetooth® Low Energy (BLE) interface.

In some embodiments, the first sensor may be a vibration sensor and the second sensor may be a temperature sensor. In certain the vibration sensor may be an accelerometer sensor and the temperature sensor may be a thermocouple, a thermistor, or the like.

In some embodiments, the device may include a battery clamp and the battery clamp may be positioned on the PCB assembly. The PCB assembly may include three rigid sections for component placement electrically coupled using two flexible PCB interconnects. The device may further include a battery and the battery may be a lithium battery. The processor and the memory may be embedded in a microcontroller/module.

In some embodiments, the device may include a third sensor. In this embodiment the first sensor may be a low-sensitivity vibration sensor configured to operate in a sleep state of the device. The first sensor may be further configured to trigger the device into an active state. The second sensor may be a temperature sensor and the third sensor may be a high-sensitivity vibration sensor configured to operate in an active state of the device. In certain embodiment, the third sensor may be a triaxial accelerometer sensor having an x-axis, a y-axis, and a z-axis. The triaxial accelerometer sensor may be positioned such that the z-axis is approximately perpendicular to a mounting surface of the base.

In some embodiments, the base may be configured to allow the mounting surface to be attached to a machine surface to allow monitoring of machine vibration and machine temperature. The base may also be configured to allow the support bracket to be rotated by a user around a perpendicular axis of the mounting surface while the PCB assembly and the triaxial accelerometer sensor remain stationary relative to the support bracket. In certain embodiments, the base may include a threaded mounting stud positioned approximately perpendicular to the mounting surface. In other embodiments, the mounting surface may be magnetic or include an adhesive for coupling with the machine surface.

In another embodiment, a method is disclosed for manufacturing a device. The method includes mechanically assembling a PCB assembly within an enclosure assembly. The PCB assembly includes a processor, a memory coupled with the processor, a first sensor electrically coupled with the processor, a second sensor electrically coupled with the processor, and a communication interface electrically coupled with the processor. The enclosure assembly includes a cap, a base mechanically coupled with the cap, and a support bracket mechanically coupled with the base.

In another embodiment, a method is disclosed for monitoring a machine. The method includes installing a device on the machine. The device includes an enclosure assembly and a PCB assembly. The enclosure assembly includes a cap, a base mechanically coupled with the cap, and a support bracket mechanically coupled with the base. The PCB assembly includes a processor, a memory coupled with the processor, a first sensor electrically coupled with the processor, a second sensor electrically coupled with the processor, and a communication interface electrically coupled with the processor. The method further includes receiving first sensor data and second sensor data transmitted by the device via the communication interface.

DETAILED DESCRIPTION

DETAILED DESCRIPTION

The presently disclosed subject matter is described with specificity to meet statutory requirements. However, the description itself is not intended to limit the scope of this patent. Rather, the inventors have contemplated that the claimed invention might also be embodied in other ways, to include different steps or elements similar to the ones described in this document, in conjunction with other present or future technologies. Moreover, although the term "step" may be used herein to connote different aspects of methods employed, the term should not be interpreted as implying any particular order among or between various steps herein disclosed unless and except when the order of individual steps is explicitly described.

Condition monitoring for reliability and analysis can integrate improved sensors for vibration monitoring and temperature monitoring. Applications include process monitoring for the production of foods, pharmaceuticals, consumables including cars, paper, planes, and other types of equipment and soft goods. Additionally, applications for improved sensors may be integrated into the health fields.

Figure 1:
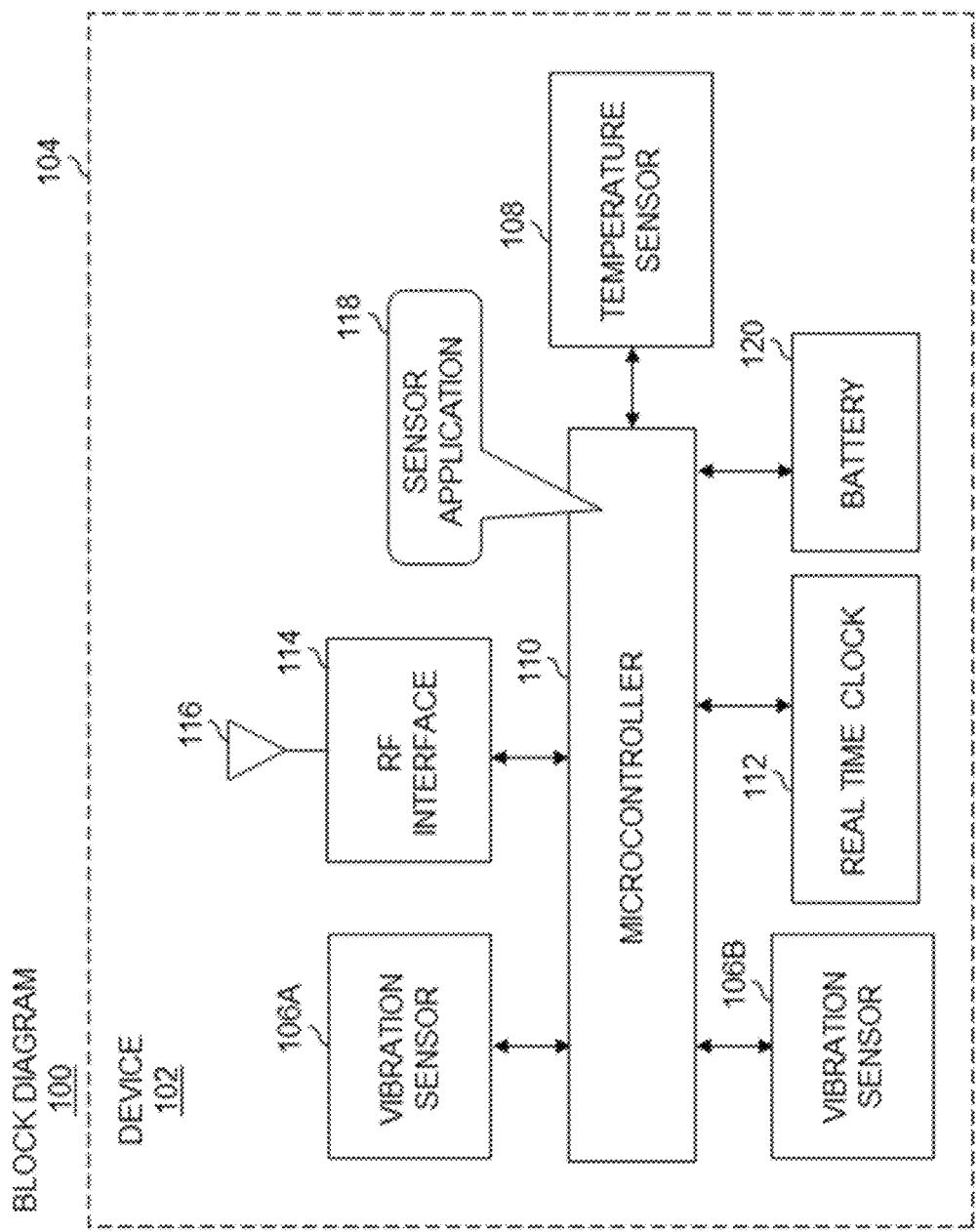
FIG. 1 depicts a block diagram illustrating a device for mounting on a machine for condition monitoring in accordance with embodiments of the present disclosure.

FIG. 1 depicts a block diagram 100 illustrating a device 102 for mounting on a machine for condition monitoring in accordance with embodiments of the present disclosure. The enclosure 104 houses vibration sensors 106A and 106B; and a temperature sensor 108 both electrically coupled with a microcontroller 110. The enclosure also houses a real time clock 112, a radio frequency (RF) interface 114, and an antenna 116. The real time clock 112 is electrically coupled with the microcontroller to allow vibration data and temperature data to be time stamped. The RF interface 114 is electrically coupled with the processor 114 and the antenna 116 to a communication interface for the device 102. A sensor application 118 comprises program instructions stored in memory within the microcontroller 110. The program instructions when executed by the microcontroller 110 perform steps to facilitate condition monitoring of a machine. The enclosure 104 also houses a battery 120. The microcontroller 110 is configured to monitor a current charge and/or a remaining battery life.

In some embodiments, the RF interface 114 may be a Bluetooth® Low Energy (BLE) interface and may be compliant with Institute of Electrical and Electronics Engineer (IEEE) 802.15.4 technical standard. For example, the microcontroller 110, the wireless communication interface 114 and the antenna 116 may be integrated into a single PCB module such the Laird's 451-00001 BL654 series module.

In other embodiments, the microcontroller 110 may be an ultra-low-power microcontroller. For example, the microcontroller 110 may be the Renesas® Synergy R7FS1JA783A01CFM Microcontroller Unit (MCU) or similar MCU. The R7FS1JA783A01CFM MCU is based on a 48 MHz Arm Cortex-M23 processor core with 256 kilobytes (KB) code flash, 32 KB static random access memory (SRAM) memory, and multiple analog-to-digital converters (ADCs) and digital-to-analog converters (DACs).

The device 102 is configured to operate in a sleep state and an active state. The vibration sensor 106A is a low sensitivity vibration sensor used to transition the device 102 from the sleep state to the active state. The vibration sensor 106B is a high sensitivity vibration sensor allowing detailed measurements of a machine to detect issues such as bearing failures, bent shafts, over speed, resonance, out-of-alignment, out-of-balance, excessive clearance between parts (mechanical looseness), or the like.

In certain embodiments (not shown in FIG. 1), the device 102 may also include an electric field (E-field) sensor and/or a magnetic field (H-field) sensor to measure electric and magnetic fields (EMFs). The device 102 may also include a tilt sensor for detecting orientation and/or inclination of a machine.

In some embodiments, the enclosure 104 includes a base and a cap that generally form the shape of a tapered cylinder (not shown in FIG. 1). At least a portion of the cap is substantially RF transparent allowing wireless communication via the antenna 116. The base comprises stainless steel for optimum heat and vibration transfer from the machine to the vibration sensors 106A and 106B; and the temperature sensor 108.

Figure 2A:
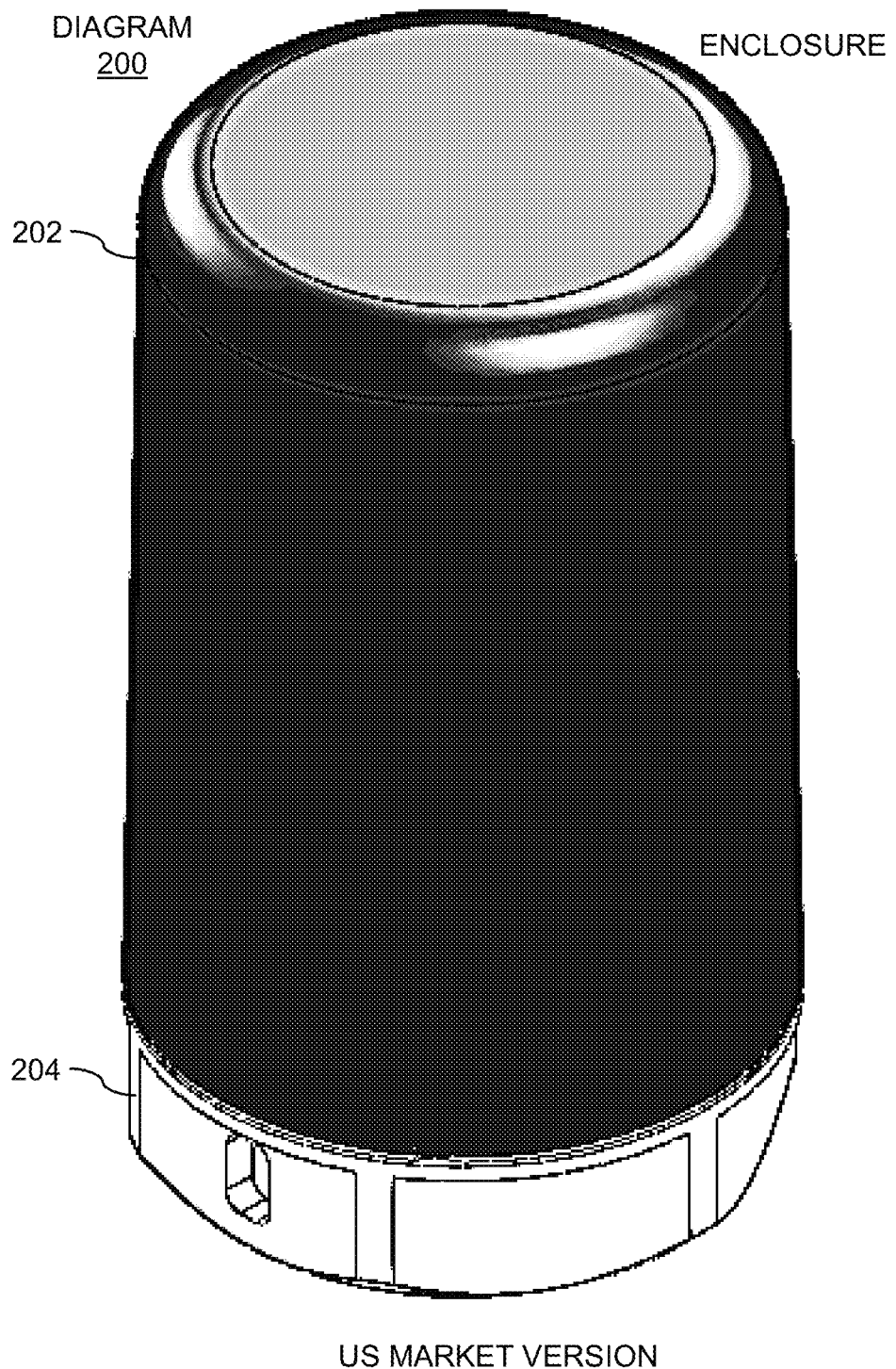
FIG. 2A and FIG. 2B depicts diagram illustrating enclosures as applicable for the device of FIG. 1 for the United States (US) market and the Japan market respectively in accordance with embodiments of the present disclosure.
Figure 2B:
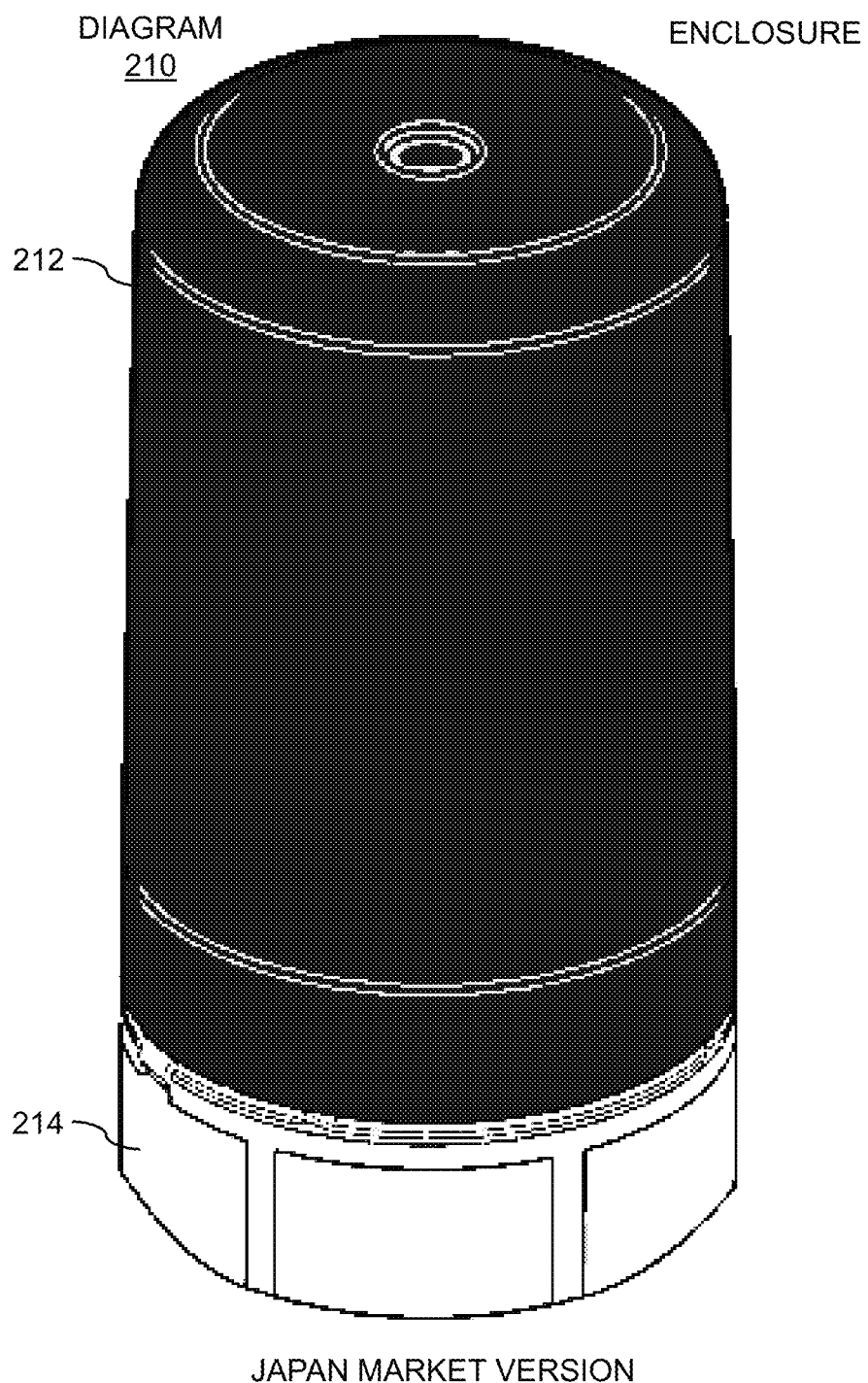

FIG. 2A depicts a diagram 200 illustrating an enclosure as applicable for the device of FIG. 1 for the United States (US) market in accordance with embodiments of the present disclosure. The enclosure includes a cap 202 and a base 204. FIG. 2B depicts a diagram 210 illustrating an enclosure as applicable for the device of FIG. 1 for the Japan market in accordance with embodiments of the present disclosure. The enclosure includes a cap 212 and a base 214. Throughout the balance of this disclosure, the given diagram will be labeled as US market version or Japan market version when specific to the given market.

Figure 3A:
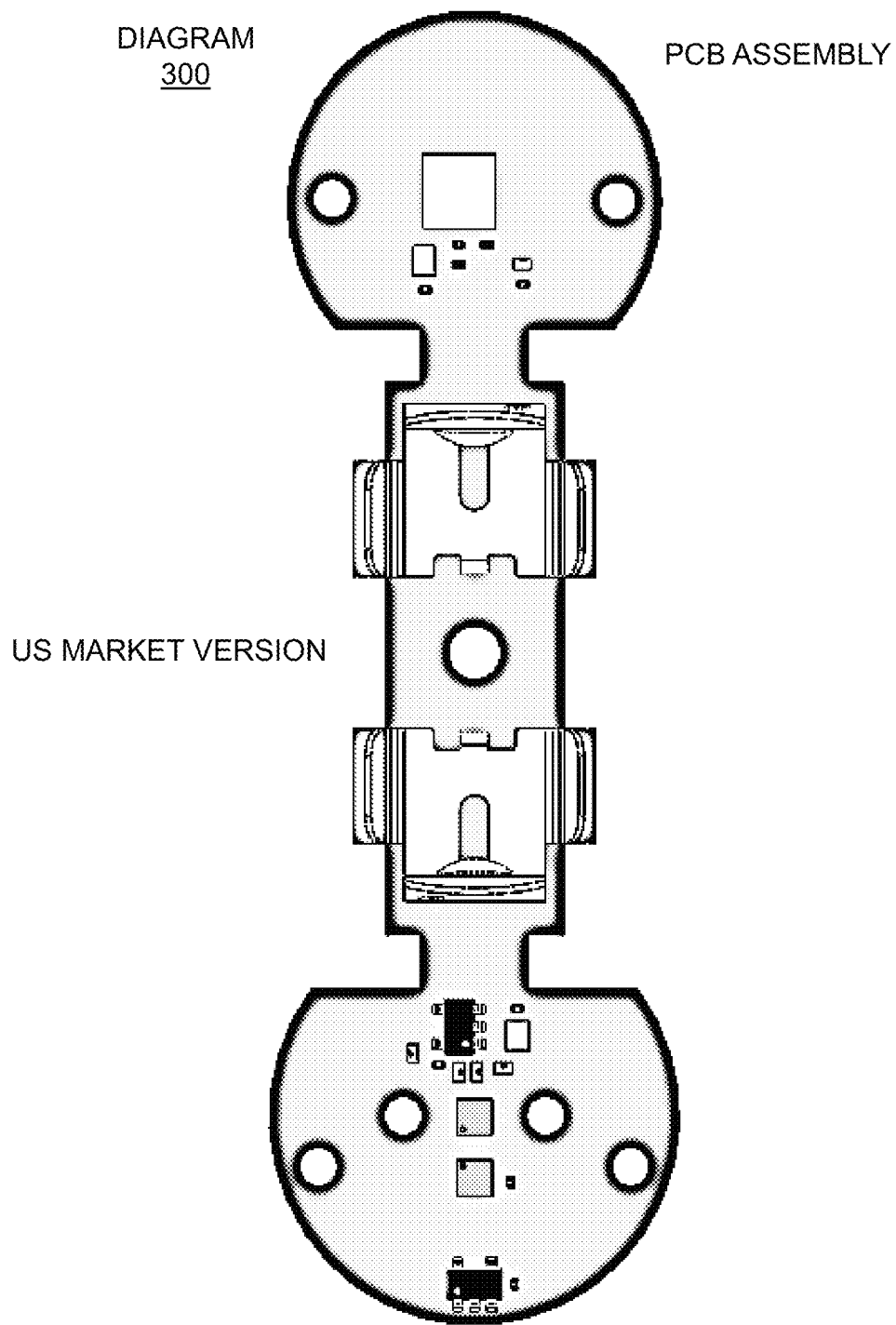
FIG. 3A through FIG. 3D depict diagrams illustrating a printed circuit board (PCB) assembly as applicable for the device of FIG. 1 for the US market in accordance with embodiments of the present disclosure.
Figure 3B:
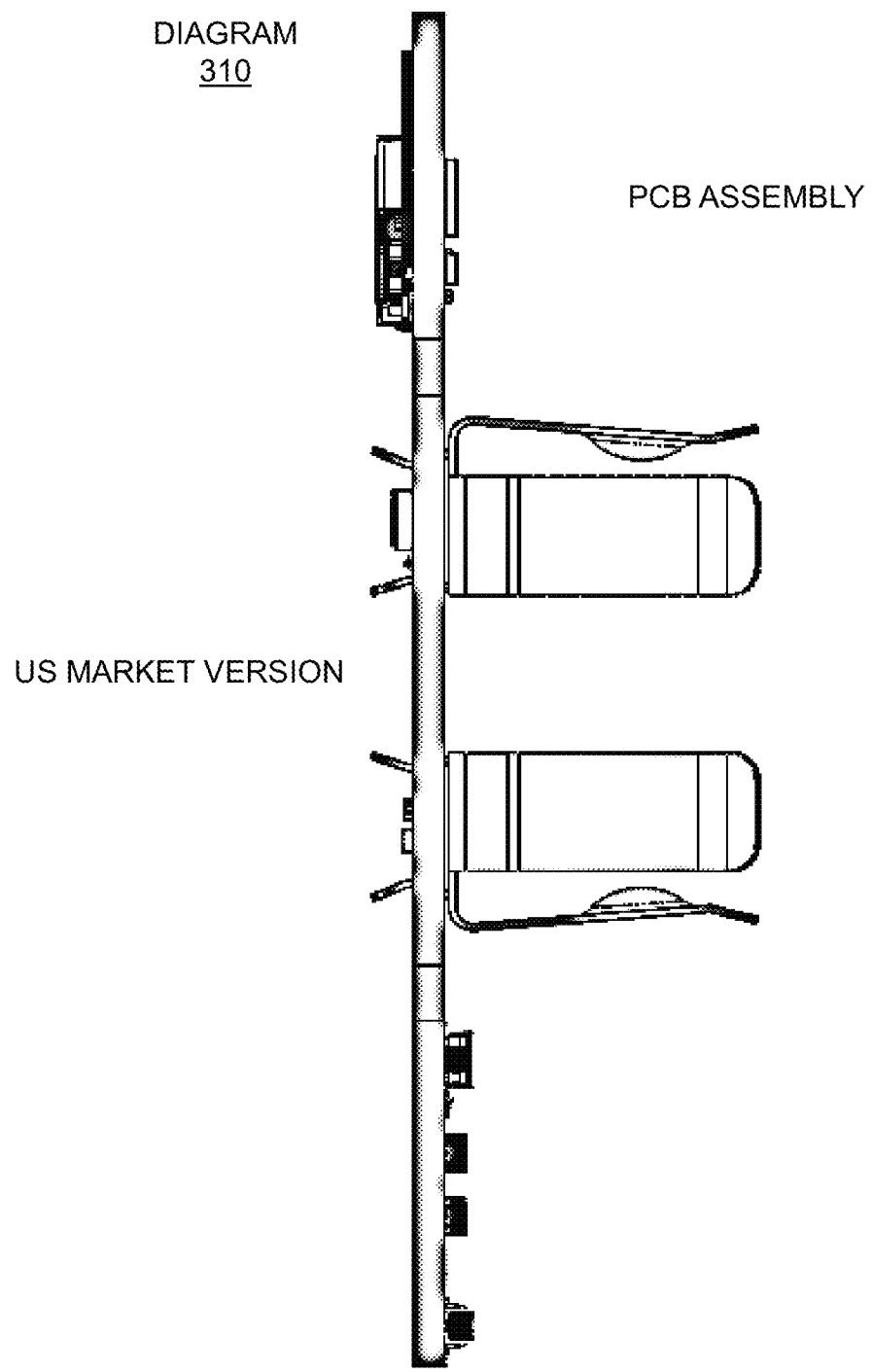
Figure 3C:
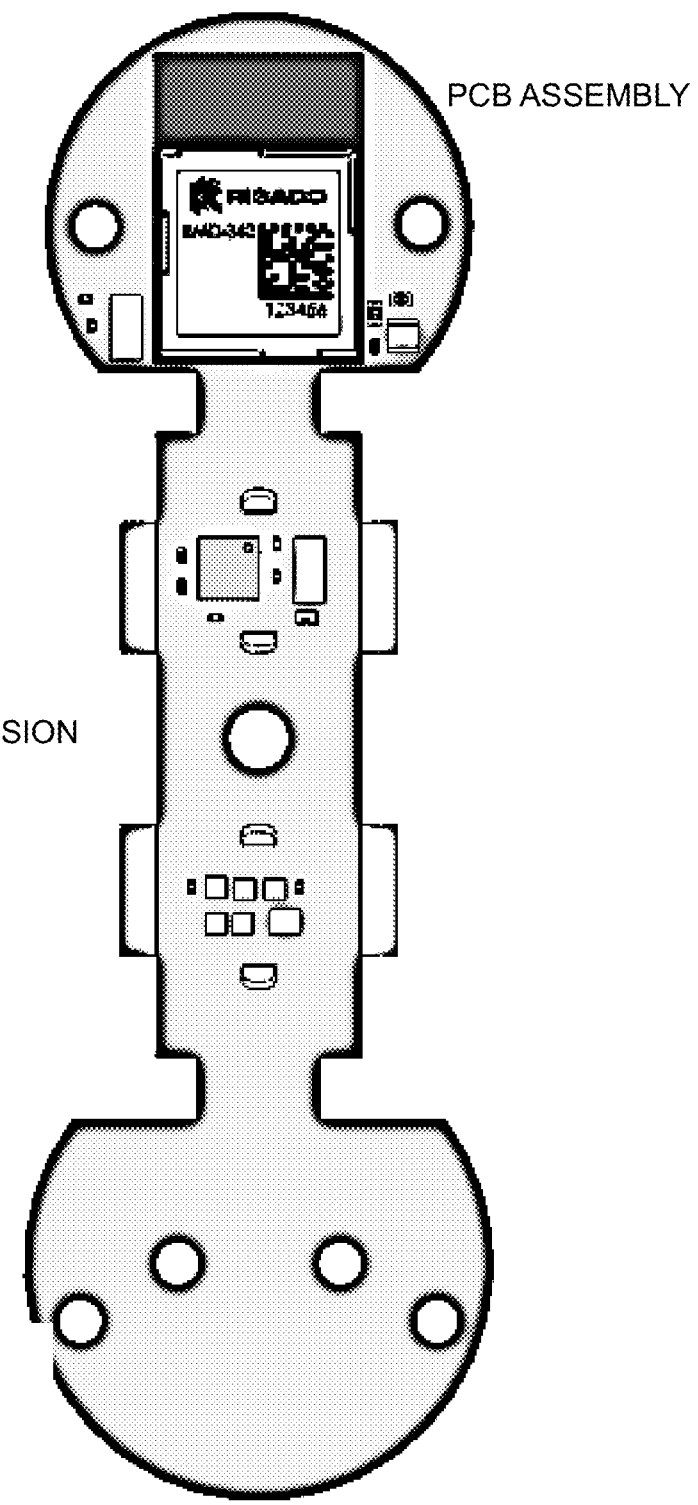
Figure 3D:
Figure 3E:
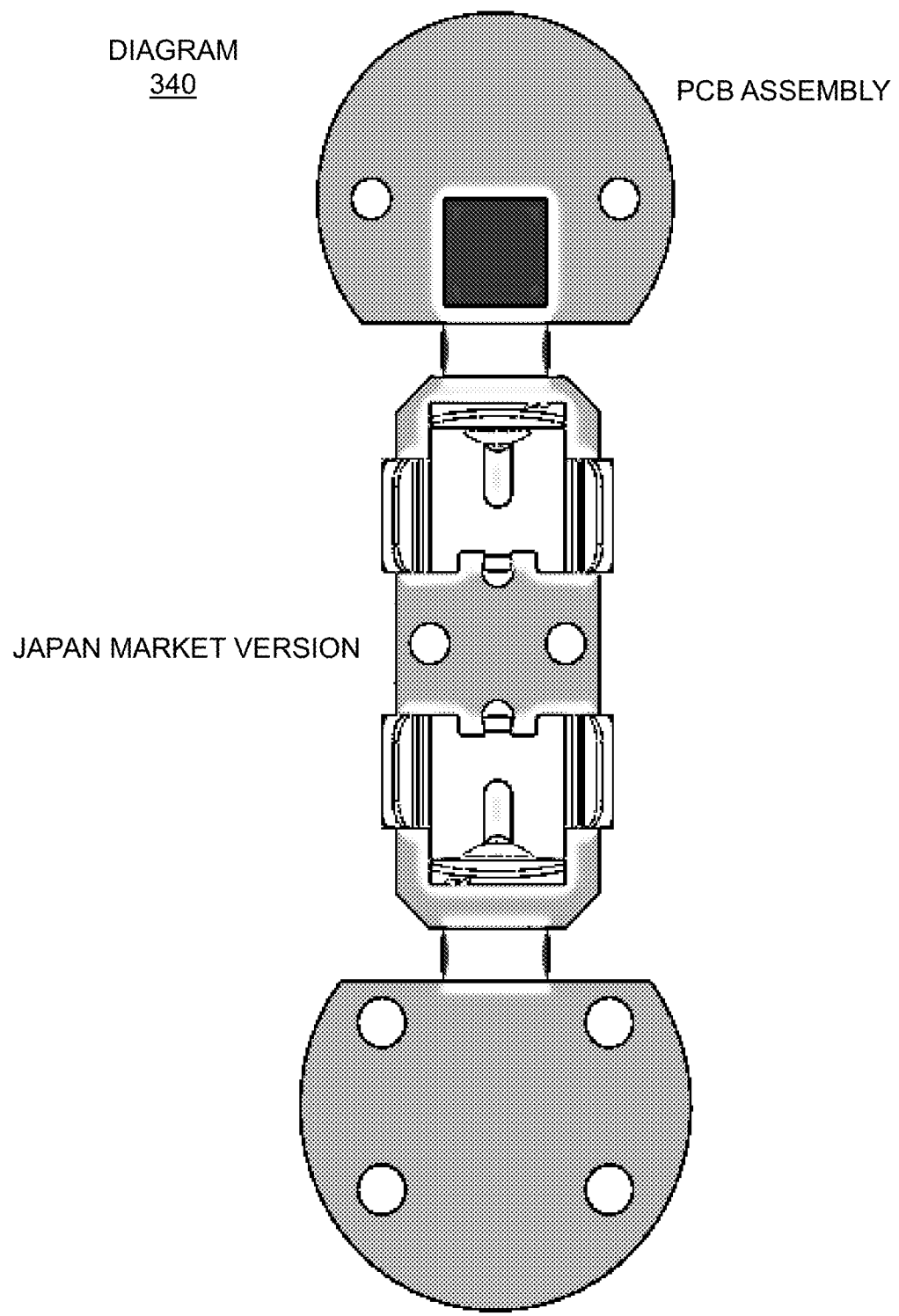
FIG. 3E through FIG. 3G depict diagrams illustrating a PCB assembly as applicable for the device of FIG. 1 for the Japan market in accordance with embodiments of the present disclosure.
Figure 3F:
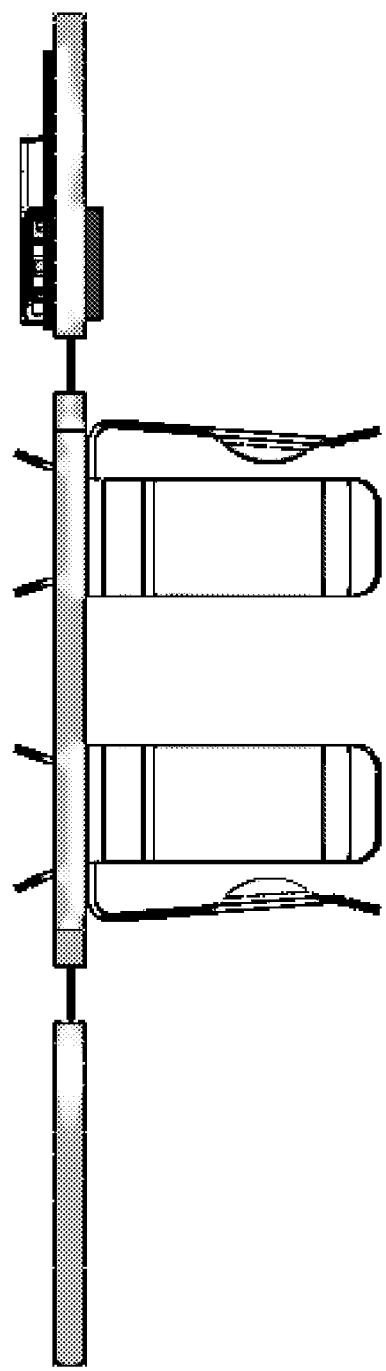
Figure 3G:
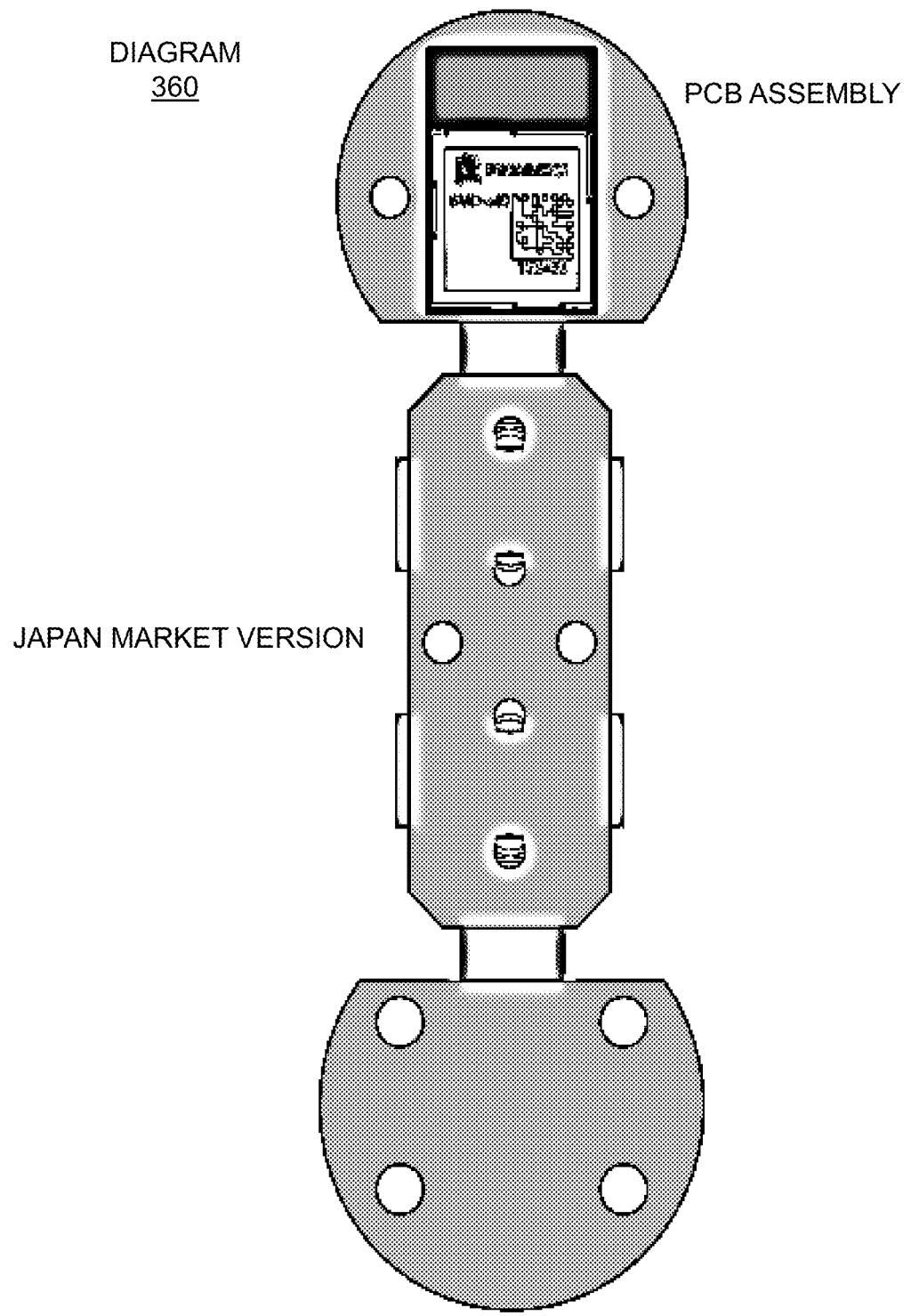

FIG. 3A through FIG. 3D depict diagrams 300, 310, 320, and 330 illustrating different views of a printed circuit board (PCB) assembly as applicable for the device of FIG. 1 for the US market in accordance with embodiments of the present disclosure. FIG. 3E through FIG. 3G depict diagrams 340, 350, and 360 illustrating different views of a PCB assembly as applicable for the device of FIG. 1 for the Japan market in accordance with embodiments of the present disclosure. Each PCB assembly (US market version and Japan market version secures and provides electrical coupling for the vibration sensors 106A and 10B; the temperature sensor 108, the microcontroller 110, the real time clock 112, the RF interface 114, and the antenna 116. Each PCB assembly also provides a battery holder for the battery 120. The battery holder includes standard spring steel.

Each PCB assembly (i.e. single assembly) includes a three-tiered printed circuit board having three rigid sections for component placement electrically coupled using two flexible PCB interconnects. Specifically the arrangement is cascaded as a first rigid section (i.e. lower horizontal section), a first flexible PCB interconnect, a second rigid section (i.e. vertical section), a second flexible PCB interconnect, and a third rigid section (i.e. upper horizontal section). The two flexible PCB interconnects allow for a reduction in vibration between the rigid sections. This arrangement allows the microcontroller 110 including memories, RF interface 114 and the antenna 116 (e.g. Bluetooth module) to be mounted on the third rigid section and physically farthest from the machine being monitored. Additionally, this allows communication interface 114 and the antenna 116 an optimum line-of-sight RF transmission path. The third rigid section also includes a light emitting diode (LED) and a switch (not shown if FIG. 1). The LED is a multicolor LED for indicating different status states of the device 102. The switch is used to remove power from flash memory (not shown if FIG. 1) thus lowering overall power drain and extending battery life.

The vibration sensors 106A and 106B, and the temperature sensor 108 are mounted on the first rigid section (i.e. bottom section) and physically closest to the machine. This arrangement allows optimum monitoring of the machine. A copper feedthrough on the first rigid section which allows metal heat transferring contact from the Stainless-Steel base and gives a direct metal contact path to the bottom of the temperature sensor 108. This allows for faster response to temperature changes and more accurate readings of the machine's surface temperature.

The vibration sensor 106B is a precision triaxial micro-electro-mechanical system (MEMS) accelerometer. The vibration sensor 106B is positioned approximately centered on the first rigid section board using two screws that are positioned at opposite sides of the vibration sensor 106B. This arrangement positions the vibration sensor 106B directly over a ¼-28 mounting stud on the base which affixes the vibration sensor 106B (via the case) to the machine. As such, a direct mechanical transmission path is created for the vibration up from the machine surface, through the ¼-28 mounting stud, into stainless steel structure of the base, and into the first rigid section where the vibration sensor 106B is mounted.

The vibration sensor 106A is an ultra-low powered MEMS accelerometer and is mounted beside the vibration sensor 106B. The vibration sensor 106A is used to continuously watch for sudden large increases in vibration and if it sees large increases in vibration then it will wake up the vibration sensor 106B along with the RF interface 114. This simulates continuous monitoring. As such, the device 102 is essentially always on and can capture sudden increases in vibration above a programmable range. The reason for the two different accelerometers is the level of precision and dynamic ranges are different.

The first rigid section also includes a voltage regulator and a power switch for the regulator (not shown in FIG. 1).

The battery 120 is mounted to the second rigid section and is suspended away from the first rigid section. As such, reducing its impact on the vibration measurements and easing a user's ability to change it when needed. The battery 120 is a ½AA lithium battery. The battery 120 and the device 102 overall are configured for an operating environment of −55 to +85 degrees Celsius. The second rigid section also includes the real time clock 112, and level shifters (not shown in FIG. 1) for electrical coupling between components.

In other embodiments, the second rigid section may be adapted in size and shape to hold one or more coin cell batteries. The one or more coin cell batteries may include sizes AG1, AG3, AG4, AG10, AG12, AG13, or the like. In still other embodiments, the second rigid section may be adapted in size and shape to hold other battery types and form factors as required.

Figure 4A:
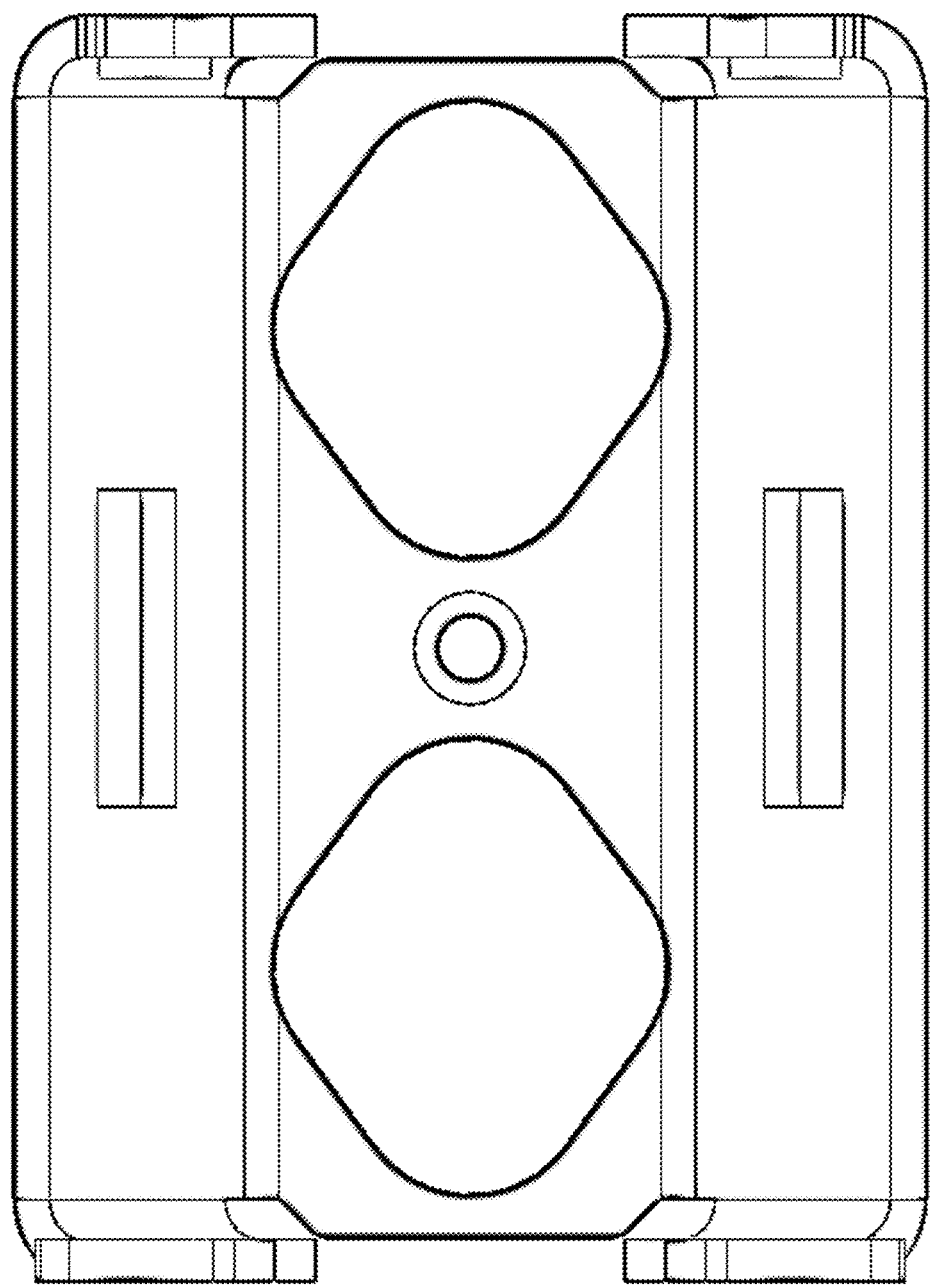
FIG. 4A and FIG. 4B depict diagrams illustrating a metal support bracket as applicable to the PCB assembly of FIG. 3A through FIG. 3D for the US market in accordance with embodiments of the present disclosure.
Figure 4B:
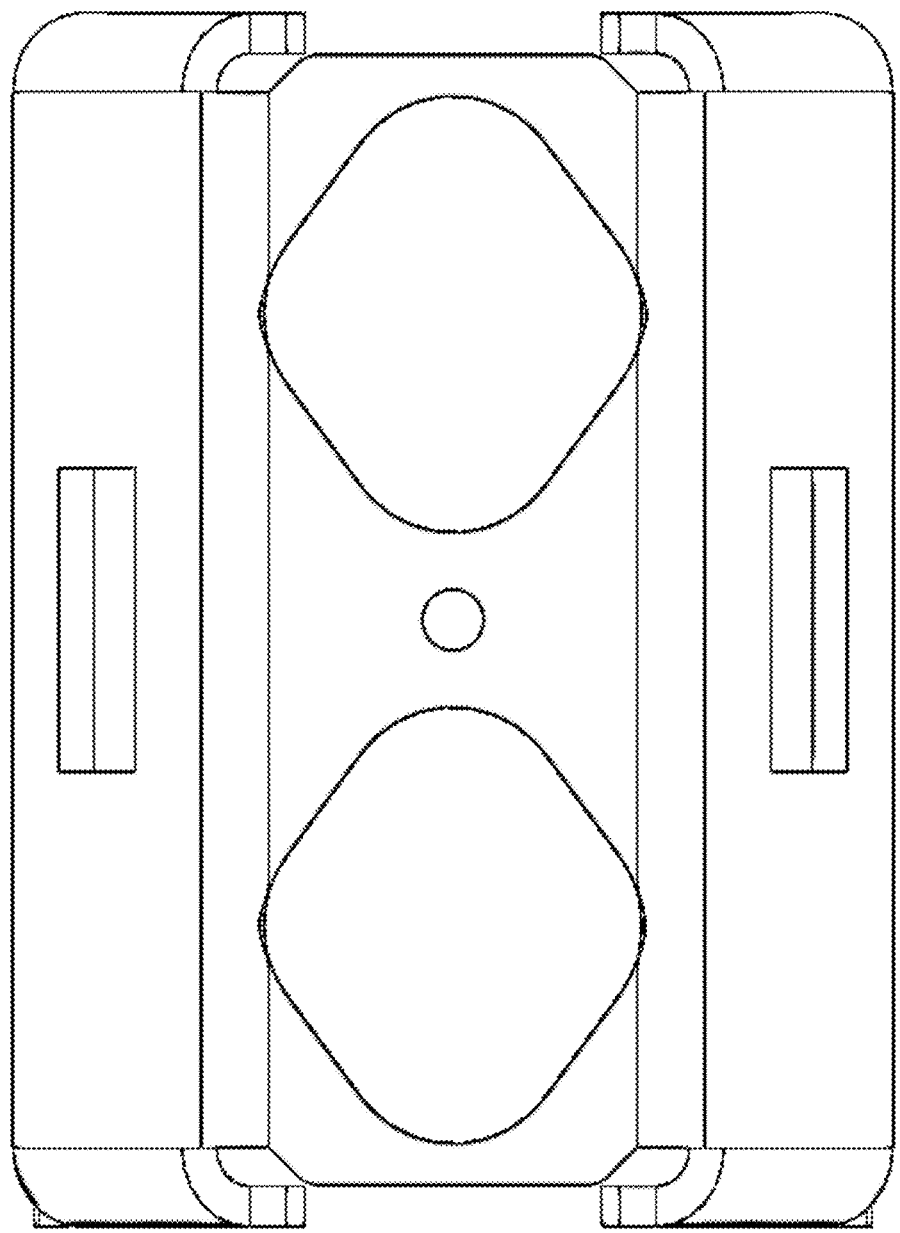
Figure 4C:
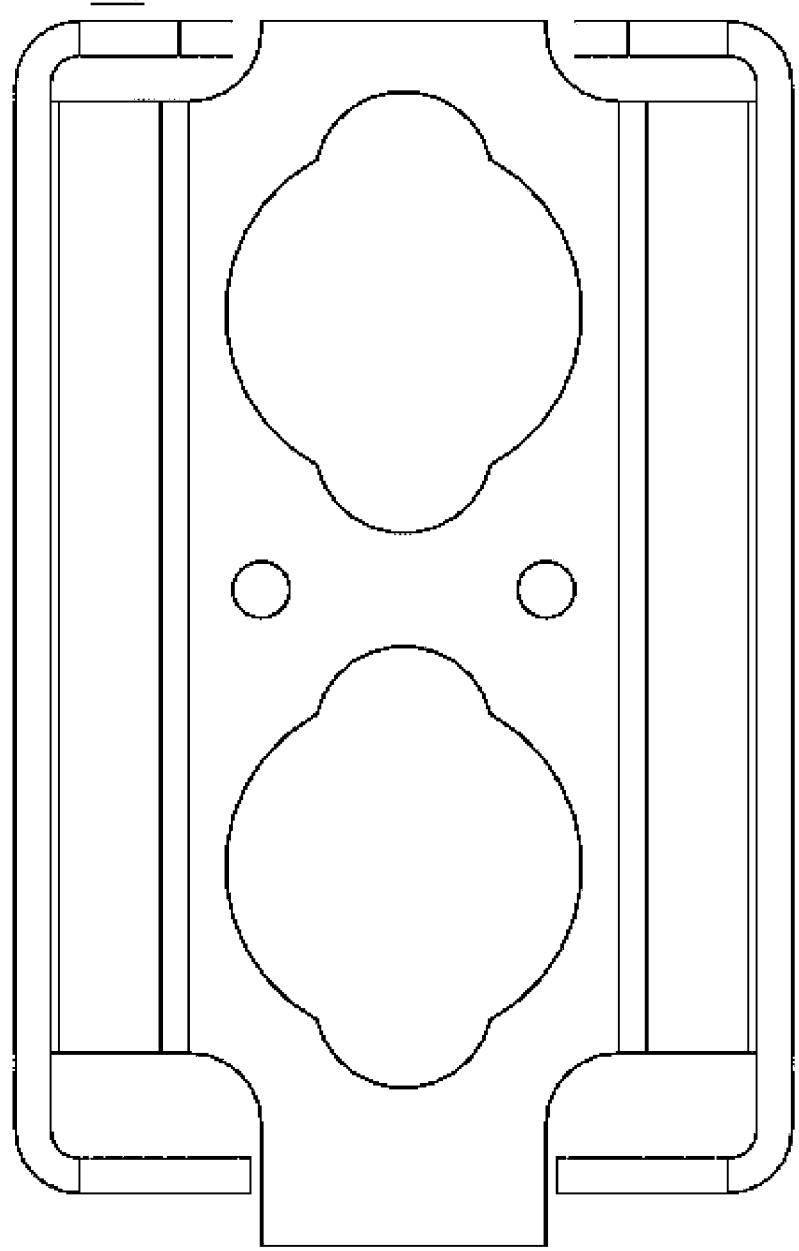
FIG. 4C and FIG. 4D depict diagrams illustrating a metal support bracket as applicable to the PCB assembly of FIG. 3E through FIG. 3G for the Japan market in accordance with embodiments of the present disclosure.
Figure 4D:
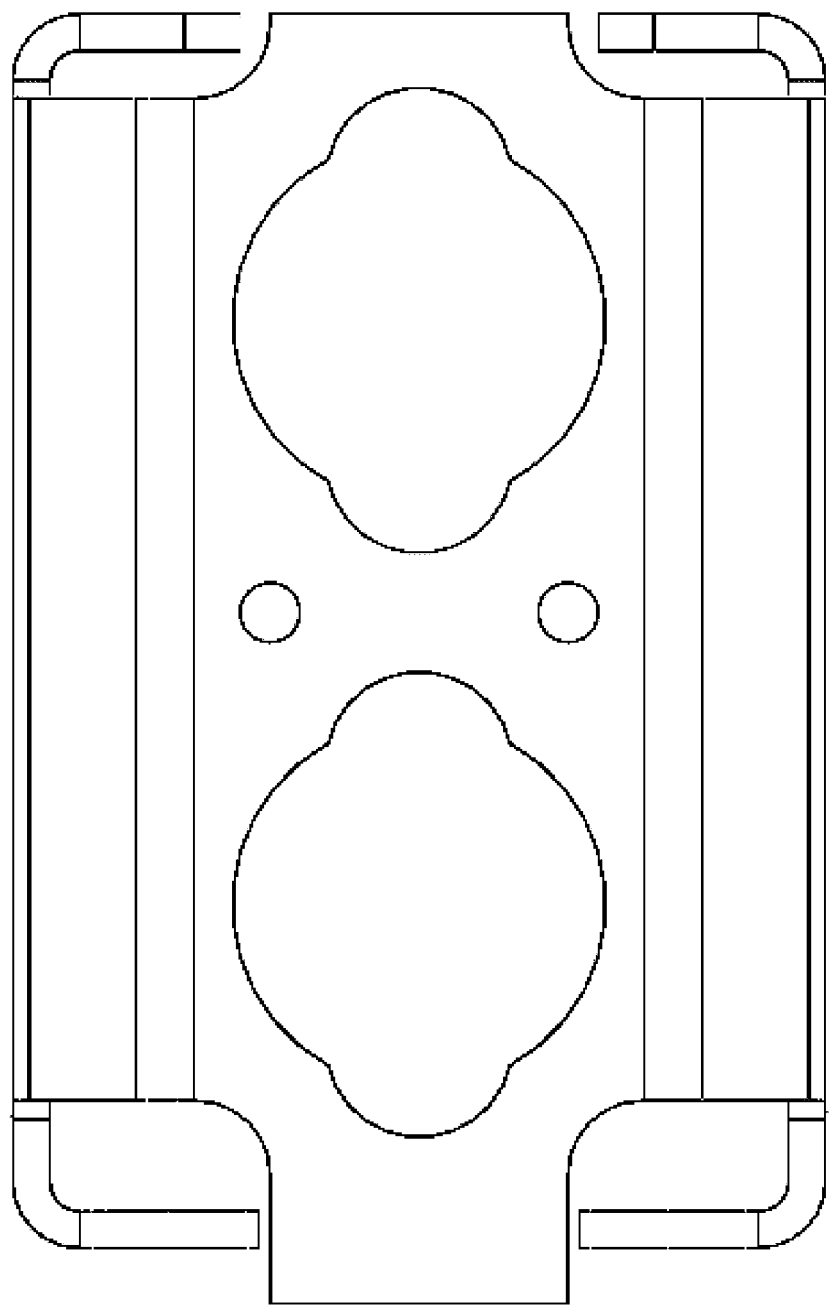

FIG. 4A and FIG. 4B depict diagrams 400 and 410 illustrating two views (front and back) of a metal support bracket as applicable to the PCB assembly of FIG. 3A through FIG. 3D for the US market in accordance with embodiments of the present disclosure. FIG. 4C and FIG. 4D depict diagrams 420 and 430 illustrating two views (front and back) of a metal support bracket as applicable to the PCB assembly of FIG. 3E through FIG. 3G for the Japan market in accordance with embodiments of the present disclosure. The metal support brackets are used to secure the PCB assemblies to their respective base.

Figure 5A:
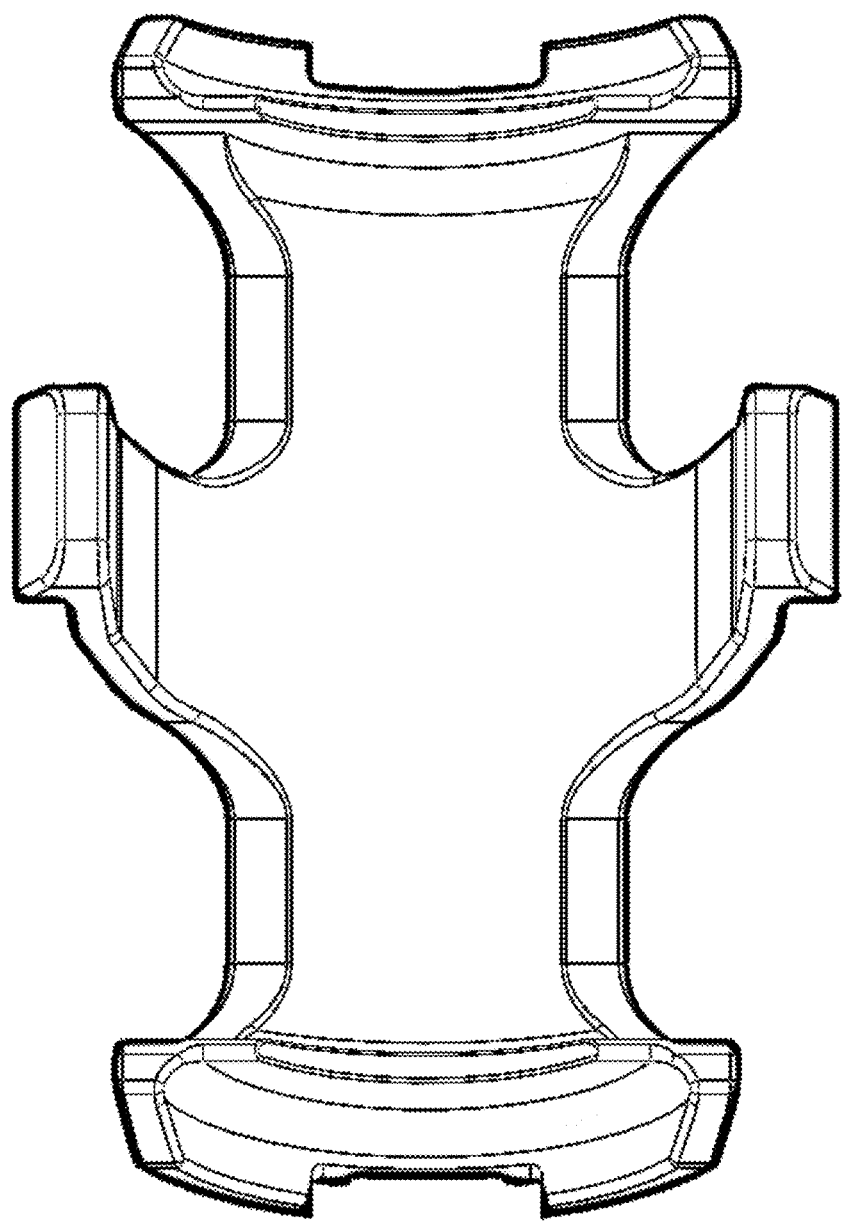
FIG. 5A and FIG. 5B depict diagrams illustrating a battery support as applicable to the PCB assembly of FIG. 3A through FIG. 3D for the US market in accordance with embodiments of the present disclosure.
Figure 5B:
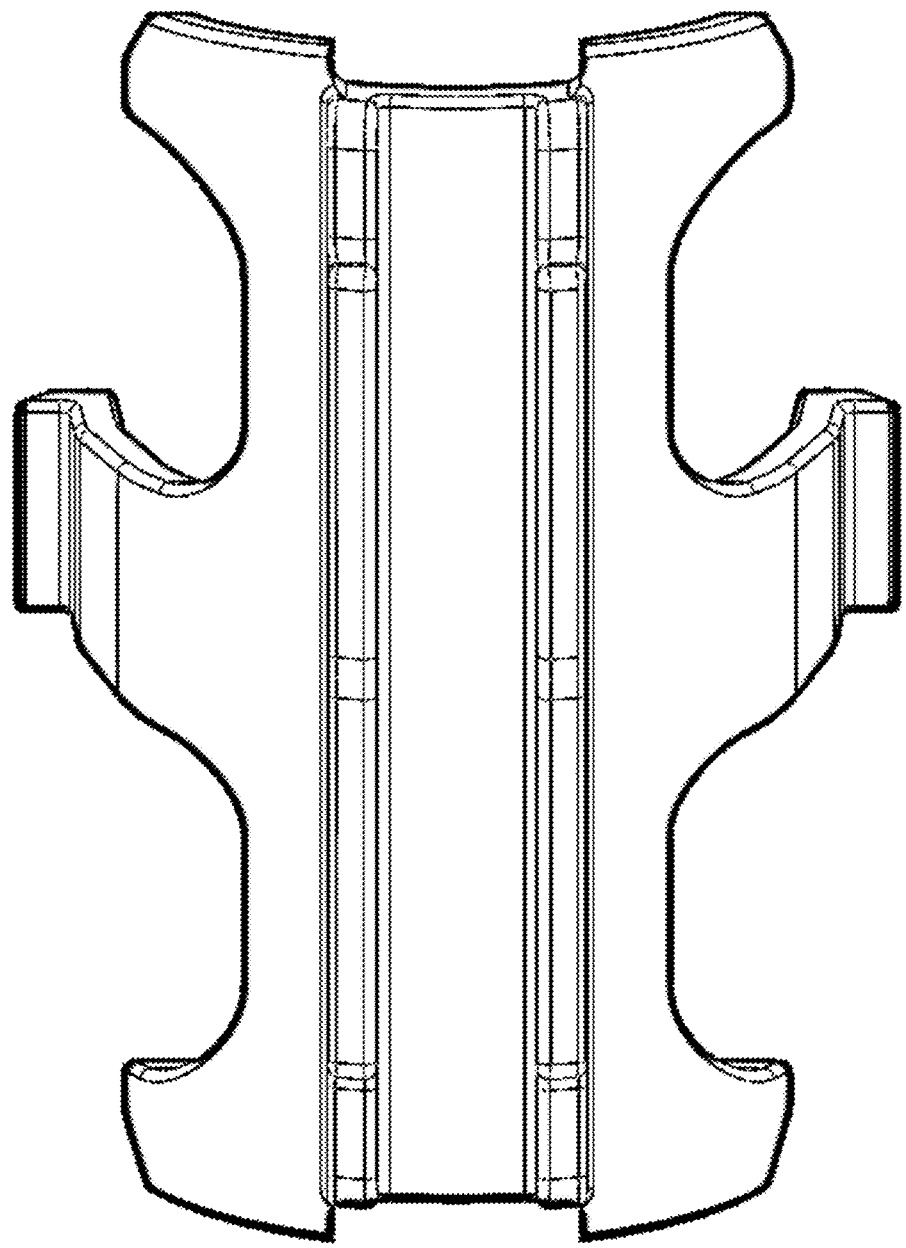
Figure 5C:
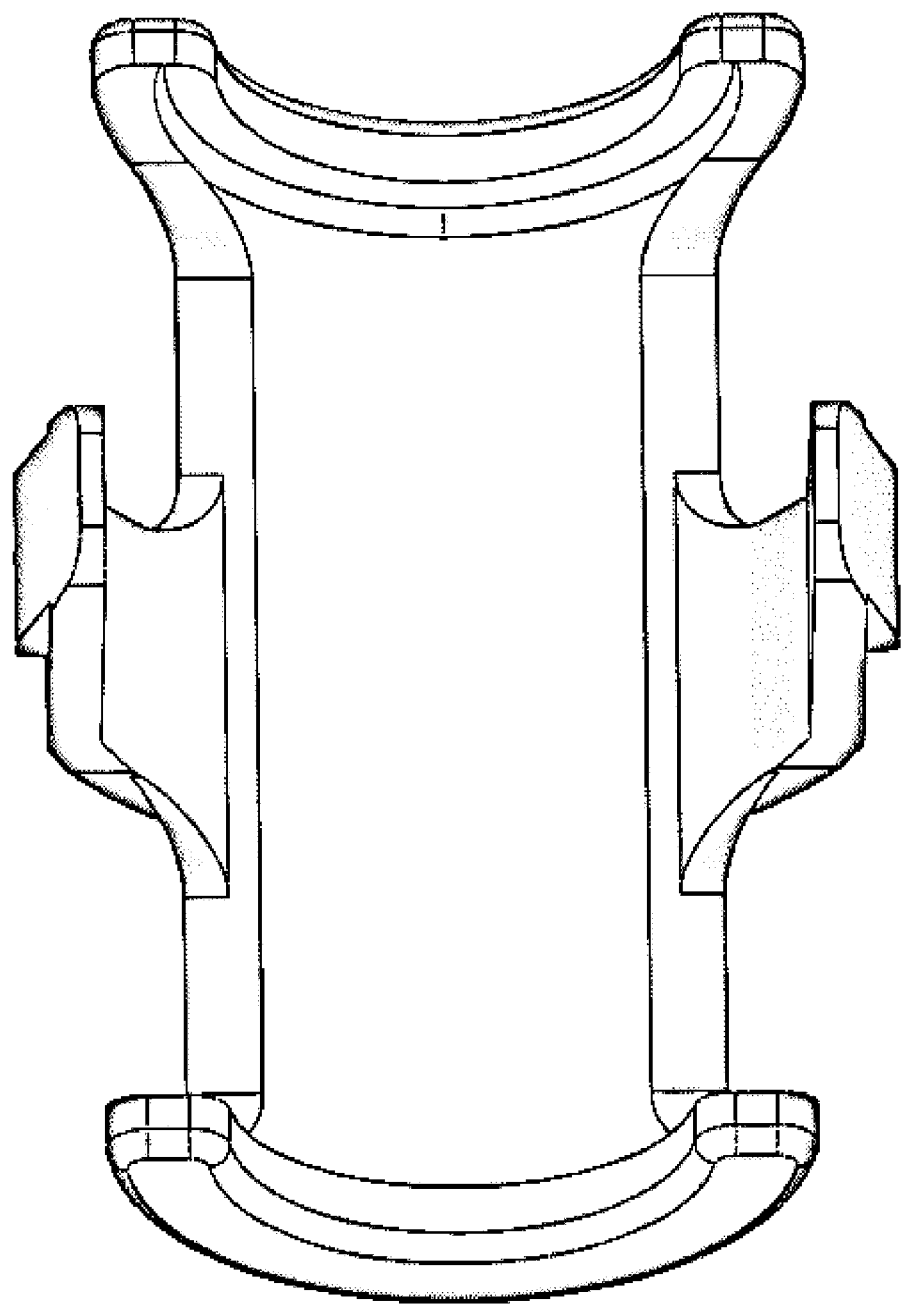
FIG. 5C and FIG. 5D depict diagrams illustrating a battery support as applicable to the PCB assembly of FIG. 3E through FIG. 3G for the Japan market in accordance with embodiments of the present disclosure.
Figure 5D:
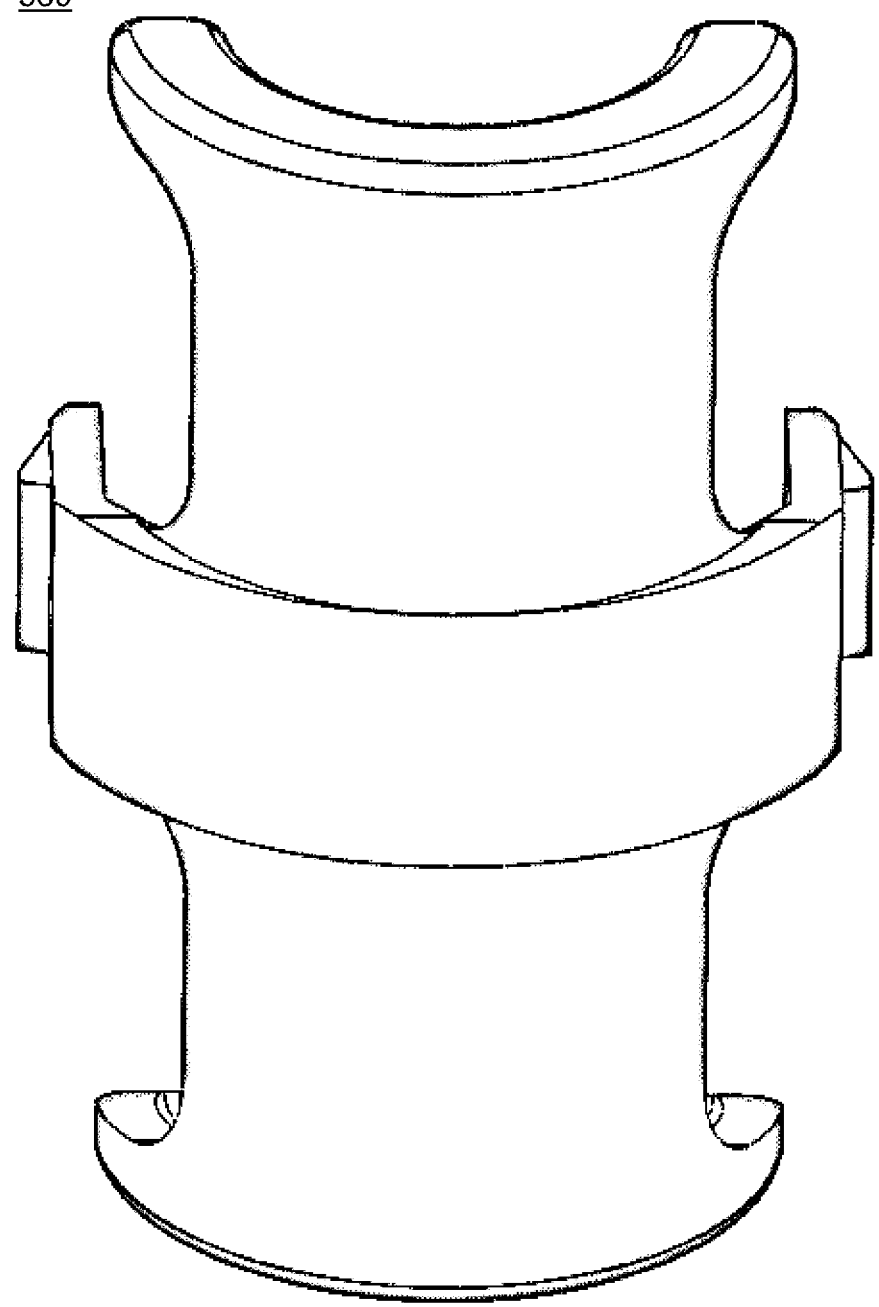

FIG. 5A and FIG. 5B depict diagrams 500 and 510 illustrating two views (front and back) of a battery support as applicable to the PCB assembly of FIG. 3A through FIG. 3D for the US market in accordance with embodiments of the present disclosure. FIG. 5C and FIG. 5D depict diagrams 520 and 530 illustrating two views (front and back) of a battery support as applicable to the PCB assembly of FIG. 3E through FIG. 3G for the Japan market in accordance with embodiments of the present disclosure. Each battery support is used to insulate the battery 120 from the cap and better secure the battery 120 into the battery holder while the cap is installed.

Figure 6A:
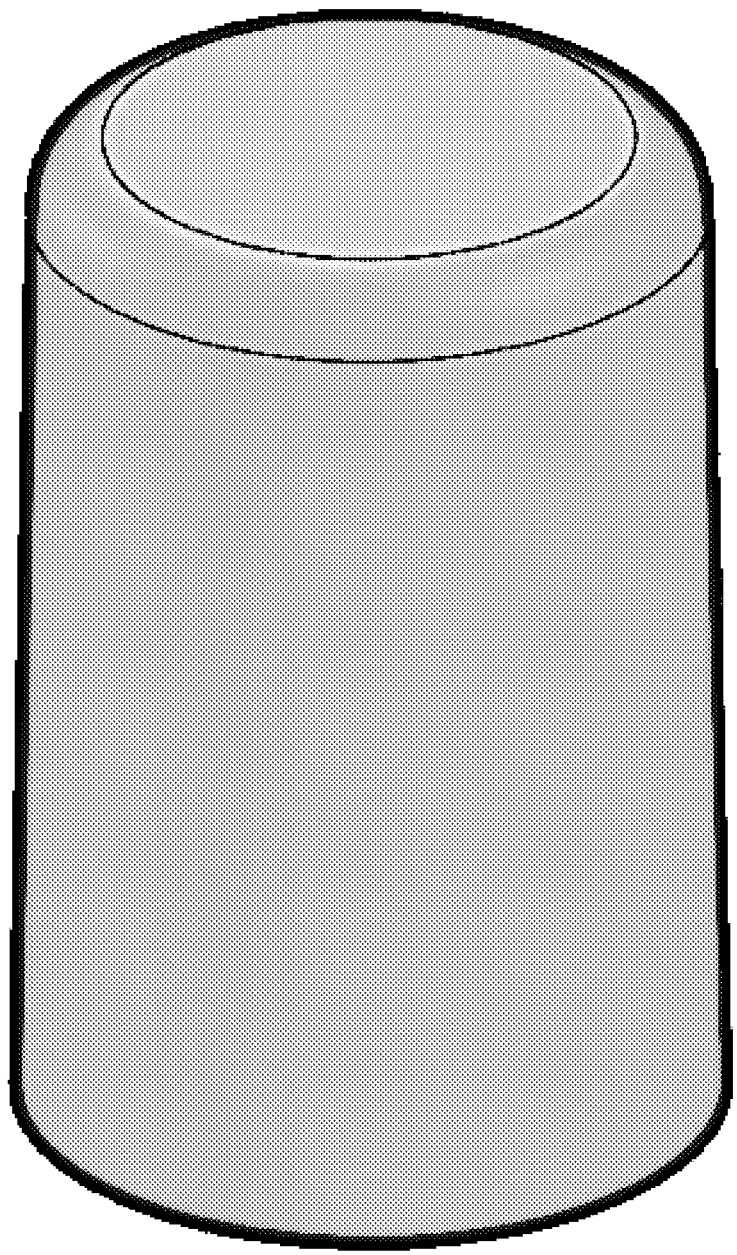
FIG. 6A and FIG. 6B depict diagrams illustrating a cap for the enclosure of FIG. 2A for the US market in accordance with embodiments of the present disclosure.
Figure 6B:
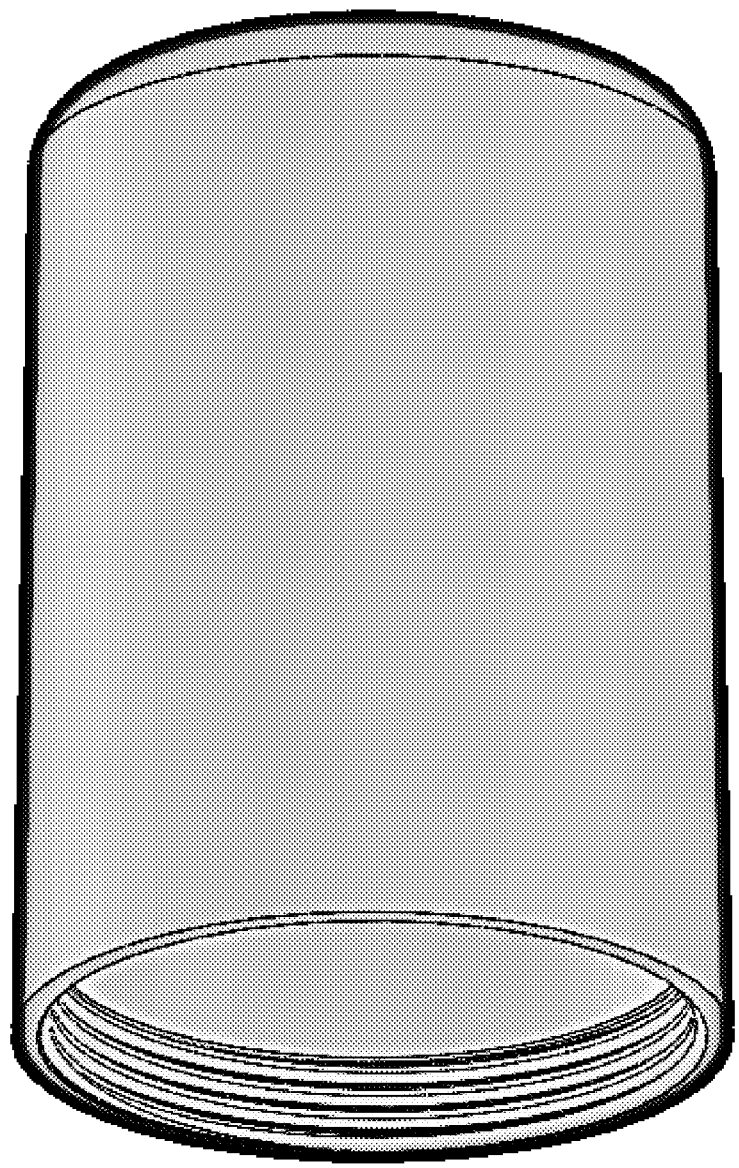
Figure 6C:
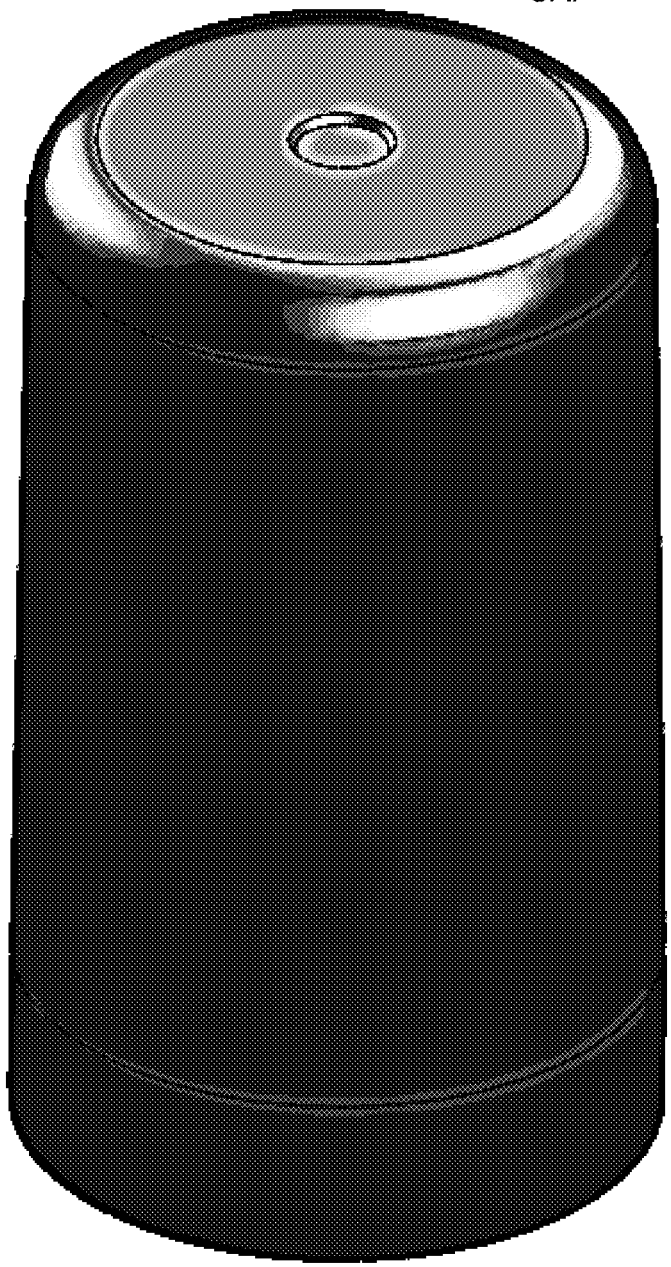
FIG. 6C and FIG. 6D depict diagrams illustrating a cap for the enclosure of FIG. 2B for the Japan market in accordance with embodiments of the present disclosure
Figure 6D:
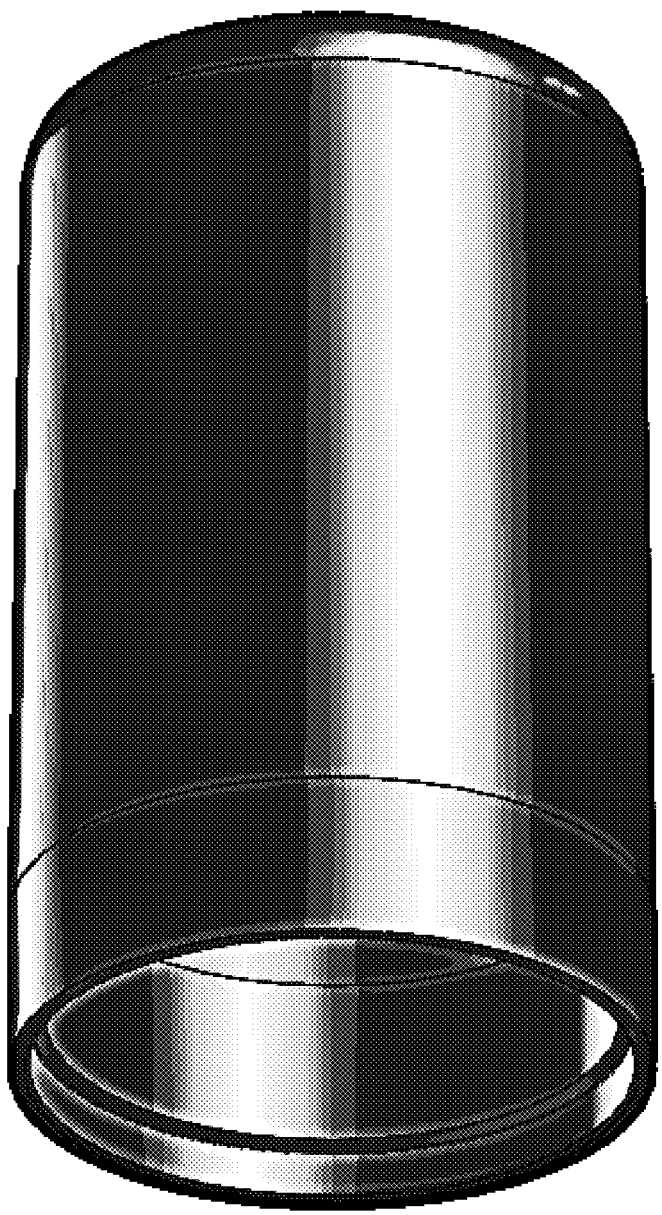

FIG. 6A and FIG. 6B depict diagrams 600 and 610 illustrating isometric views (top and bottom) of a cap for the enclosure of FIG. 2A for the US market in accordance with embodiments of the present disclosure. FIG. 6C and FIG. 6D depict diagrams 620 and 630 illustrating isometric views (top and bottom) of a cap for the enclosure of FIG. 2B for the Japan market in accordance with embodiments of the present disclosure. The caps may be molded of plastic material that includes of Polycarbonate (PC) or Acrylonitrile Butadiene Styrene (ABS). The caps may be Shinkawa blue in color.

Figure 7A:
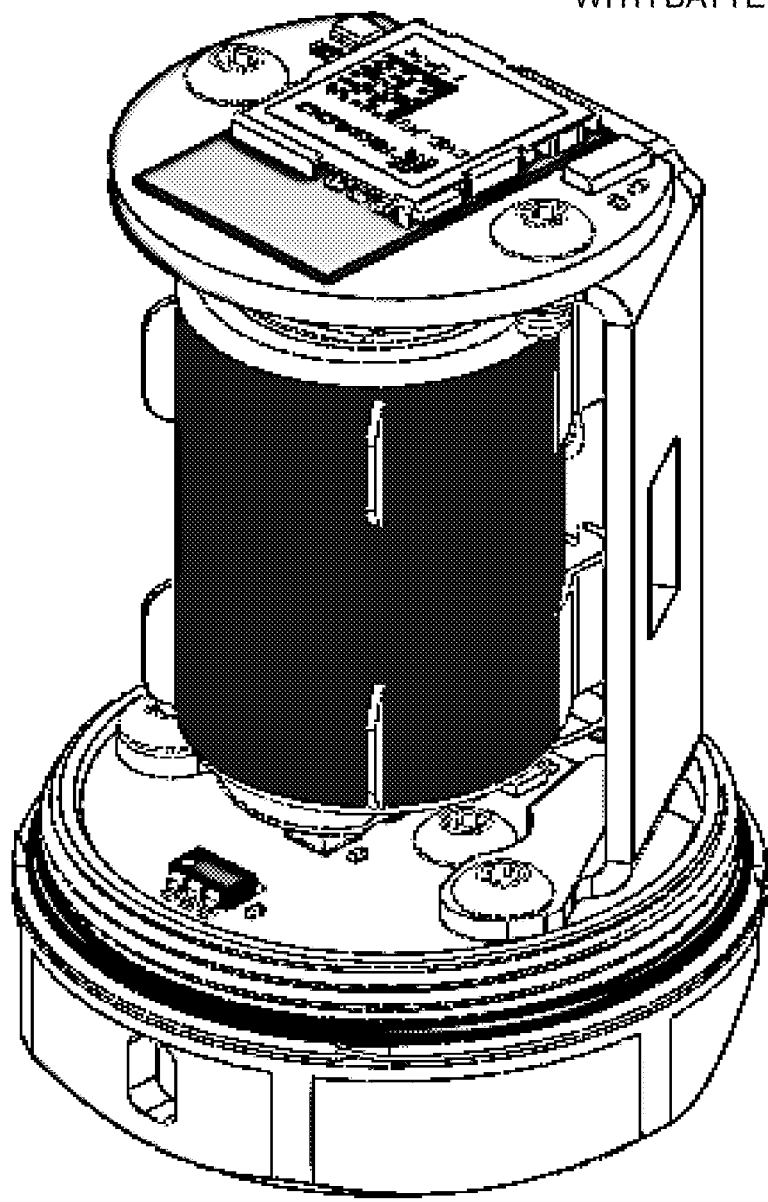
FIG. 7A and FIG. 7B depict diagrams illustrating a device without the cap as applicable for the enclosure of FIG. 2A for the US market in accordance with embodiments of the present disclosure.
Figure 7B:
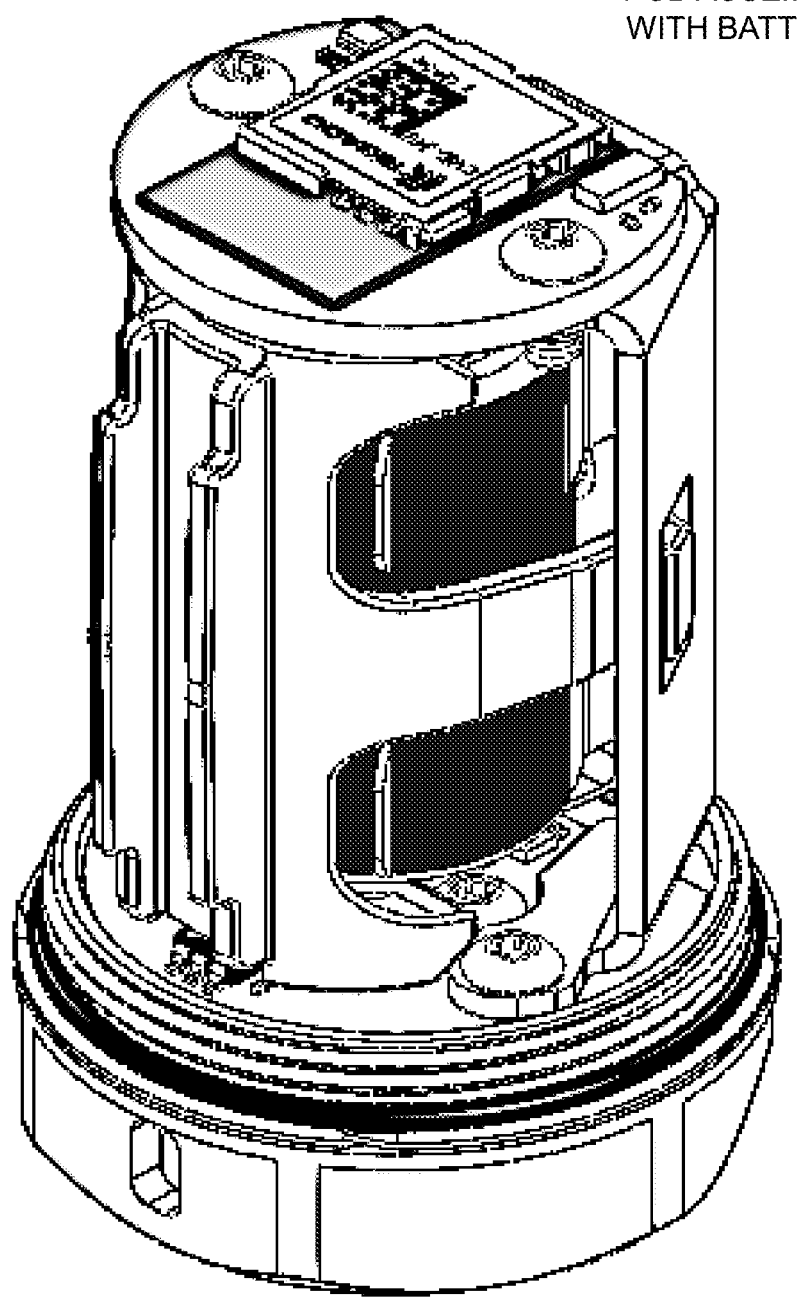
Figure 7C:
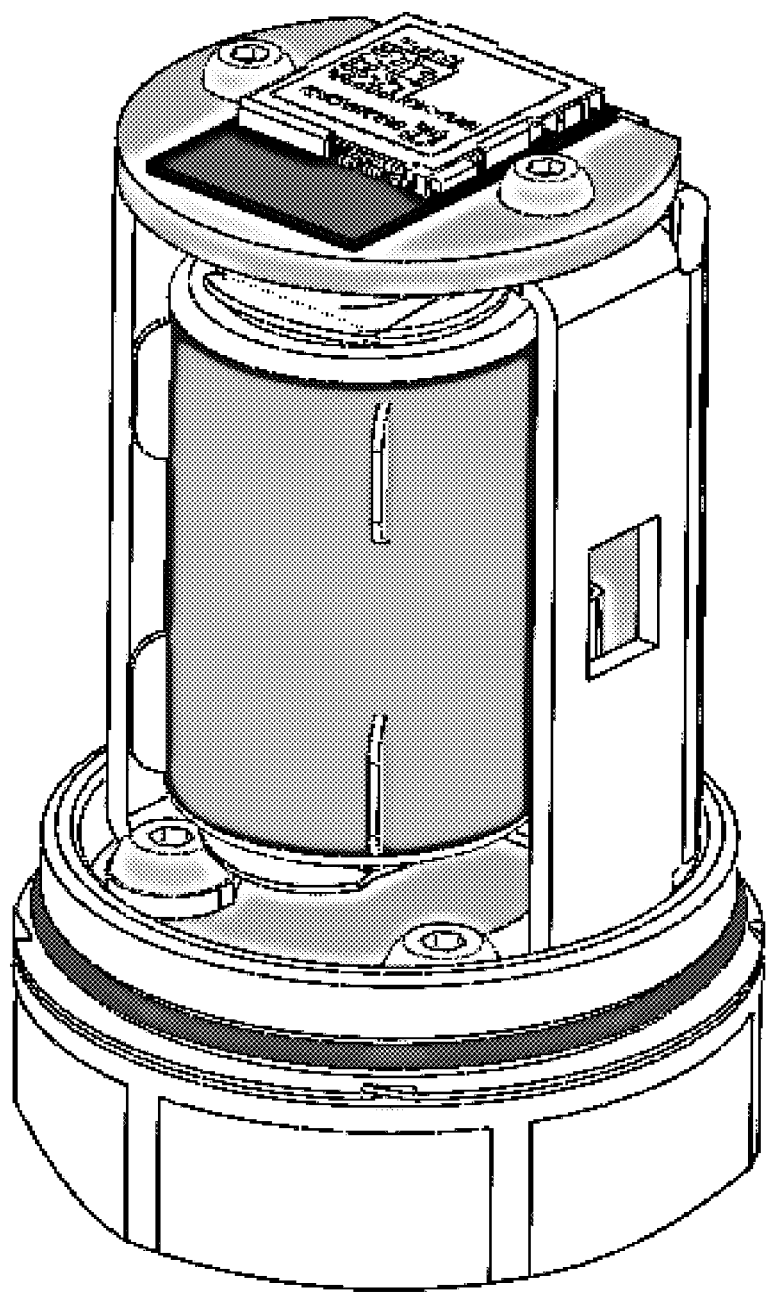
FIG. 7C and FIG. 7D depict diagrams illustrating a device without the cap as applicable for the enclosure of FIG. 2B for the Japan market in accordance with embodiments of the present disclosure.
Figure 7D:
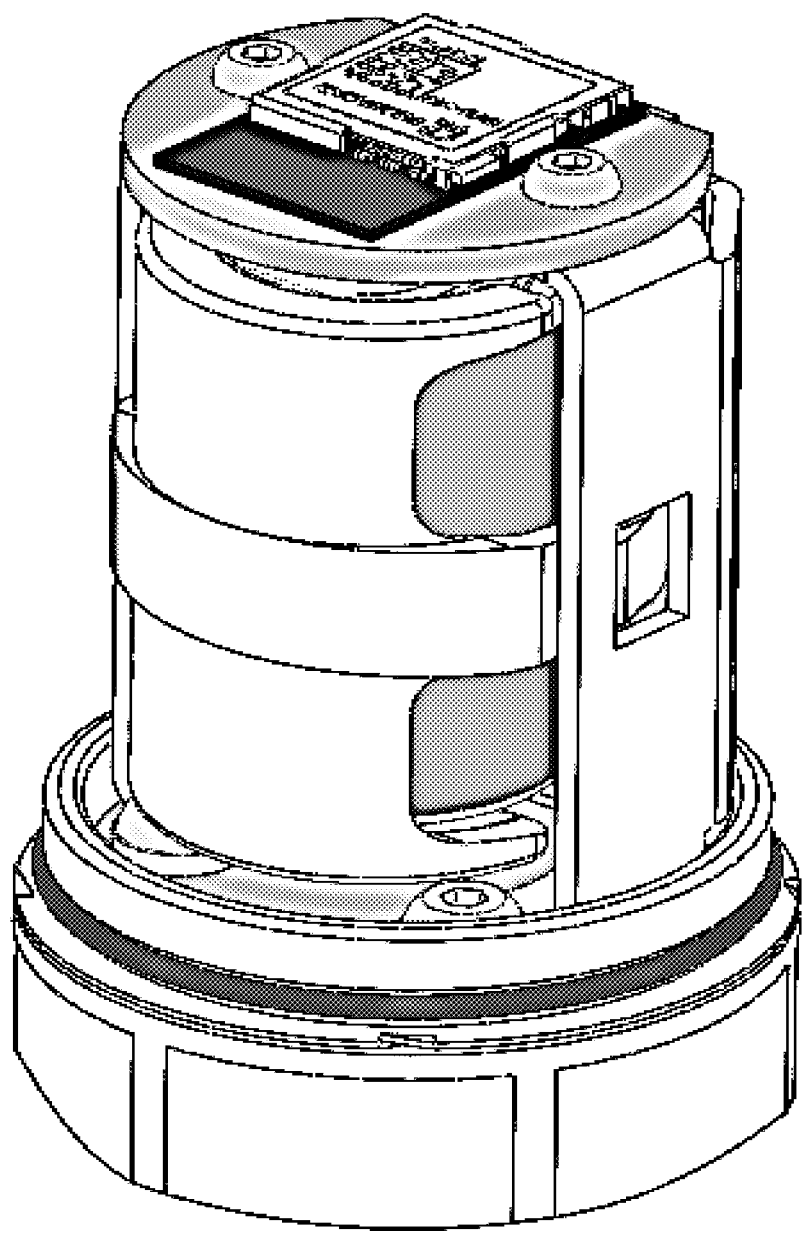

FIG. 7A and FIG. 7B depict diagrams 700 and 710 illustrating a device (including PCB assembly with battery and without the cap) as applicable for the enclosure of FIG. 2A for the US market in accordance with embodiments of the present disclosure. FIG. 7C and FIG. 7D depict diagrams 720 and 730 illustrating a device (including PCB assembly with battery and without the cap) as applicable for the enclosure of FIG. 2B for the Japan market in accordance with embodiments of the present disclosure. The PCB assemblies also include support brackets and bases. As shown, the PCB assemblies wrap around the battery 120 to reduce the overall volume (including height and diameter) versus existing sensor solutions.

Figure 8A:
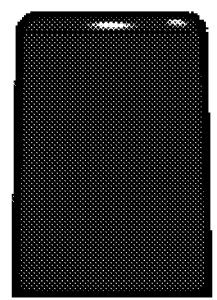
FIG. 8A depicts a diagram illustrating an exploded view of the device of FIG. 7A and FIG. 7B for the US market in accordance with embodiments of the present disclosure.
Figure 8A:
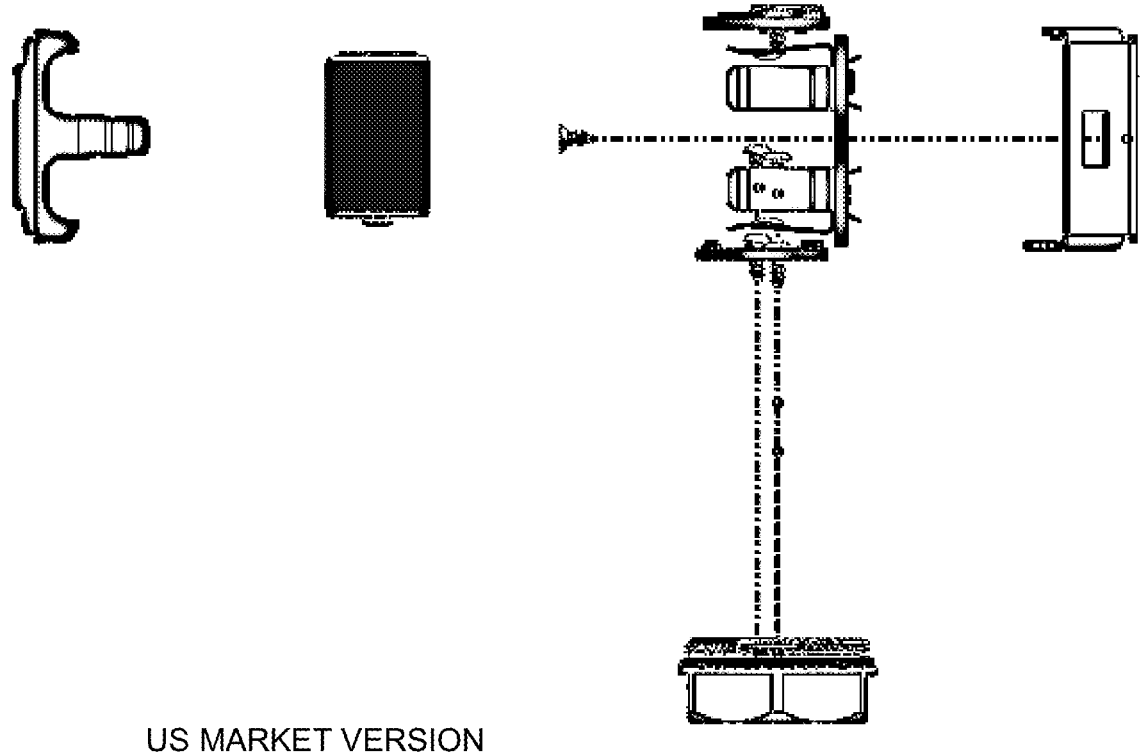
Figure 8A:
Figure 8B:
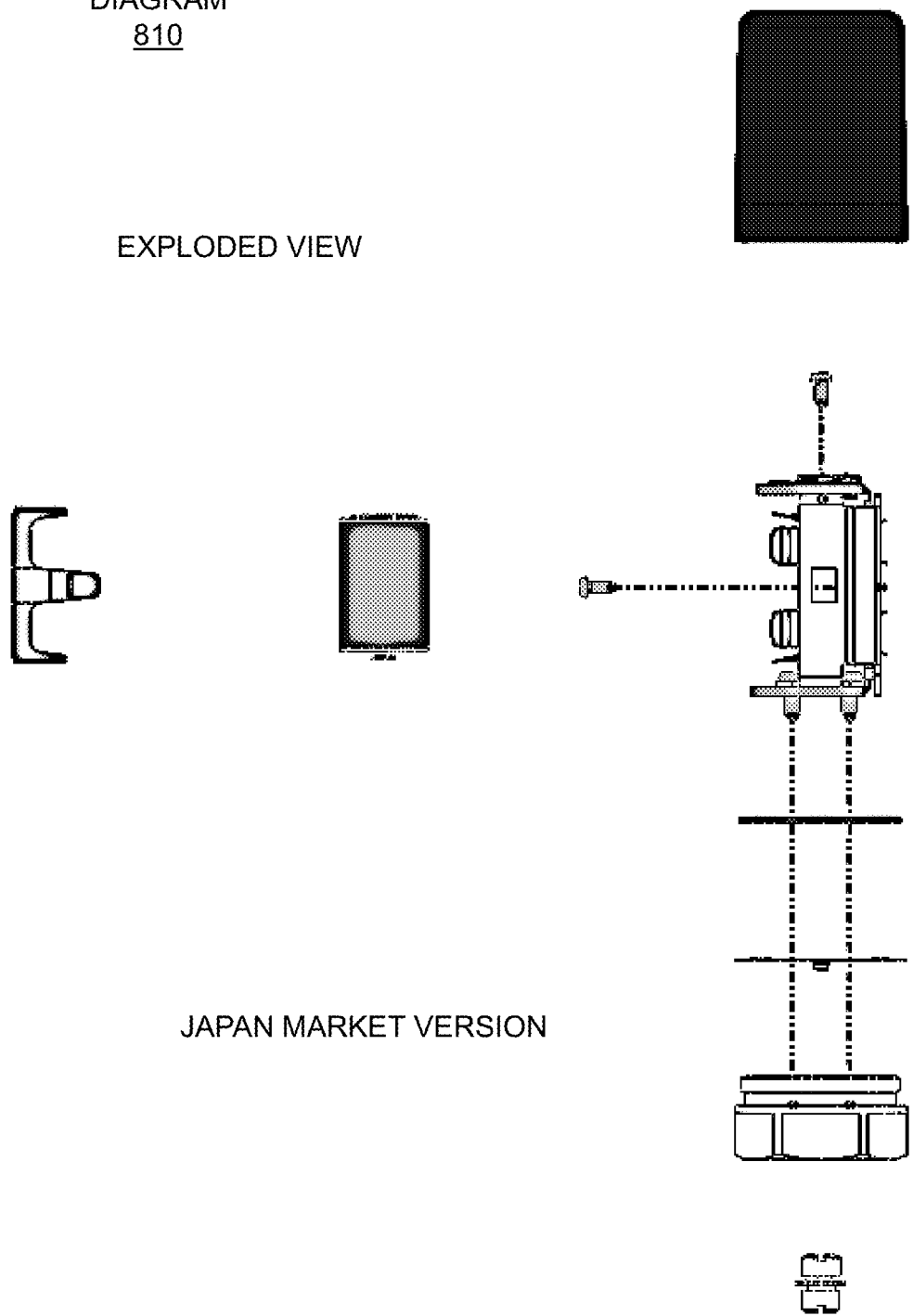
FIG. 8B depicts a diagram illustrating an exploded view of the device of FIG. 7C and FIG. 7D for the Japan market in accordance with embodiments of the present disclosure.

FIG. 8A depicts a diagram 800 illustrating an exploded view of the device of FIG. 7A and FIG. 7B for the US market in accordance with embodiments of the present disclosure. FIG. 8B depicts a diagram 810 illustrating an exploded view of the device of FIG. 7C and FIG. 7D for the Japan market in accordance with embodiments of the present disclosure. The exploded views include the base, the cap, the PCB assembly, the support bracket, the battery holder, and the battery 120 of each device. In some embodiments, the base is a non-pivoting base. In certain embodiments, the base of each device may include a ring gasket (not shown in FIG. 8) to secure the cap to the base.

Figure 9A:
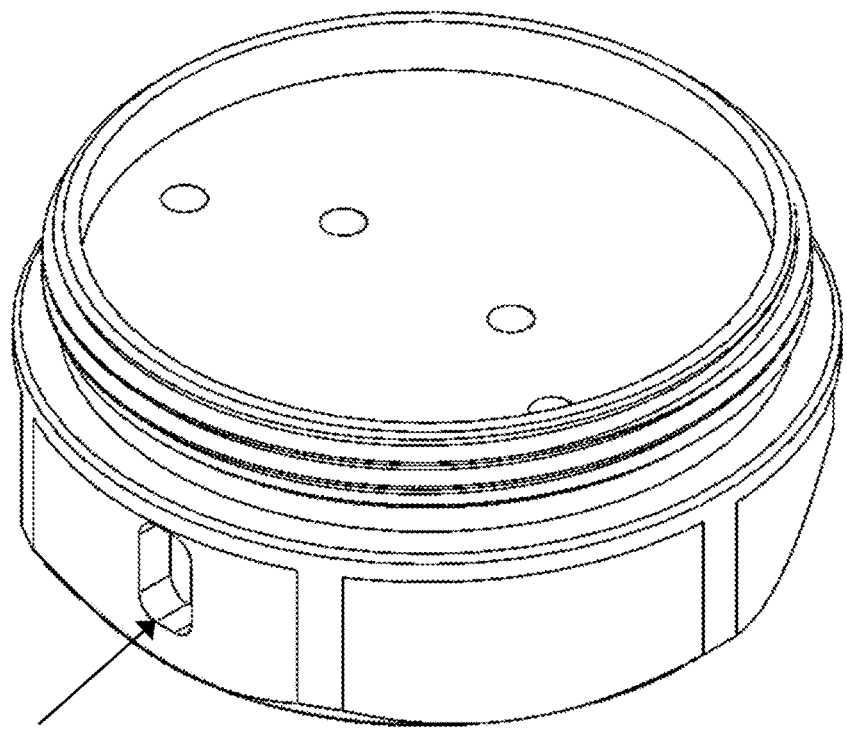
FIG. 9A depicts a diagram illustrating a non-pivoting base for the enclosure of FIG. 2A for the US market in accordance with embodiments of the present disclosure.
Figure 9B:
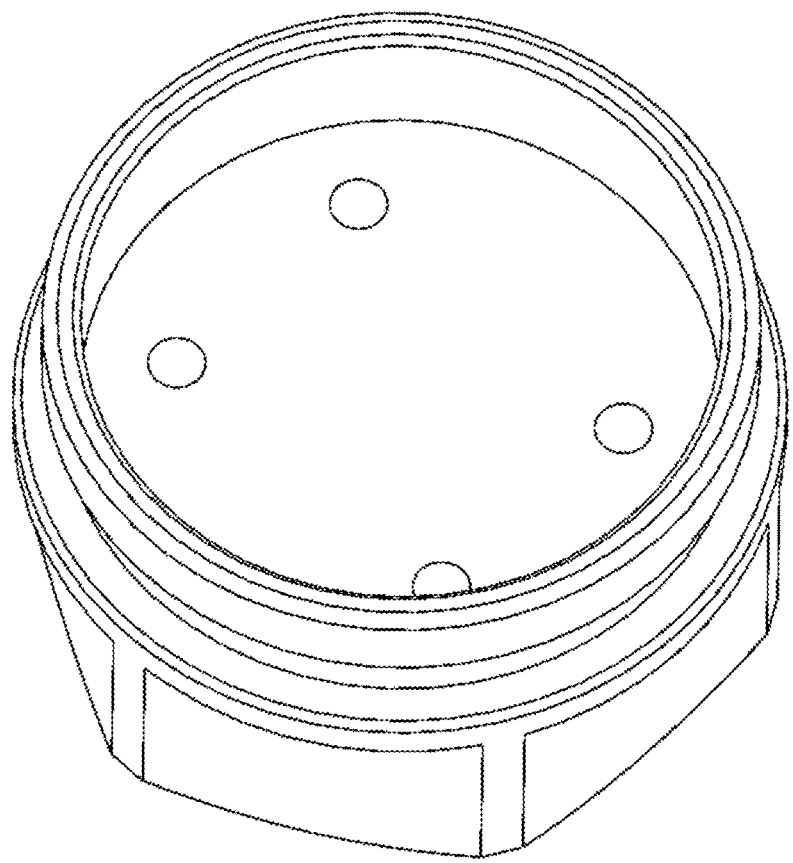
FIG. 9B depicts a diagram illustrating a non-pivoting base for the enclosure of FIG. 2B for the Japan market in accordance with embodiments of the present disclosure.

FIG. 9A depicts a diagram 900 illustrating a non-pivoting base for the enclosure of FIG. 2A for the US market in accordance with embodiments of the present disclosure. FIG. 9B depicts a diagram 910 illustrating a non-pivoting base for the enclosure of FIG. 2B for the Japan market in accordance with embodiments of the present disclosure. Each non-pivoting base includes an axis marking that is relative to vibration sensor 106A and/or vibration sensor 106B. The axis marking may be a rectangular cut or a retaining ring slot. Each non-pivoting base also includes a threaded (¼-28) mounting stud. In other embodiments, each non-pivoting base may be adapted to mount to a machine using epoxies, magnets, glues, or the like. Each non-pivoting base also includes type 316 stainless steel.

Figure 10:
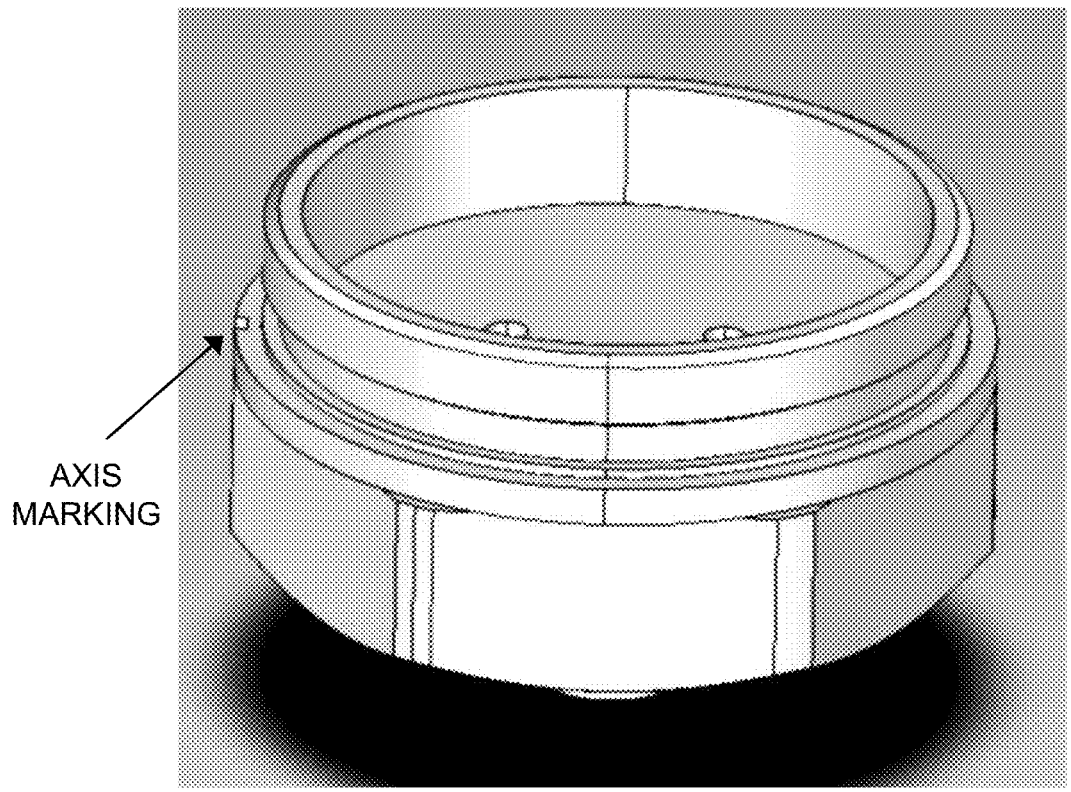
FIG. 10 depicts a diagram illustrating a pivoting base for the enclosure of FIG. 2A for the US market in accordance with embodiments of the present disclosure.
Figure 11:
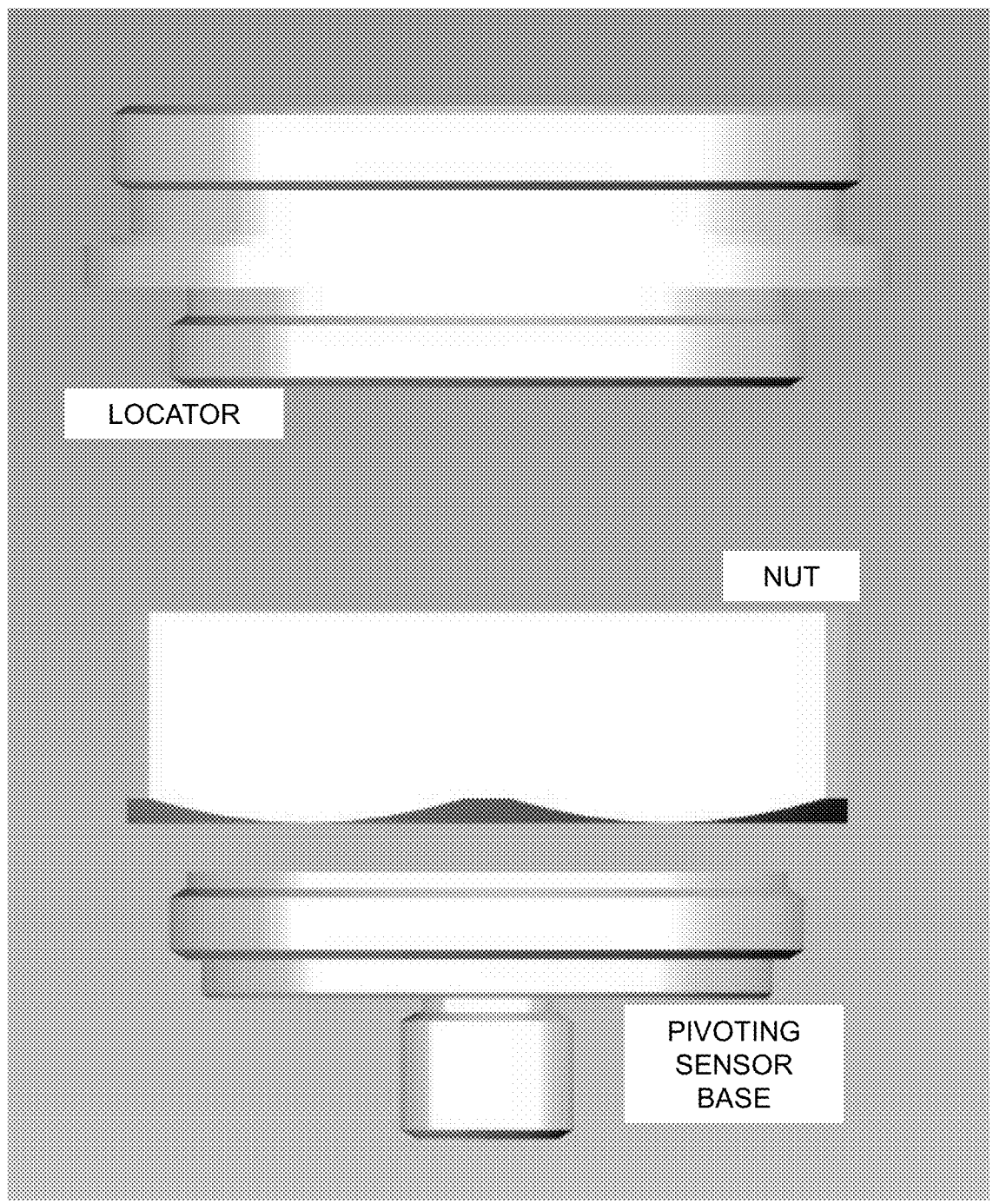
FIG. 11 depicts a diagram illustrating a nut, a locator, and a pivoting sensor base for the pivoting base of FIG. 10 in accordance with embodiments of the present disclosure.

FIG. 10 depicts a diagram 1000 illustrating a pivoting base for the enclosure of FIG. 2A for the US market in accordance with embodiments of the present disclosure. The pivoting base includes an axis marking that is relative to vibration sensor 106A and/or vibration sensor 106B. The pivoting base is made up of a nut, a locator, and a pivoting sensor base. The nut secures the support bracket and PCB assembly. The locator fixes the measurement point location on the machine once the device 102 is installed. The pivoting sensor base allows the support bracket and PCB assembly to be rotated for alignment. FIG. 11 depicts a diagram 1100 further illustrating the nut, the locator, and the pivoting sensor base for the pivoting base of FIG. 10 in accordance with embodiments of the present disclosure.

Figure 12A:
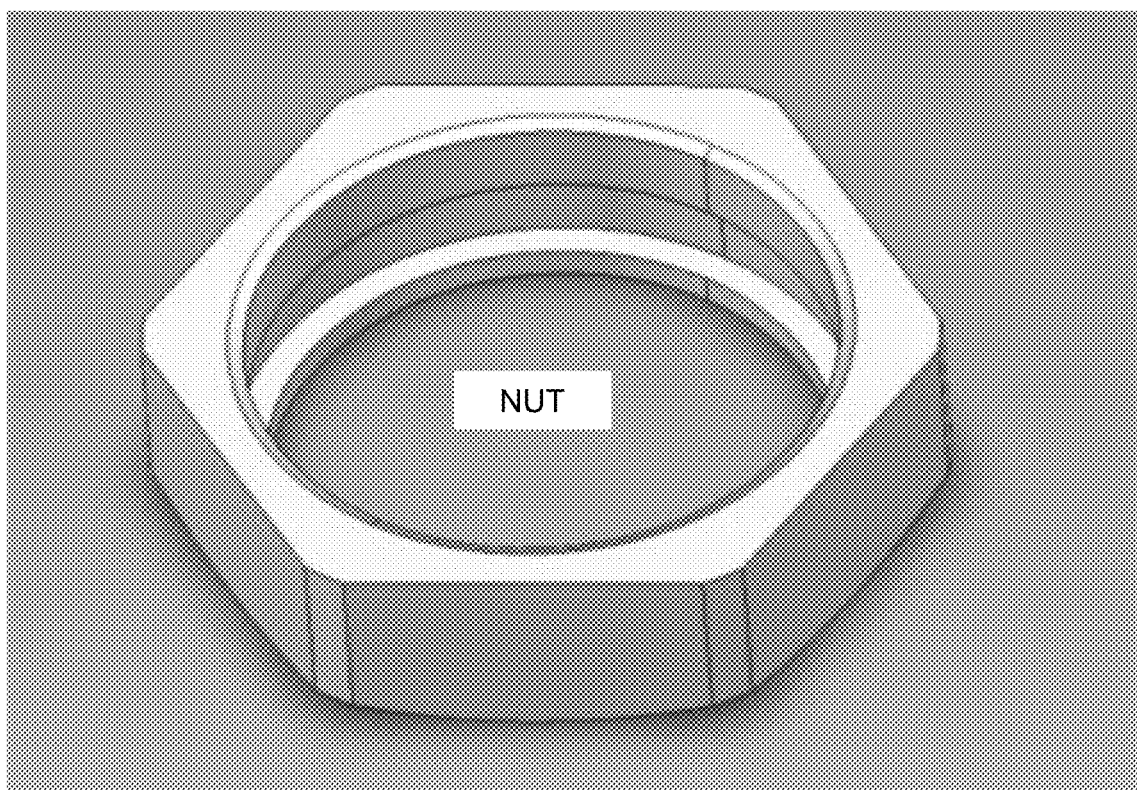
FIG. 12A through FIG. 12C depict diagrams individually illustrating the nut, the locator, and the pivoting sensor base of FIG. 11 in accordance with embodiments of the present disclosure.
Figure 12B:
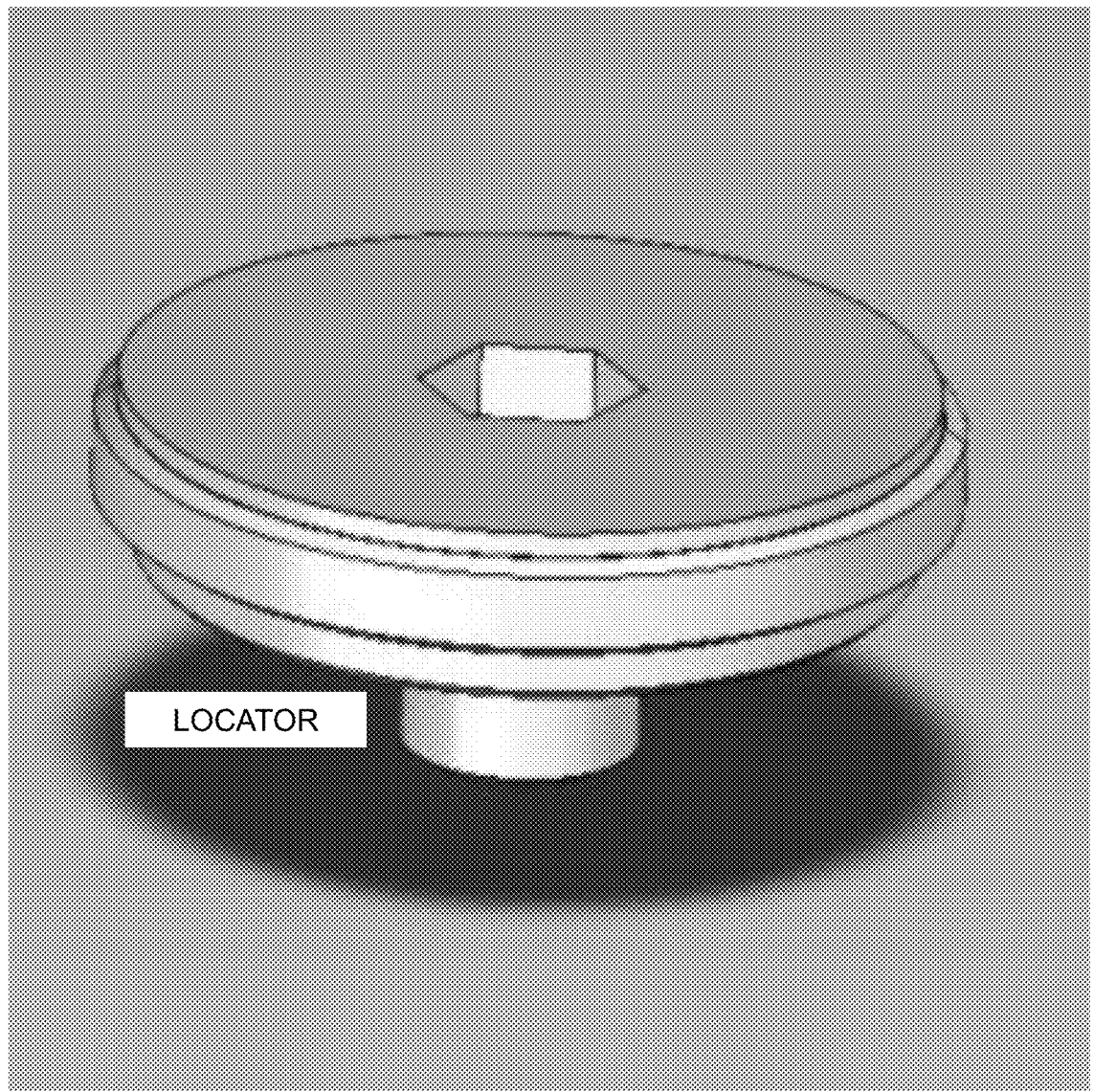
Figure 12C:
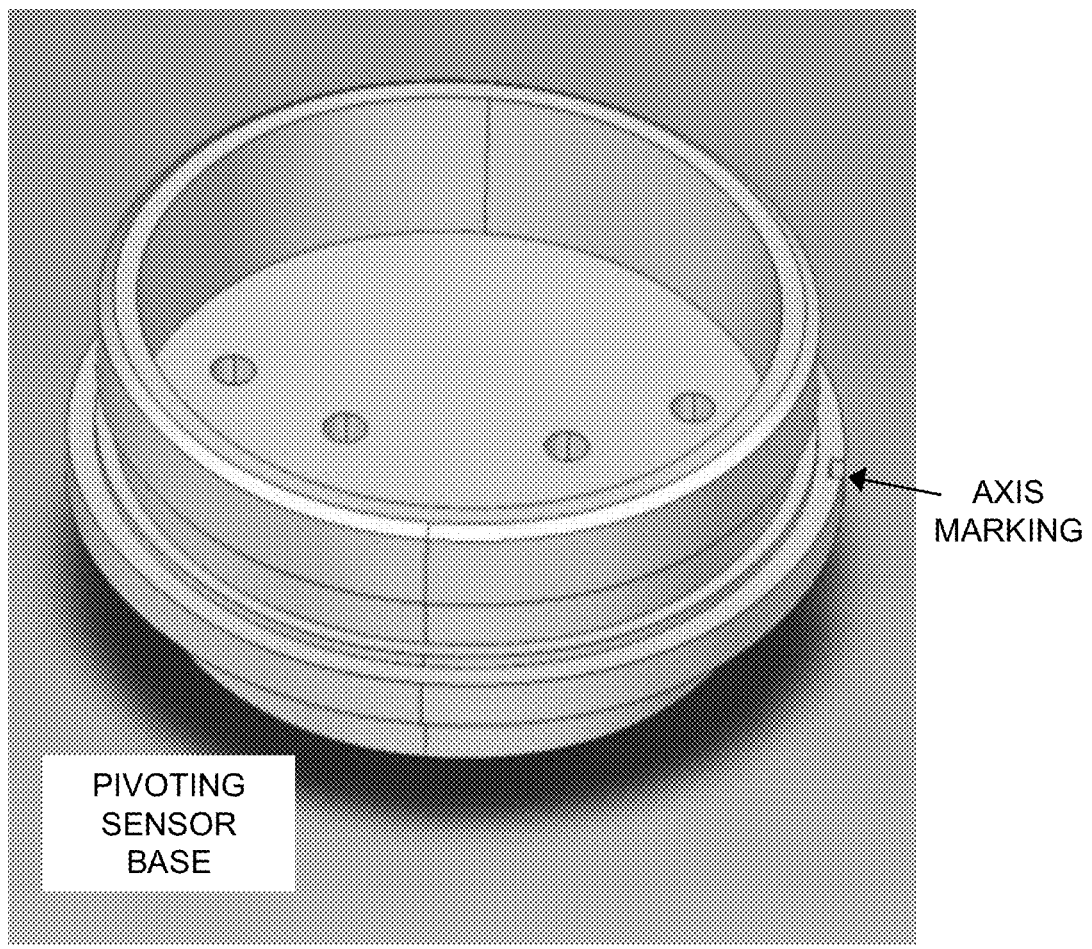
Figure 13A:
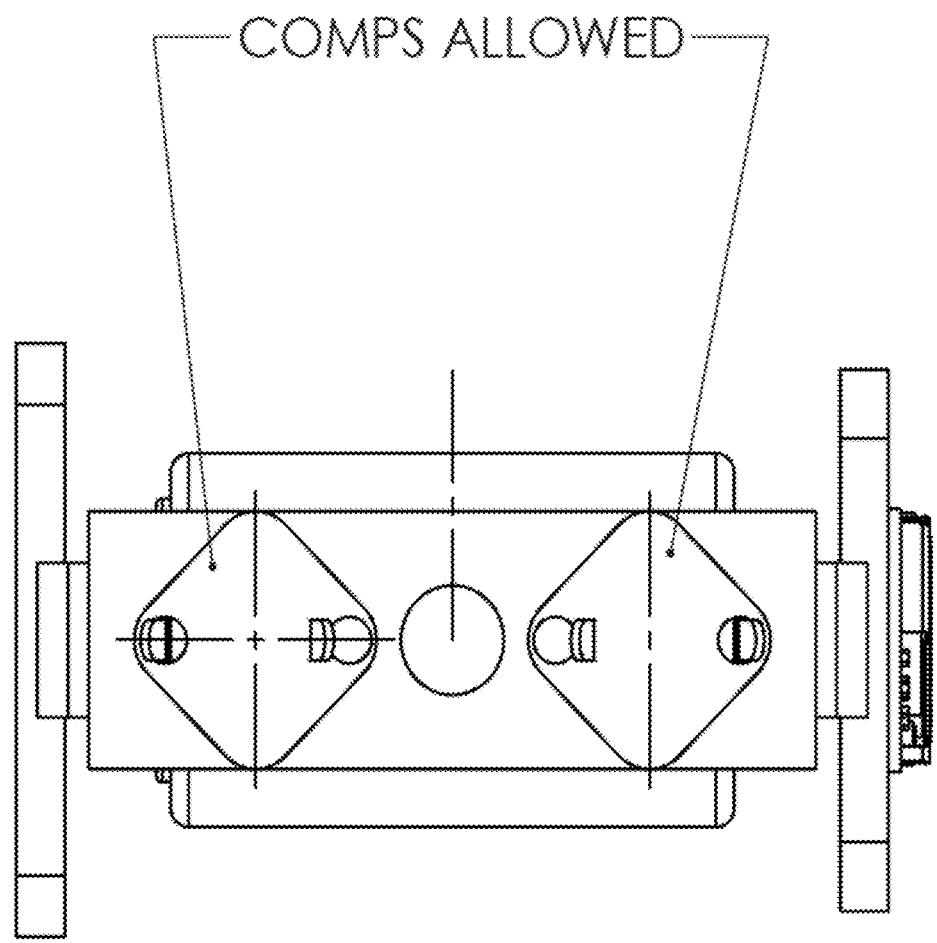
FIG. 13A through FIG. 13D depict mechanical diagrams illustrating the PCB assembly of FIG. 3A through FIG. 3D for the US market in accordance with embodiments of the present disclosure.
Figure 13B:
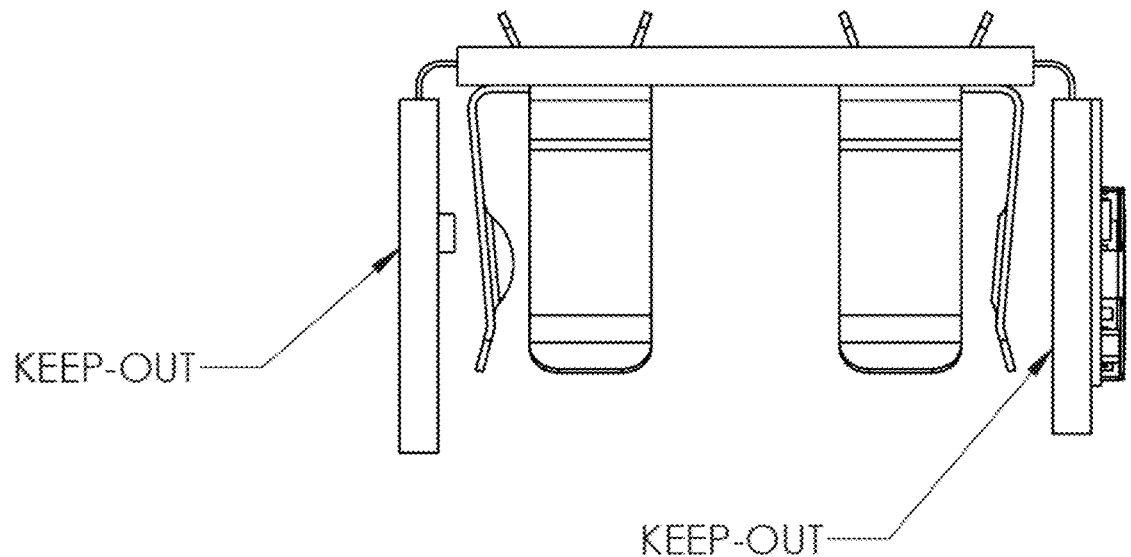
Figure 13C:
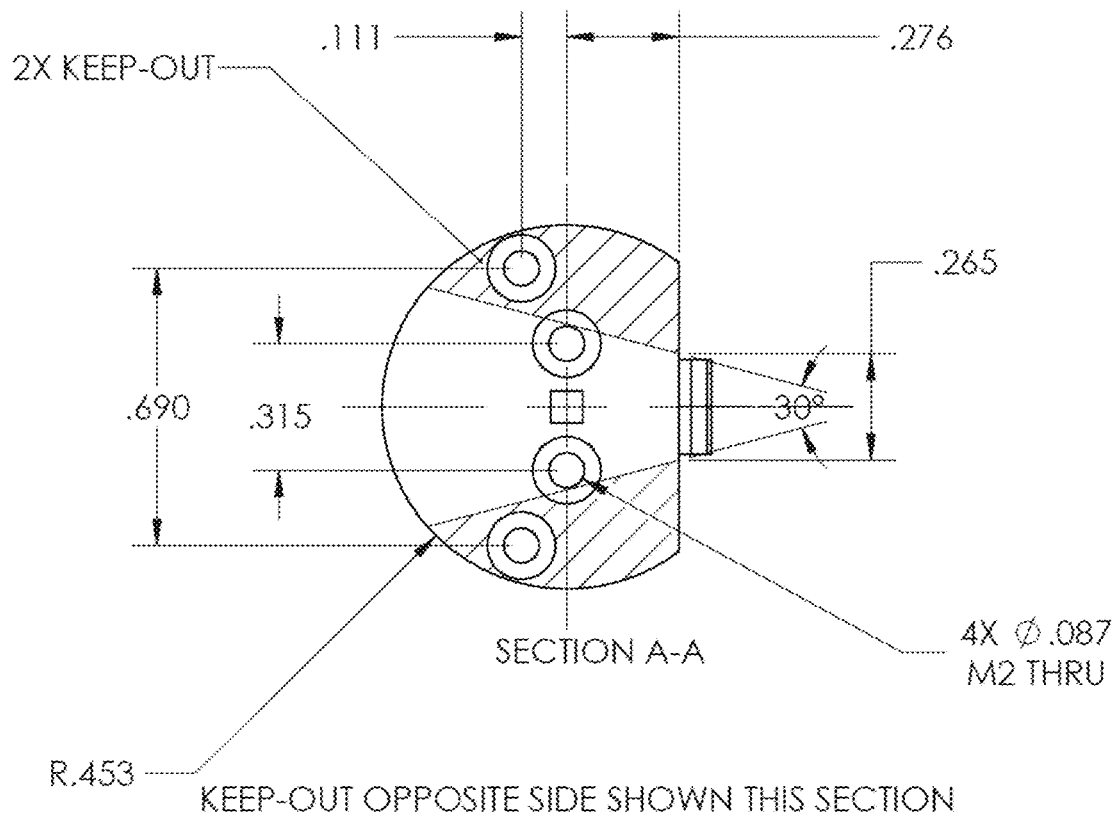
Figure 13D:
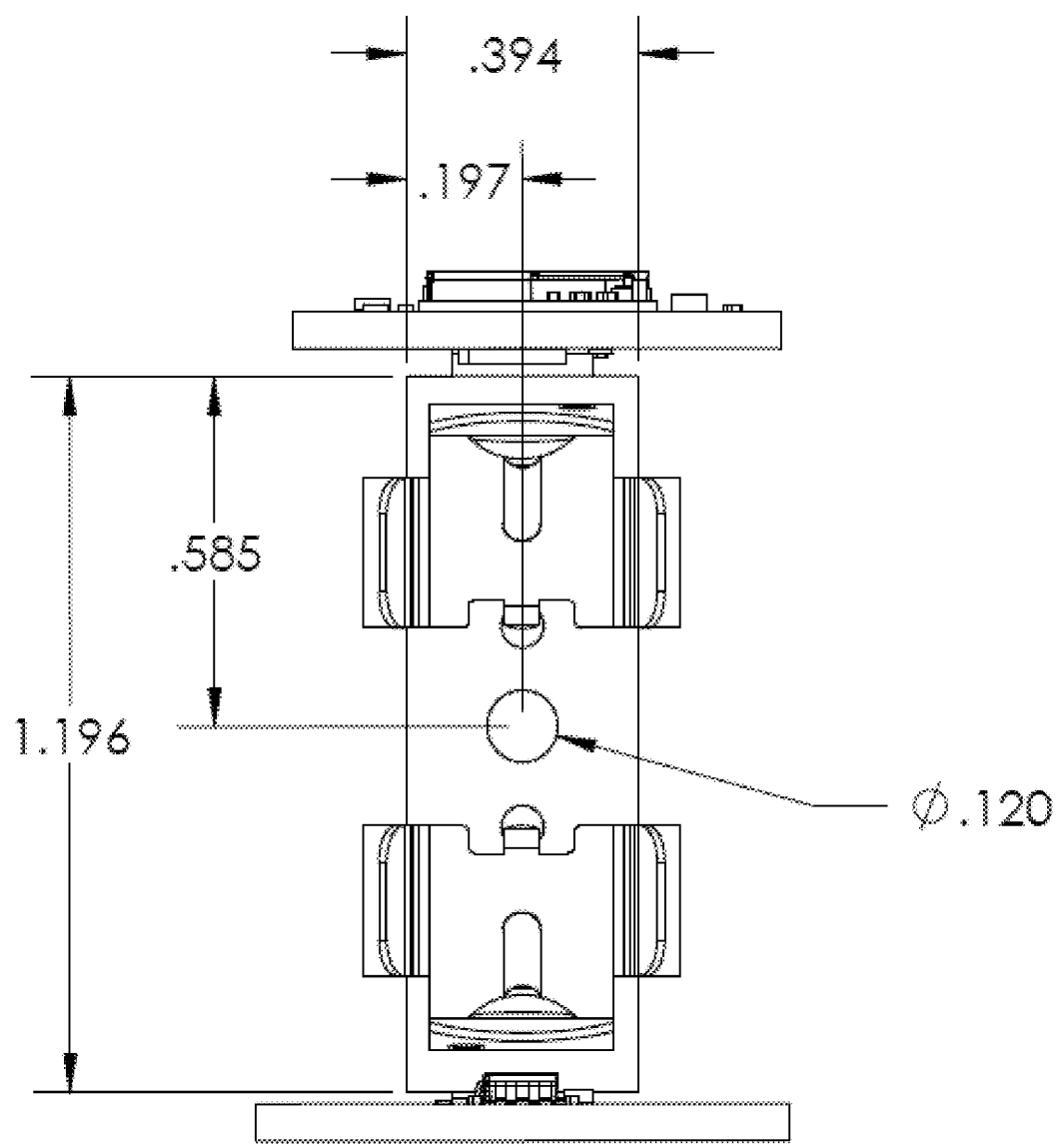
Figure 13E:
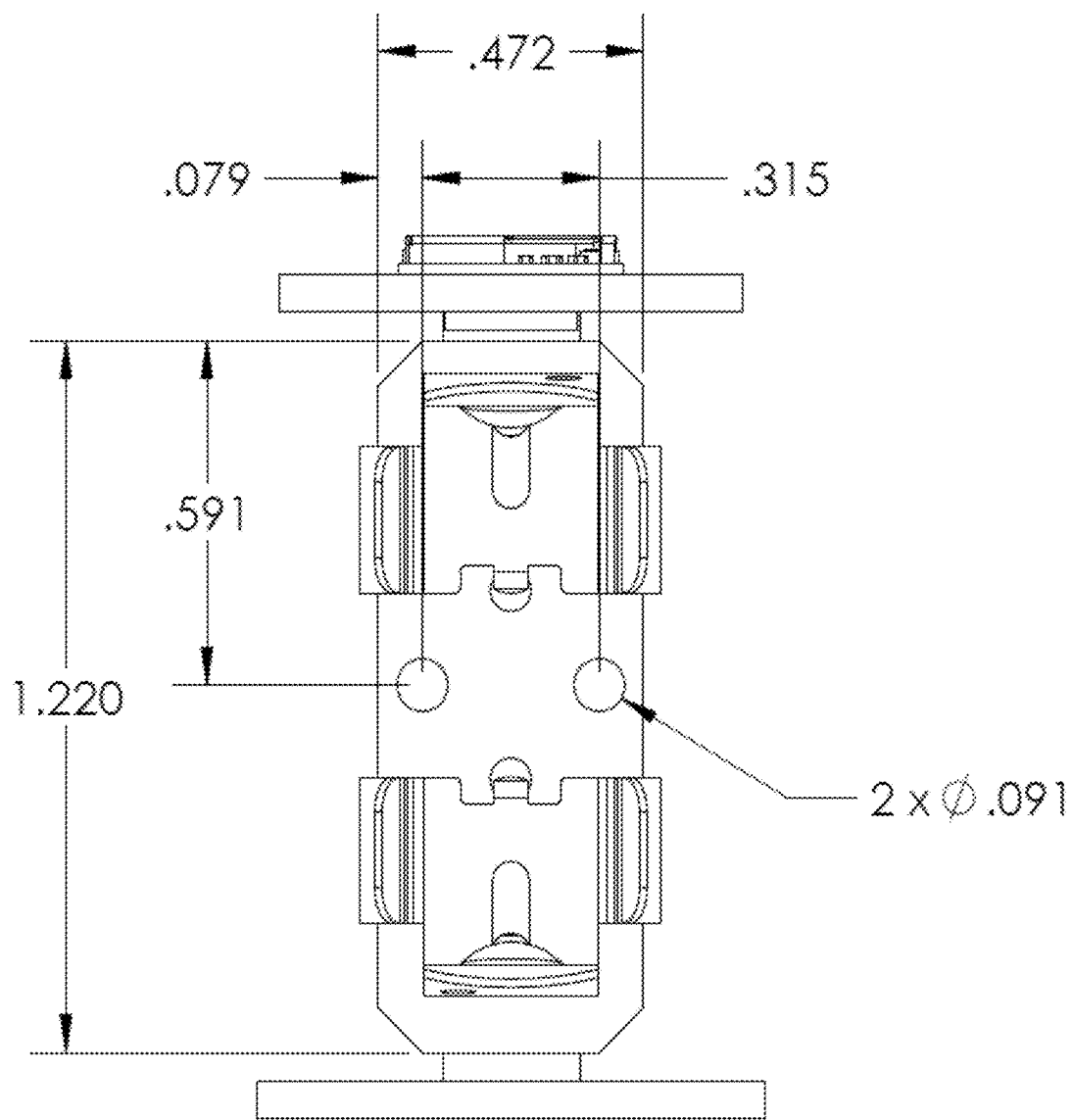
FIG. 13E depicts a mechanical diagram illustrating the PCB assembly of FIG. 3E through FIG. 3G for the Japan market in accordance with embodiments of the present disclosure.
Figure 13F:
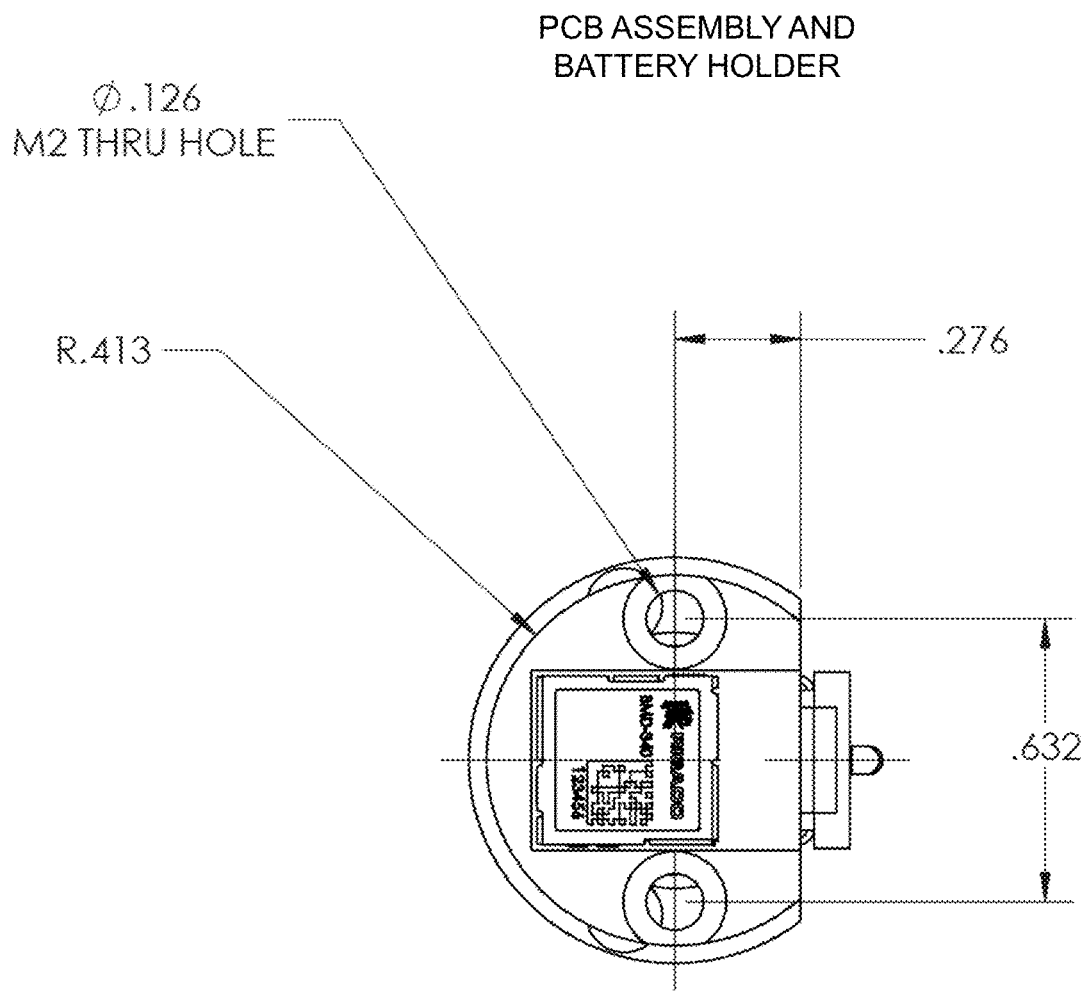
FIG. 13F depicts another mechanical diagram illustrating the PCB assembly of FIG. 3A through FIG. 3D for the US market in accordance with embodiments of the present disclosure.
Figure 13G:
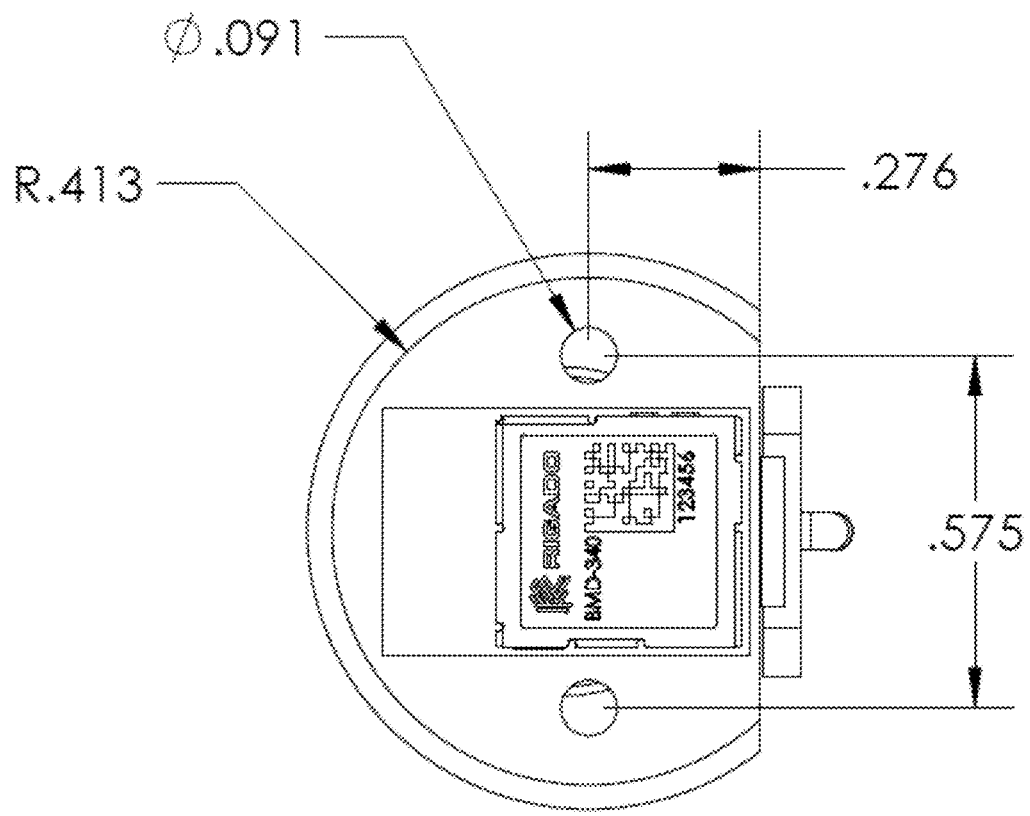
FIG. 13G depicts another mechanical diagram illustrating the PCB assembly of FIG. 3E through FIG. 3G for the Japan market in accordance with embodiments of the present disclosure.

FIG. 12A through FIG. 12C depict diagrams 1200, 1210, and 1220 individually illustrating views of the nut, the locator, and the pivoting sensor base of FIG. 11 in accordance with embodiments of the present disclosure. Each component includes type 316 stainless steel. In other embodiments the pivoting base may be adapted to mount to a machine using epoxies, magnets, glues, or the like. FIG. 13A through FIG. 13D depict mechanical diagrams 1300, 1310, 1320, and 1330 illustrating various views the PCB assembly of FIG. 3A through FIG. 3D for the US market in accordance with embodiments of the present disclosure. FIG. 13E depicts a mechanical diagram 1340 illustrating a view of the PCB assembly of FIG. 3E through FIG. 3G for the Japan market in accordance with embodiments of the present disclosure. FIG. 13F depicts another mechanical diagram 1350 illustrating the PCB assembly of FIG. 3A through FIG. 3D for the US market in accordance with embodiments of the present disclosure. FIG. 13G depicts another mechanical diagram 1360 illustrating the PCB assembly of FIG. 3E through FIG. 3G for the Japan market in accordance with embodiments of the present disclosure. FIG. 13a through FIG. 13g depict a mechanical diagram of the PCB assembly and including the battery holder as previously shown in FIG. 3a through FIG. 3g. Dimensions are presented in inches. FIG. 13a depicts a first view of a mechanical diagram of the PCB assembly and battery holder.

Figure 14A:
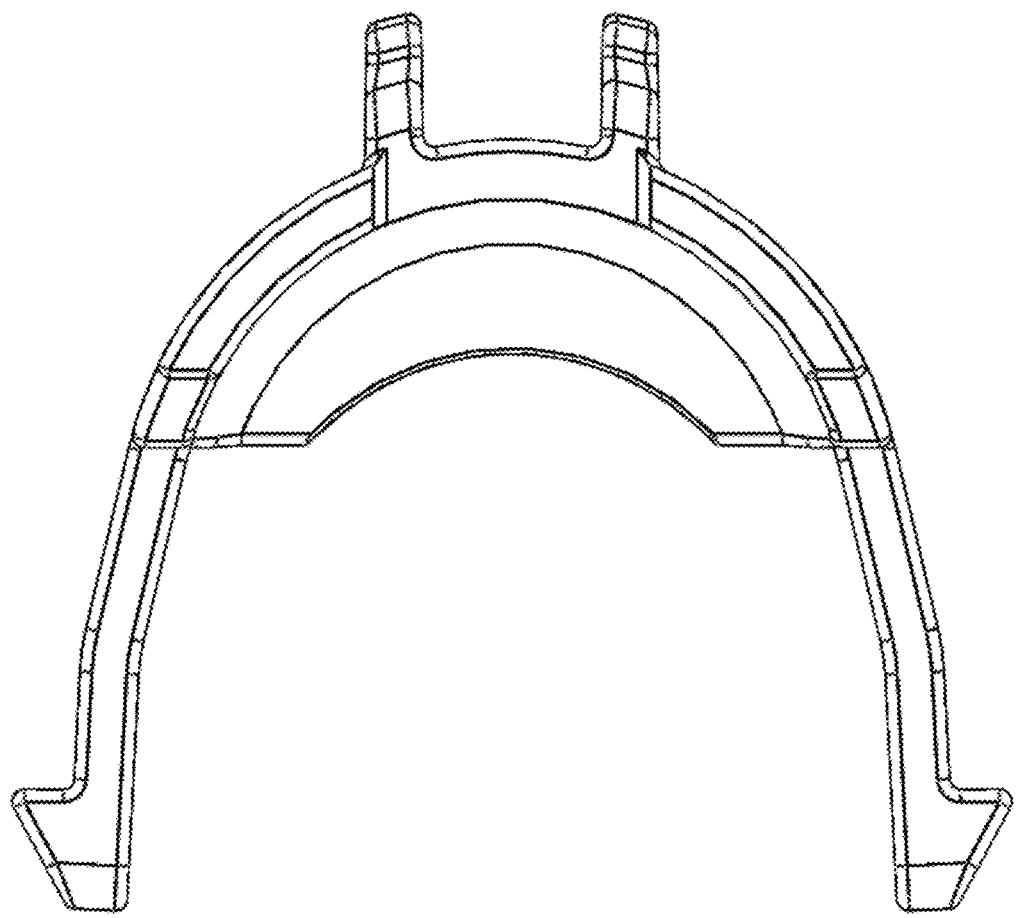
FIG. 14A depicts a mechanical diagram illustrating the battery holder of FIG. 3A through FIG. 3D for the US market in accordance with embodiments of the present disclosure.
Figure 14B:
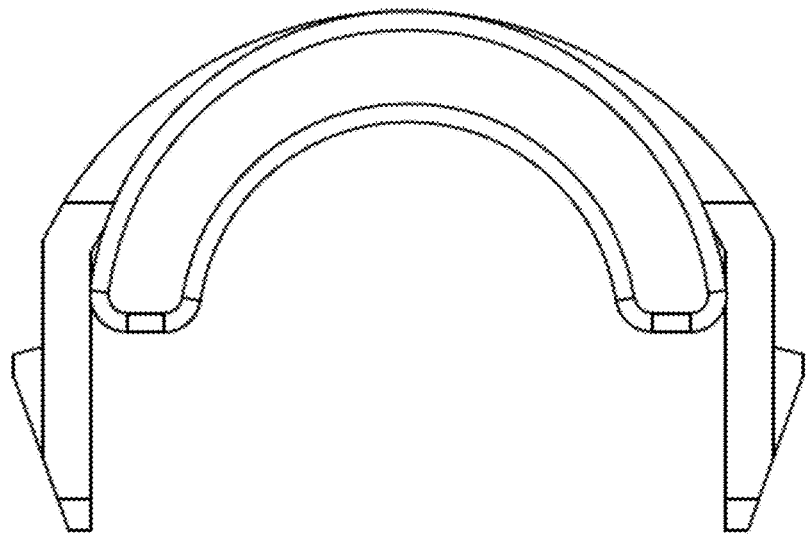
FIG. 14B depicts a mechanical diagram illustrating the battery holder of FIG. 3E through FIG. 3G for the Japan market in accordance with embodiments of the present disclosure.
Figure 14C:
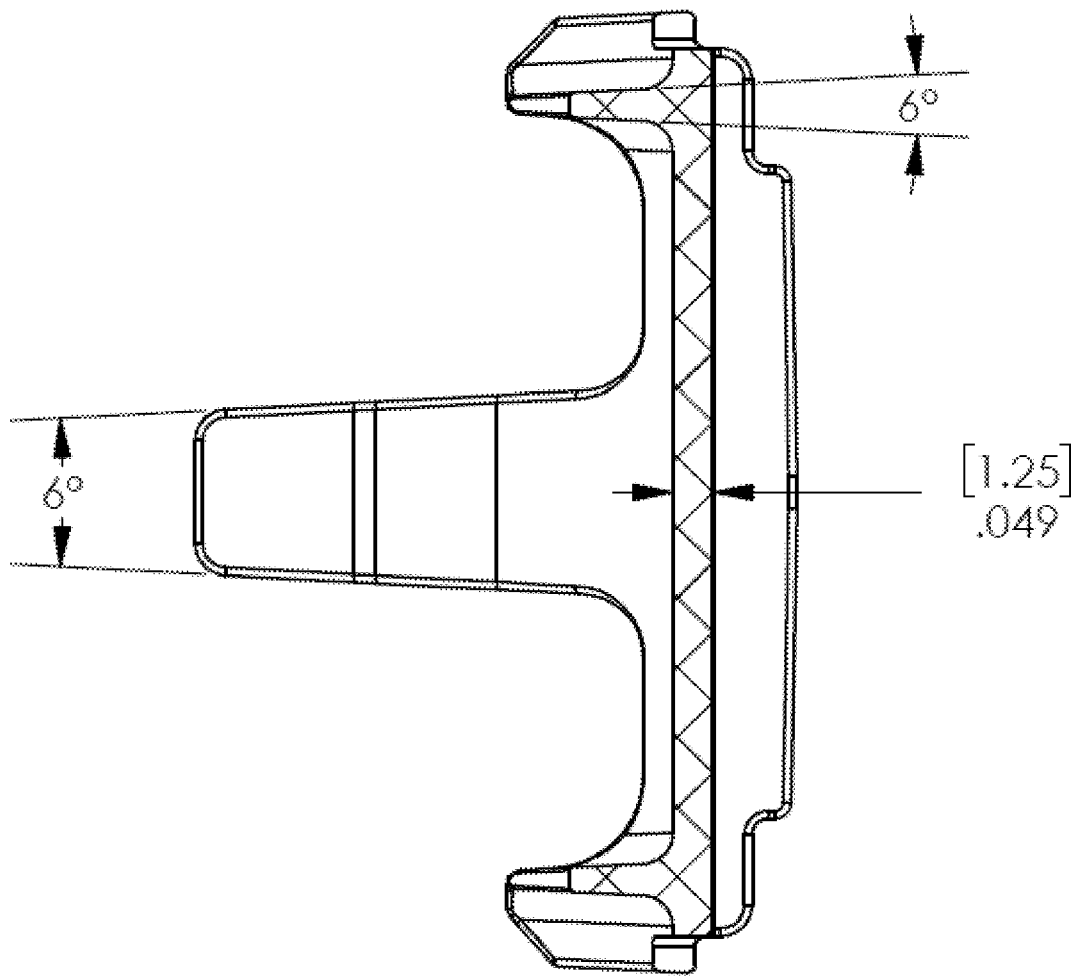
FIG. 14C depicts another mechanical diagram illustrating the battery holder of FIG. 3A through FIG. 3D for the US market in accordance with embodiments of the present disclosure.
Figure 14D:
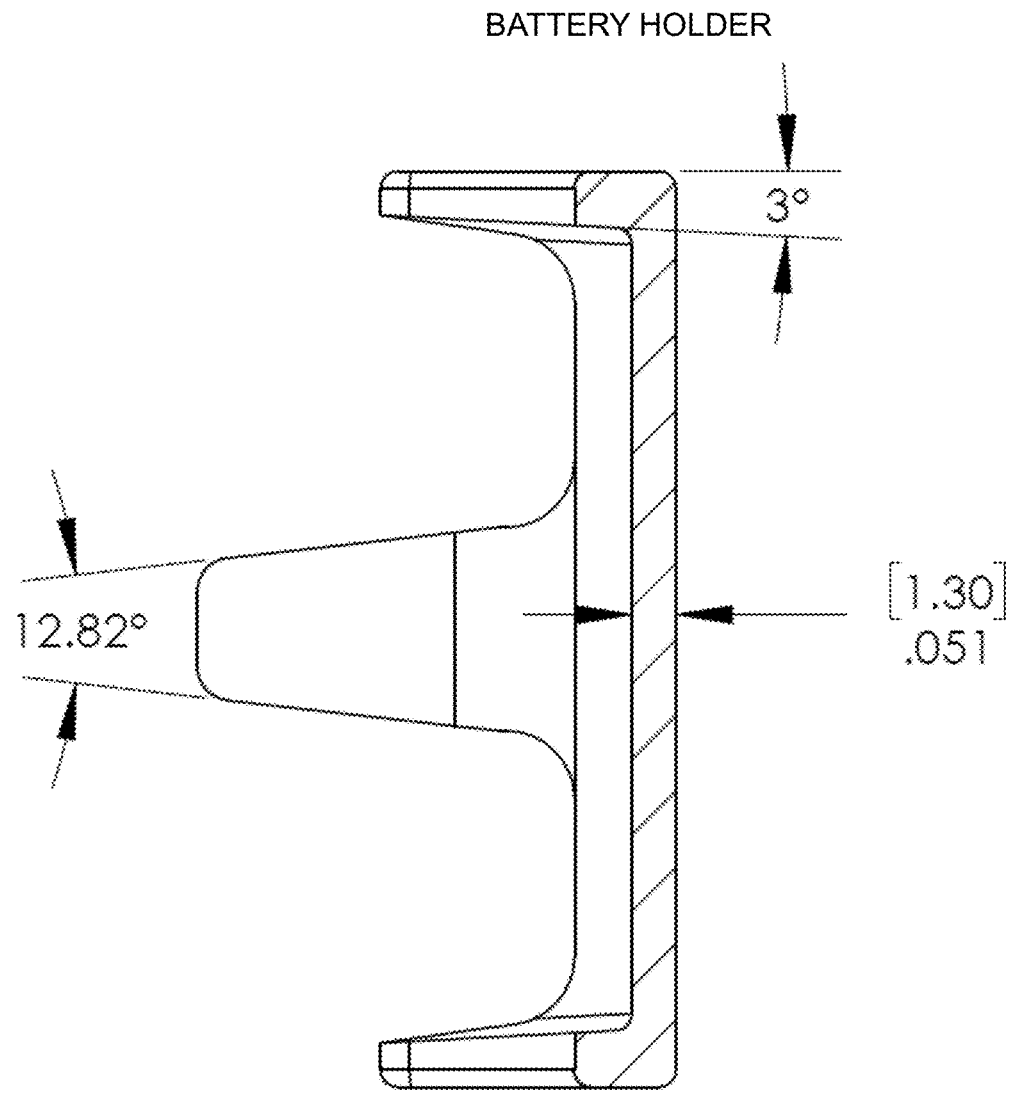
FIG. 14D depicts another mechanical diagram illustrating the battery holder of FIG. 3E through FIG. 3G for the Japan market in accordance with embodiments of the present disclosure.
Figure 14E:
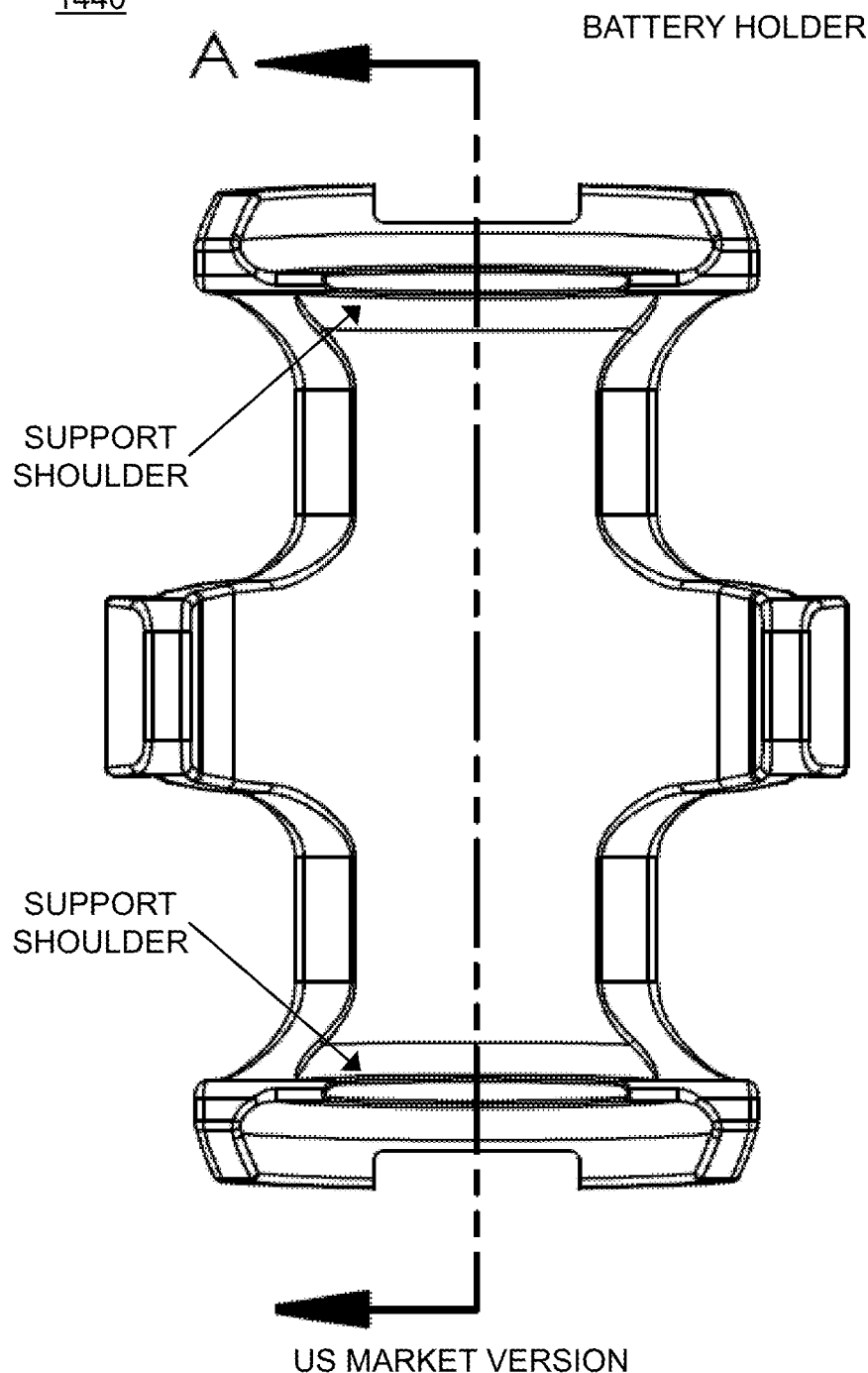
FIG. 14E depicts another mechanical diagram illustrating the battery holder of FIG. 3A through FIG. 3D for the US market in accordance with embodiments of the present disclosure.
Figure 14F:
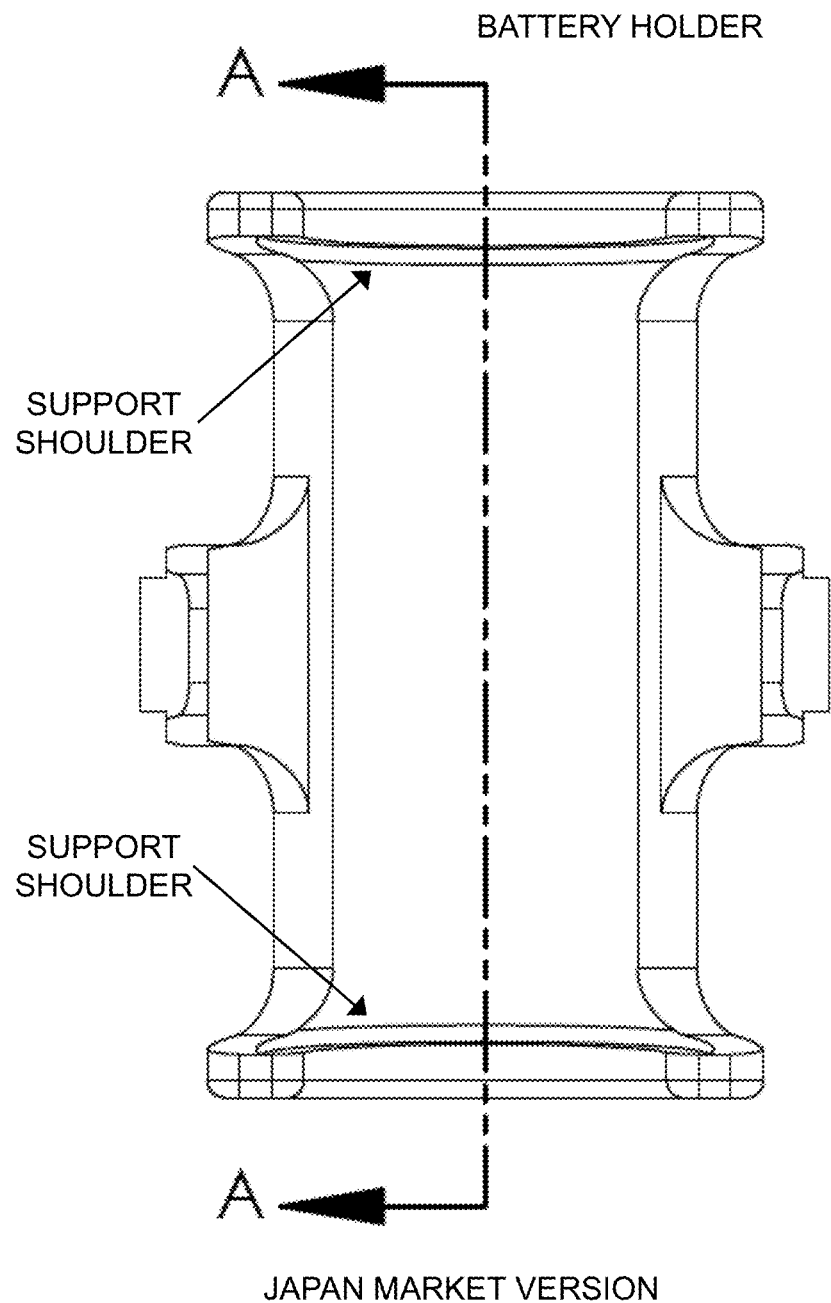
FIG. 14F depicts another mechanical diagram illustrating the battery holder of FIG. 3E through FIG. 3G for the Japan market in accordance with embodiments of the present disclosure.
Figure 14G:
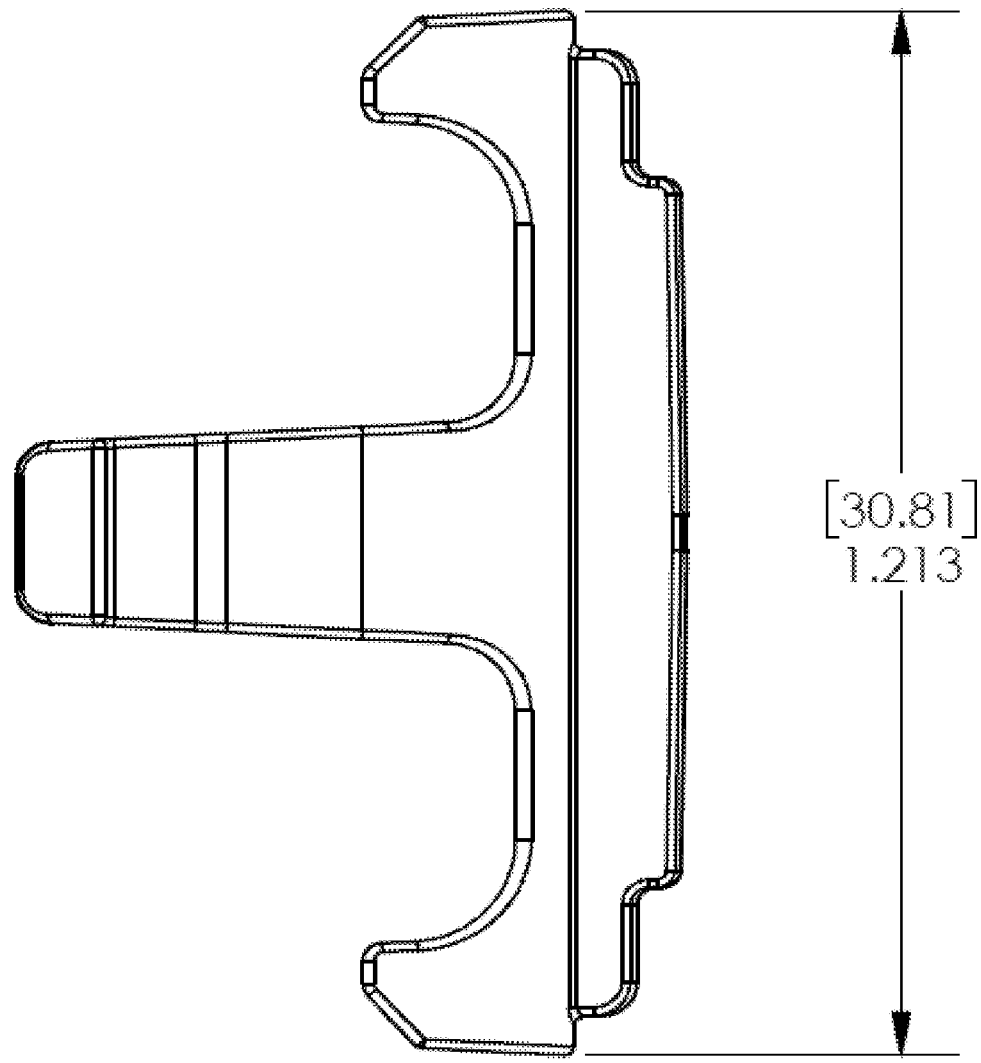
FIG. 14G depicts another mechanical diagram illustrating the battery holder of FIG. 3A through FIG. 3D for the US market in accordance with embodiments of the present disclosure.
Figure 14H:
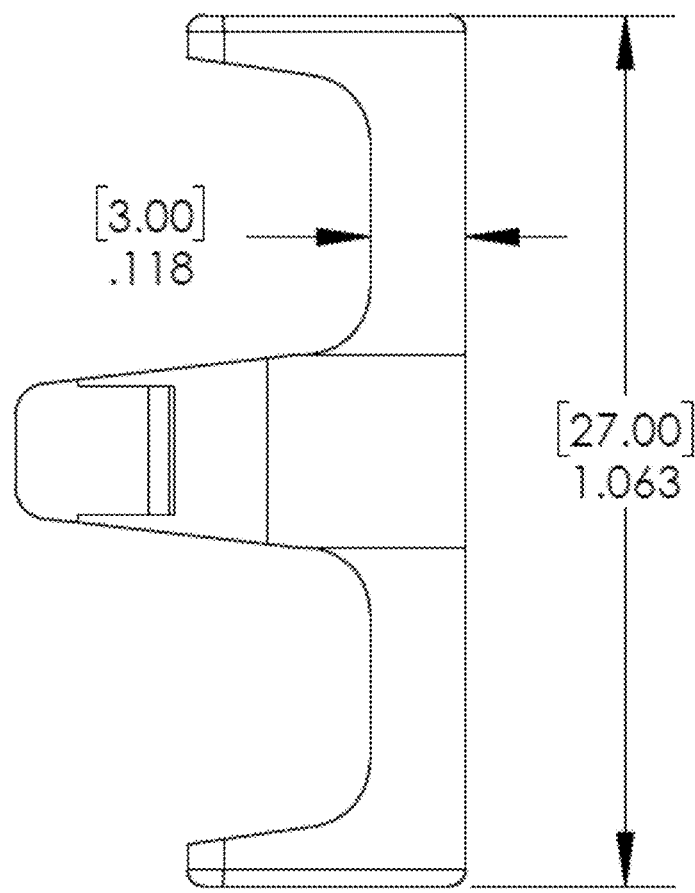
FIG. 14H depicts another mechanical diagram illustrating the battery holder of FIG. 3E through FIG. 3G for the Japan market in accordance with embodiments of the present disclosure.
Figure 14I:
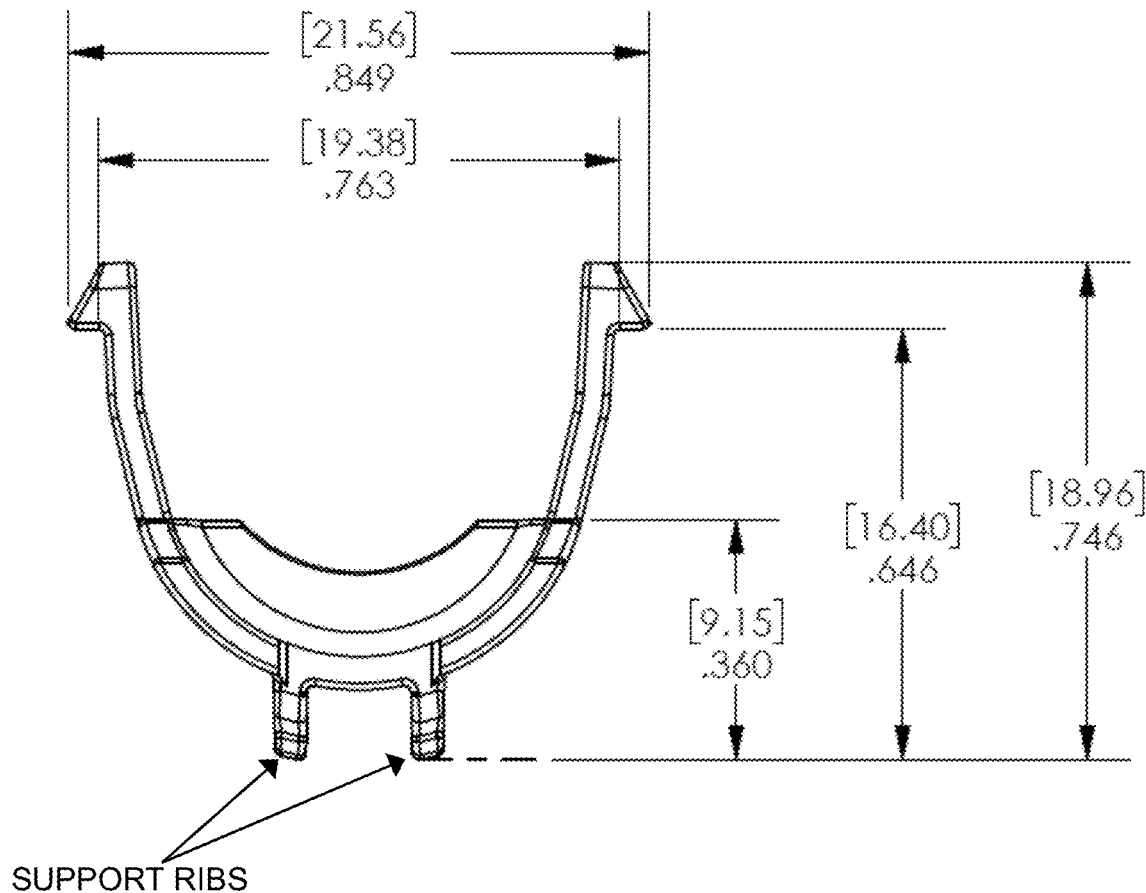
FIG. 14I depicts another mechanical diagram illustrating the battery holder of FIG. 3A through FIG. 3D for the US market in accordance with embodiments of the present disclosure.
Figure 14J:
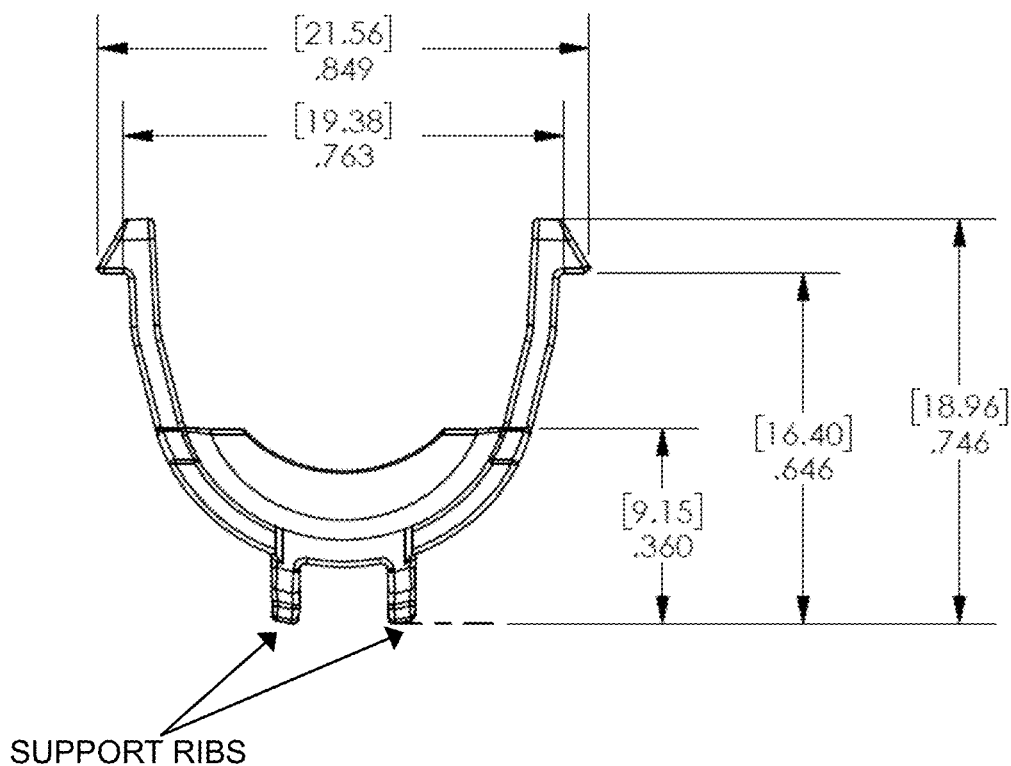
FIG. 14J depicts another mechanical diagram illustrating the battery holder of FIG. 3E through FIG. 3G for the Japan market in accordance with embodiments of the present disclosure.

FIG. 14A depicts a mechanical diagram 1400 illustrating a first view of the battery holder of FIG. 3A through FIG. 3D for the US market in accordance with embodiments of the present disclosure. FIG. 14B depicts a mechanical diagram 1410 illustrating a first view of the battery holder of FIG. 3E through FIG. 3G for the Japan market in accordance with embodiments of the present disclosure. FIG. 14C depicts another mechanical diagram 1420 a second view of illustrating the battery holder of FIG. 3A through FIG. 3D for the US market in accordance with embodiments of the present disclosure. FIG. 14D depicts another mechanical diagram 1430 a second view of illustrating the battery holder of FIG. 3E through FIG. 3G for the Japan market in accordance with embodiments of the present disclosure. FIG. 14E depicts another mechanical diagram 1440 a third view of illustrating the battery holder of FIG. 3A through FIG. 3D for the US market in accordance with embodiments of the present disclosure. FIG. 14F depicts another mechanical diagram 1450 illustrating a third view of the battery holder of FIG. 3E through FIG. 3G for the Japan market in accordance with embodiments of the present disclosure. FIG. 14G depicts another mechanical diagram 1460 illustrating a fourth view of the battery holder of FIG. 3A through FIG. 3D for the US market in accordance with embodiments of the present disclosure. FIG. 14H depicts another mechanical diagram 1470 illustrating a fourth view of the battery holder of FIG. 3E through FIG. 3G for the Japan market in accordance with embodiments of the present disclosure. FIG. 14I depicts another mechanical diagram 1480 illustrating a fifth view of the battery holder of FIG. 3A through FIG. 3D for the US market in accordance with embodiments of the present disclosure. FIG. 14J depicts another mechanical diagram 1490 illustrating a fifth view of the battery holder of FIG. 3E through FIG. 3G for the Japan market in accordance with embodiments of the present disclosure. Dimensions are presented in inches and millimeters as applicable. Each battery holder includes shoulders that fix the battery in space relative to the base and reduce vibration stress on the battery holder. (See FIG. 14E and FIG. 14G.). Each battery holder also includes ribbing that helps to press in the battery holder and tightens the PCB assembly for better vibration response. (See FIG. 14I and FIG. 14J.).

Figure 15A:
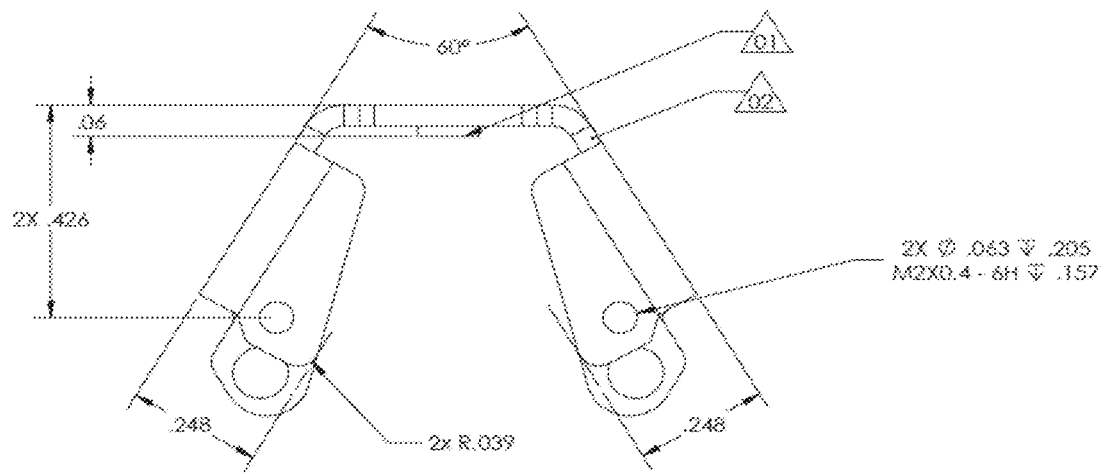
FIG. 15A depicts a mechanical diagram illustrating the metal support bracket of FIG. 4A and FIG. 4B for the US market in accordance with embodiments of the present disclosure.
Figure 15B:
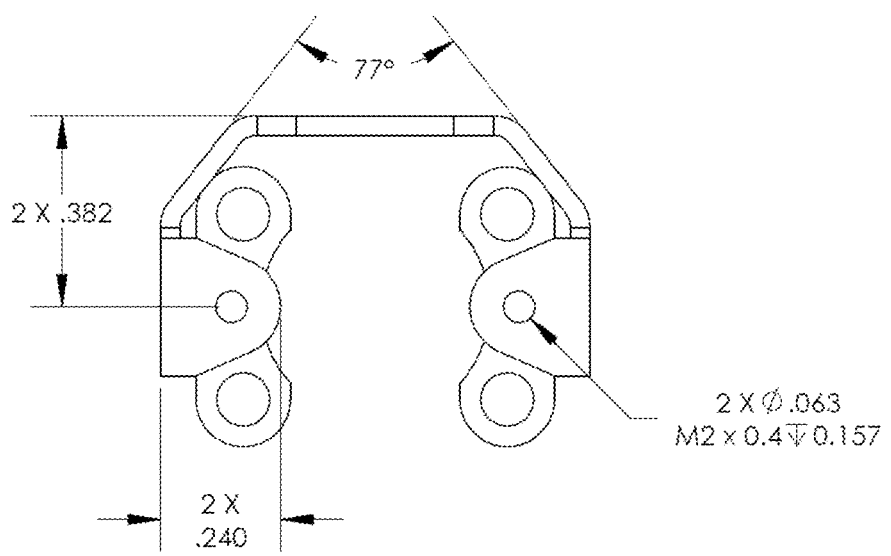
FIG. 15B depicts a mechanical diagram illustrating the metal support bracket of FIG. 4C and FIG. 4D for the Japan market in accordance with embodiments of the present disclosure.
Figure 15C:
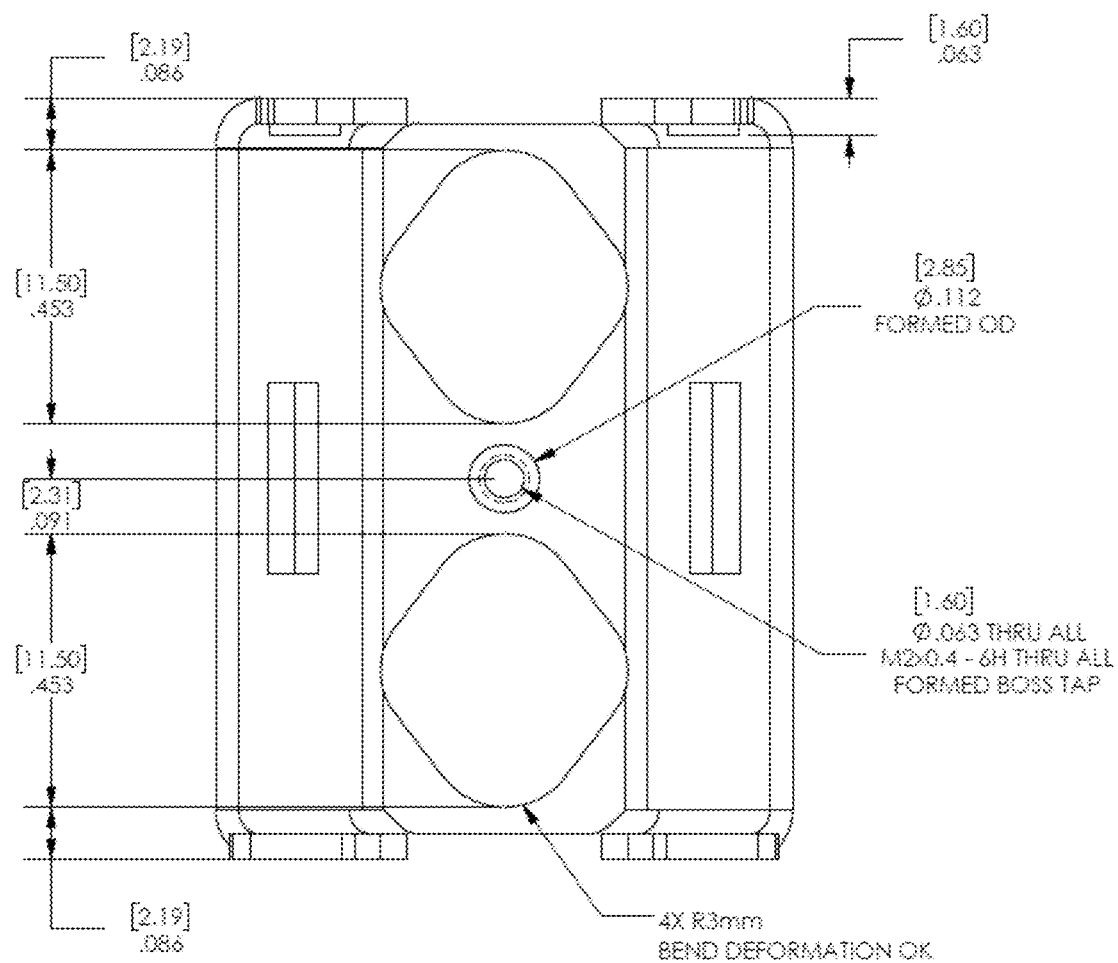
FIG. 15C depicts another mechanical diagram illustrating the metal support bracket of FIG. 4A and FIG. 4B for the US market in accordance with embodiments of the present disclosure.
Figure 15D:
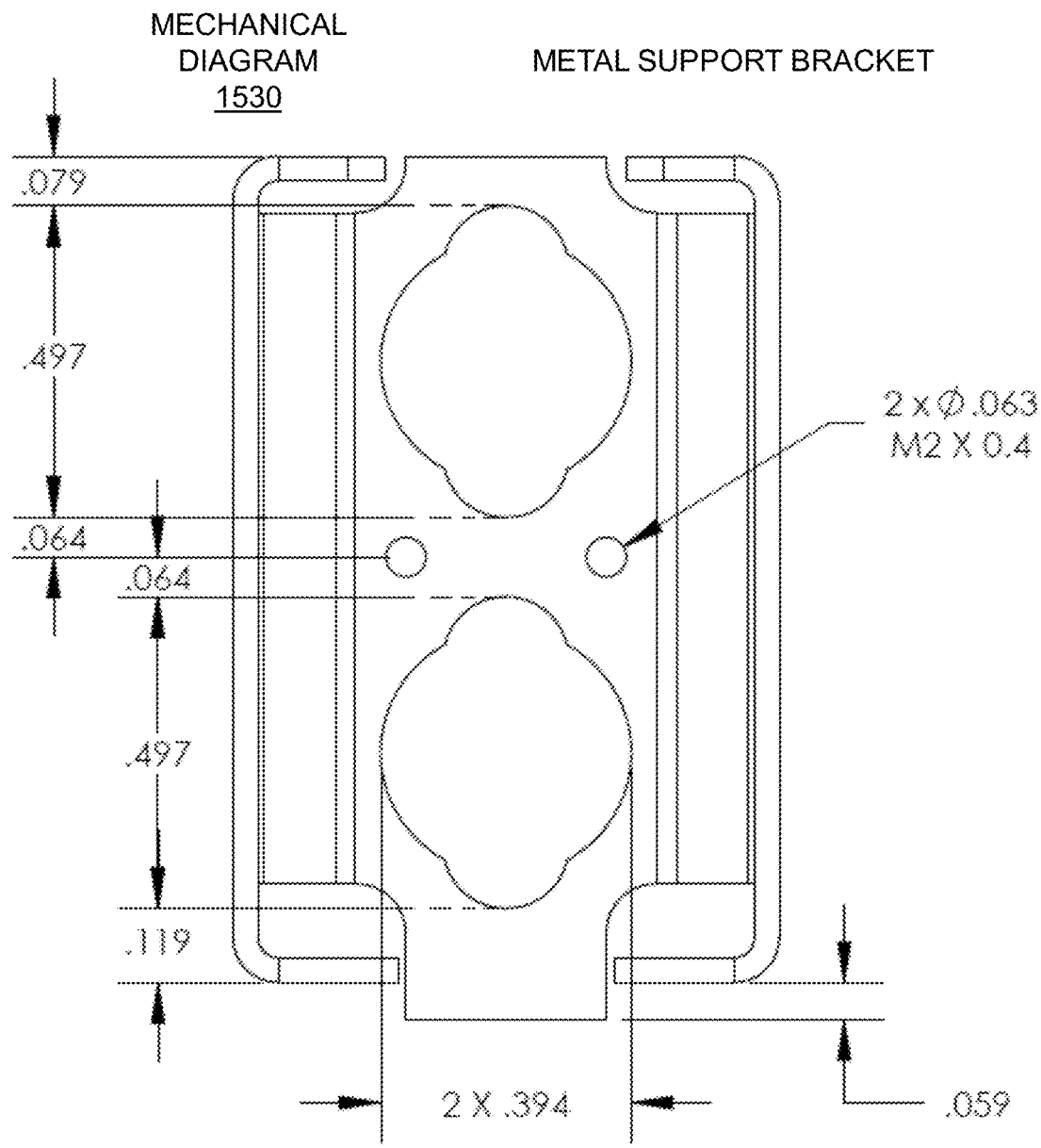
FIG. 15D depicts another mechanical diagram illustrating the metal support bracket of FIG. 4C and FIG. 4D for the Japan market in accordance with embodiments of the present disclosure.
Figure 15E:
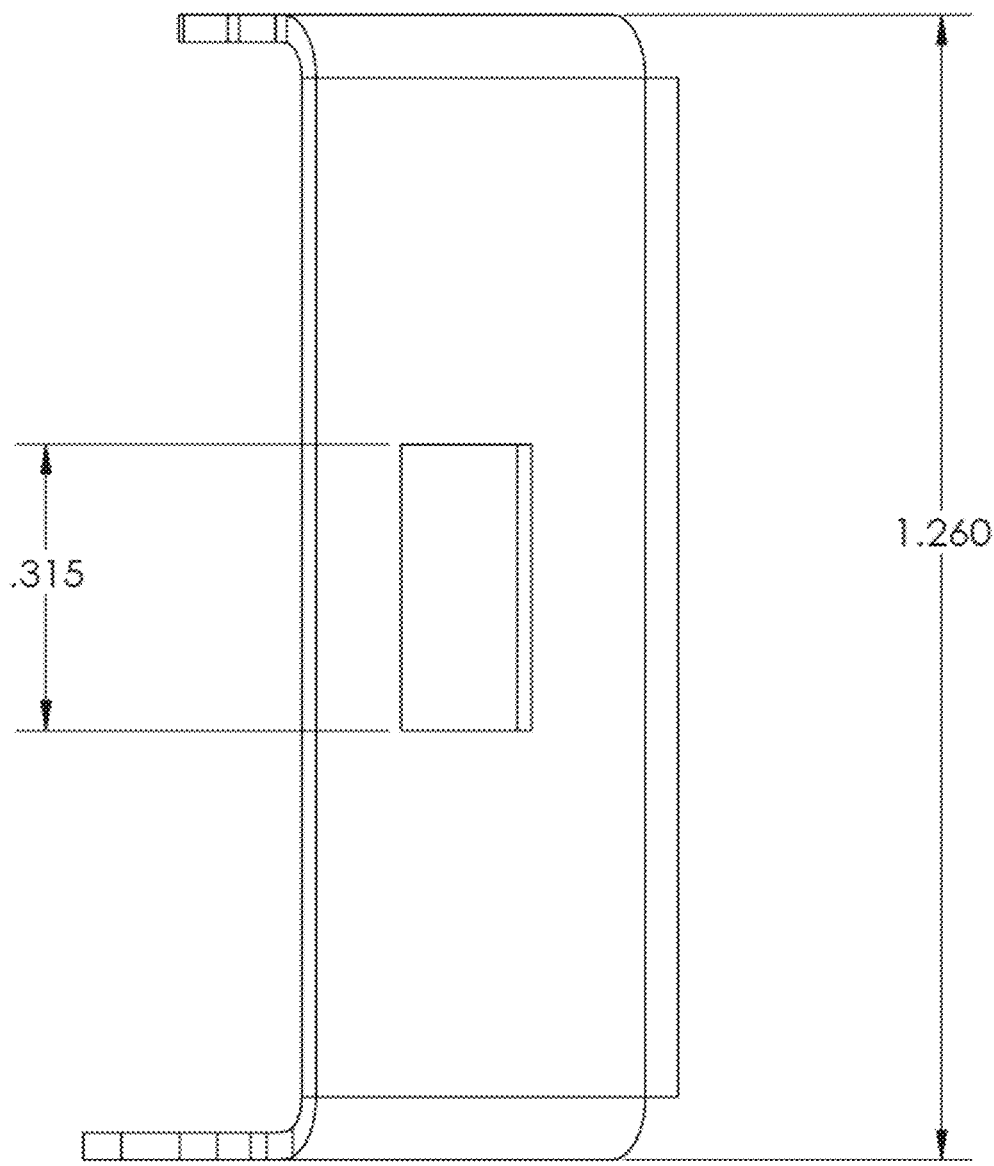
FIG. 15E depicts another mechanical diagram illustrating the metal support bracket of FIG. 4A and FIG. 4B for the US market in accordance with embodiments of the present disclosure.
Figure 15F:
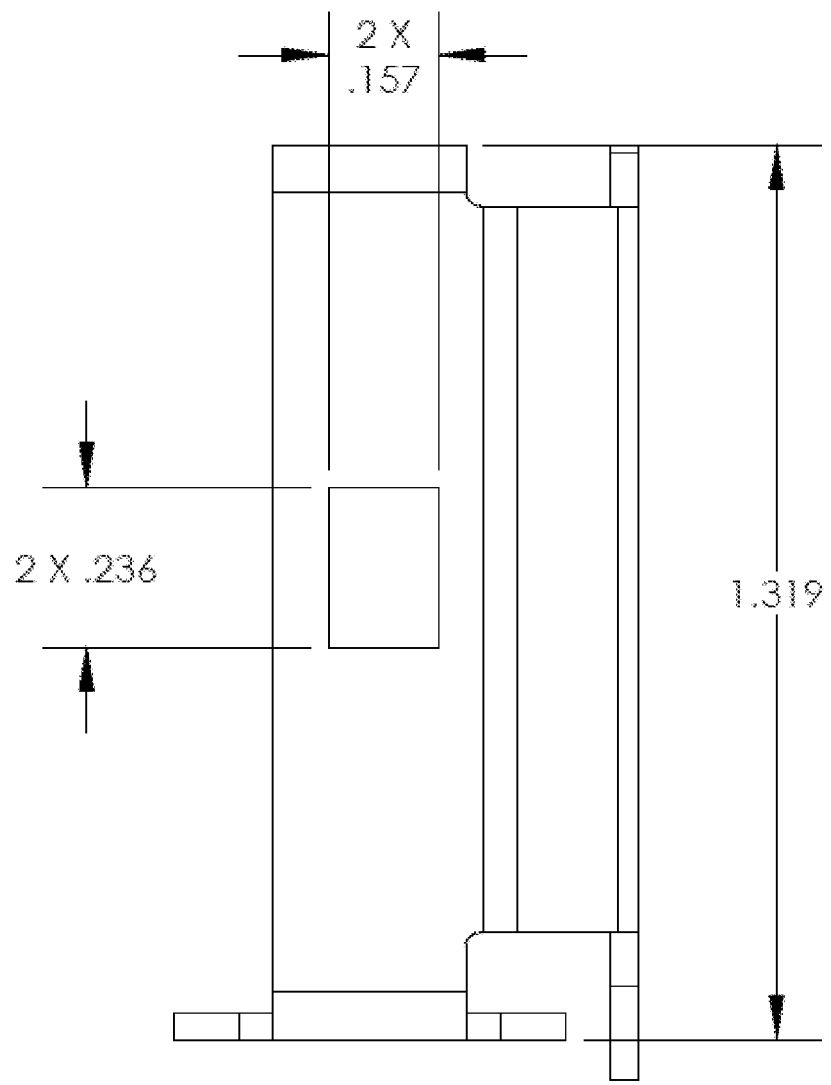
FIG. 15F depicts another mechanical diagram illustrating the metal support bracket of FIG. 4C and FIG. 4D for the Japan market in accordance with embodiments of the present disclosure.
Figure 15G:
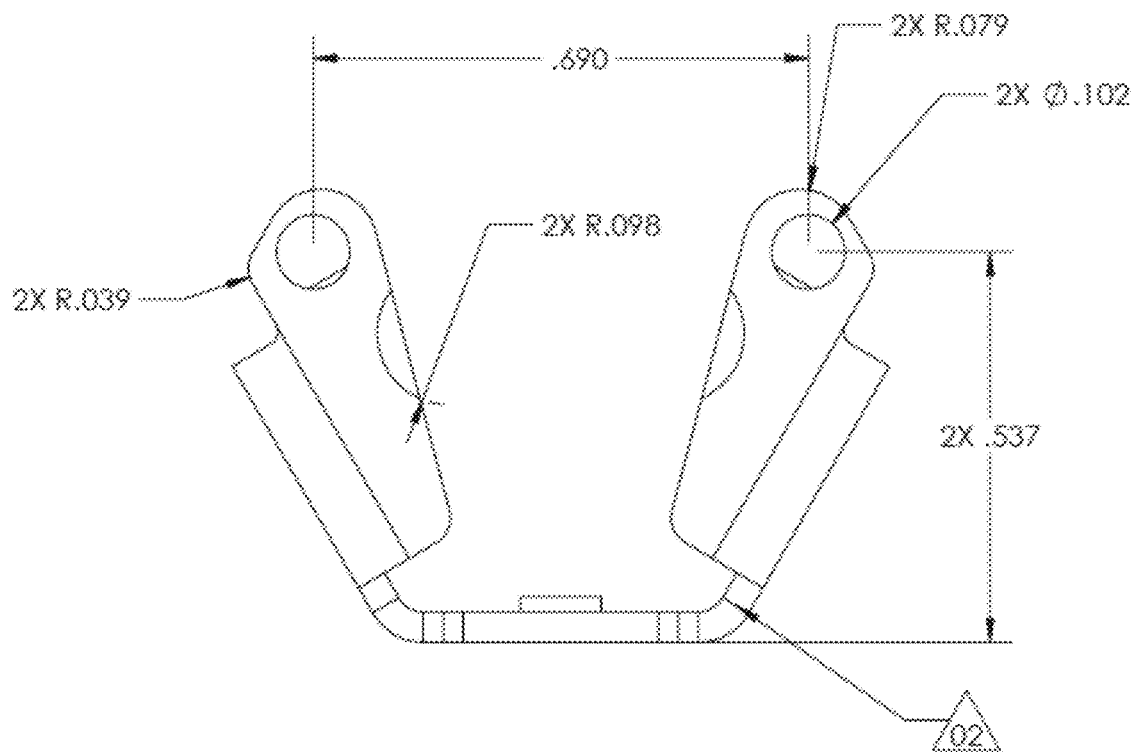
FIG. 15G depicts another mechanical diagram illustrating the metal support bracket of FIG. 4A and FIG. 4B for the US market in accordance with embodiments of the present disclosure.
Figure 15H:
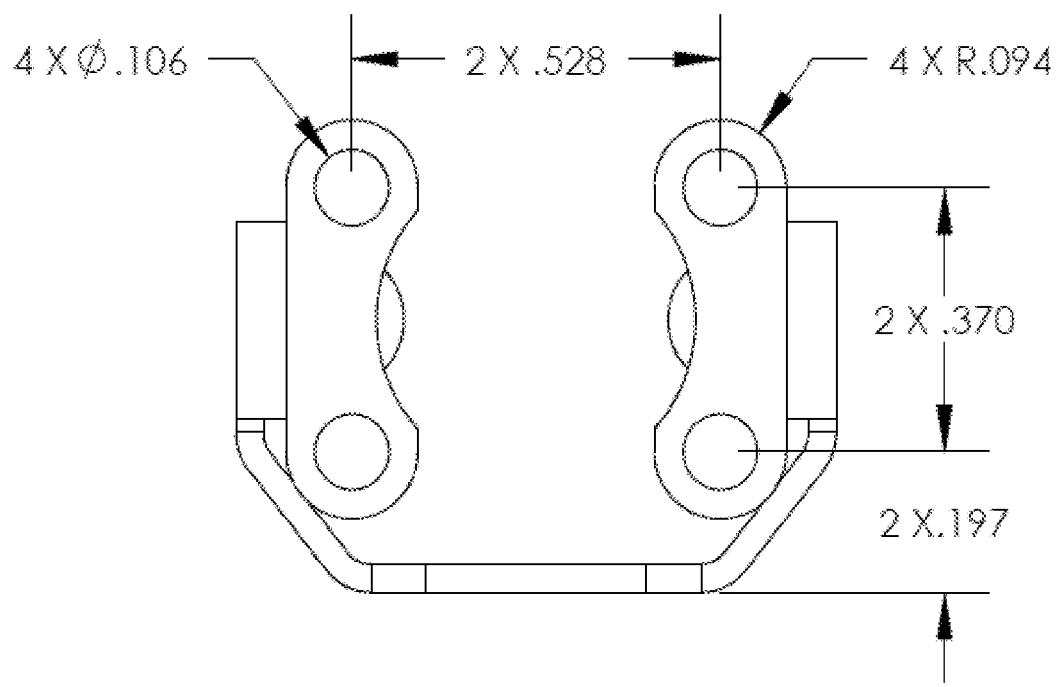
FIG. 15H depicts another mechanical diagram illustrating the metal support bracket of FIG. 4C and FIG. 4D for the Japan market in accordance with embodiments of the present disclosure.
Figure 15I:
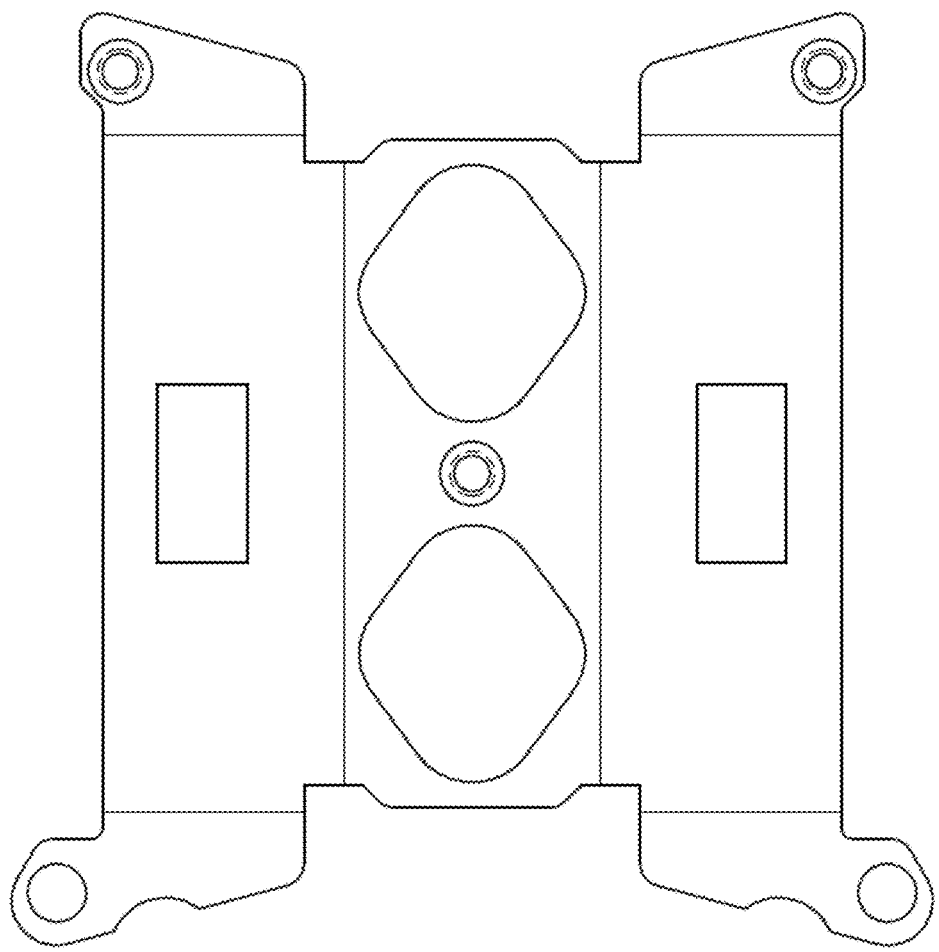
FIG. 15I depicts another mechanical diagram illustrating the metal support bracket of FIG. 4A and FIG. 4B for the US market in accordance with embodiments of the present disclosure.
Figure 15J:
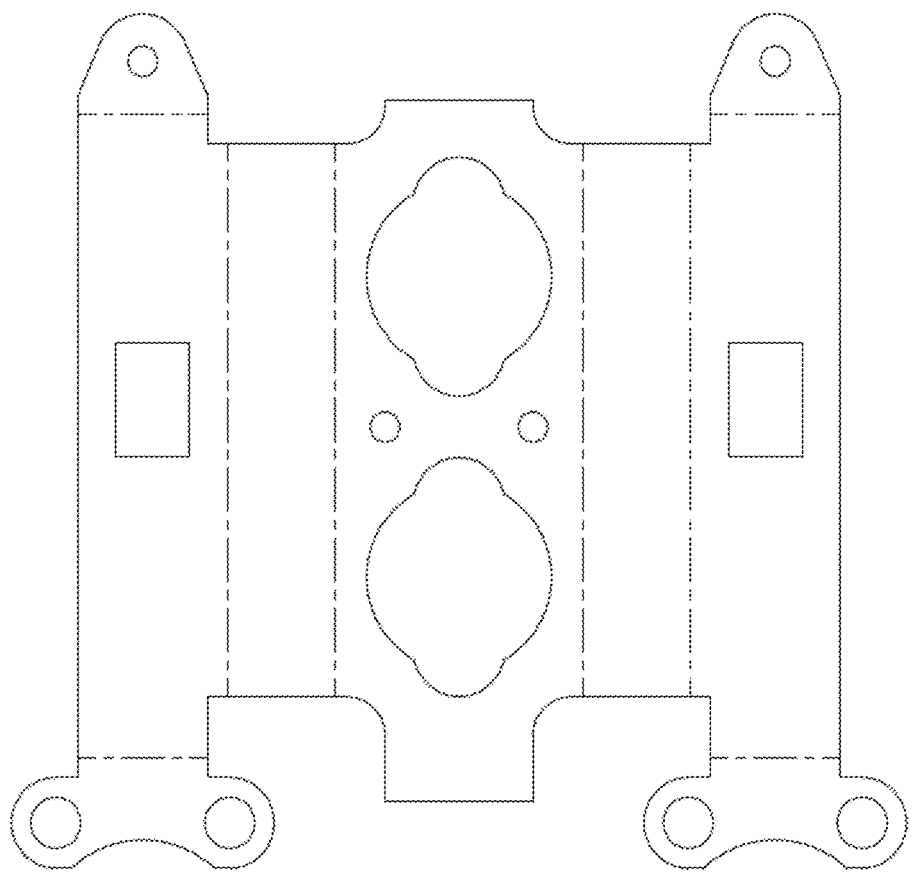
FIG. 15J depicts another mechanical diagram illustrating the metal support bracket of FIG. 4C and FIG. 4D for the Japan market in accordance with embodiments of the present disclosure.

FIG. 15A depicts a mechanical diagram 1500 illustrating a first view of the metal support bracket of FIG. 4A and FIG. 4B for the US market in accordance with embodiments of the present disclosure. FIG. 15B depicts a mechanical diagram 1510 illustrating a first view of the metal support bracket of FIG. 4C and FIG. 4D for the Japan market in accordance with embodiments of the present disclosure. FIG. 15C depicts another mechanical diagram 1520 illustrating a second view of the metal support bracket of FIG. 4A and FIG. 4B for the US market in accordance with embodiments of the present disclosure. FIG. 15D depicts another mechanical diagram 1530 illustrating a second view of the metal support bracket of FIG. 4C and FIG. 4D for the Japan market in accordance with embodiments of the present disclosure. FIG. 15E depicts another mechanical diagram 1540 illustrating a third view of the metal support bracket of FIG. 4A and FIG. 4B for the US market in accordance with embodiments of the present disclosure. FIG. 15F depicts another mechanical diagram 1550 illustrating a third view of the metal support bracket of FIG. 4C and FIG. 4D for the Japan market in accordance with embodiments of the present disclosure. FIG. 15G depicts another mechanical diagram 1560 illustrating a fourth view of the metal support bracket of FIG. 4A and FIG. 4B for the US market in accordance with embodiments of the present disclosure. FIG. 15H depicts another mechanical diagram 1570 illustrating a fourth view of the metal support bracket of FIG. 4C and FIG. 4D for the Japan market in accordance with embodiments of the present disclosure. FIG. 15I depicts another mechanical diagram 1580 illustrating a fifth view of the metal support bracket of FIG. 4A and FIG. 4B for the US market in accordance with embodiments of the present disclosure. FIG. 15J depicts another mechanical diagram 1590 illustrating a fifth view of the metal support bracket of FIG. 4C and FIG. 4D for the Japan market in accordance with embodiments of the present disclosure. Dimensions are presented in inches and millimeters as applicable.

Figure 16A:
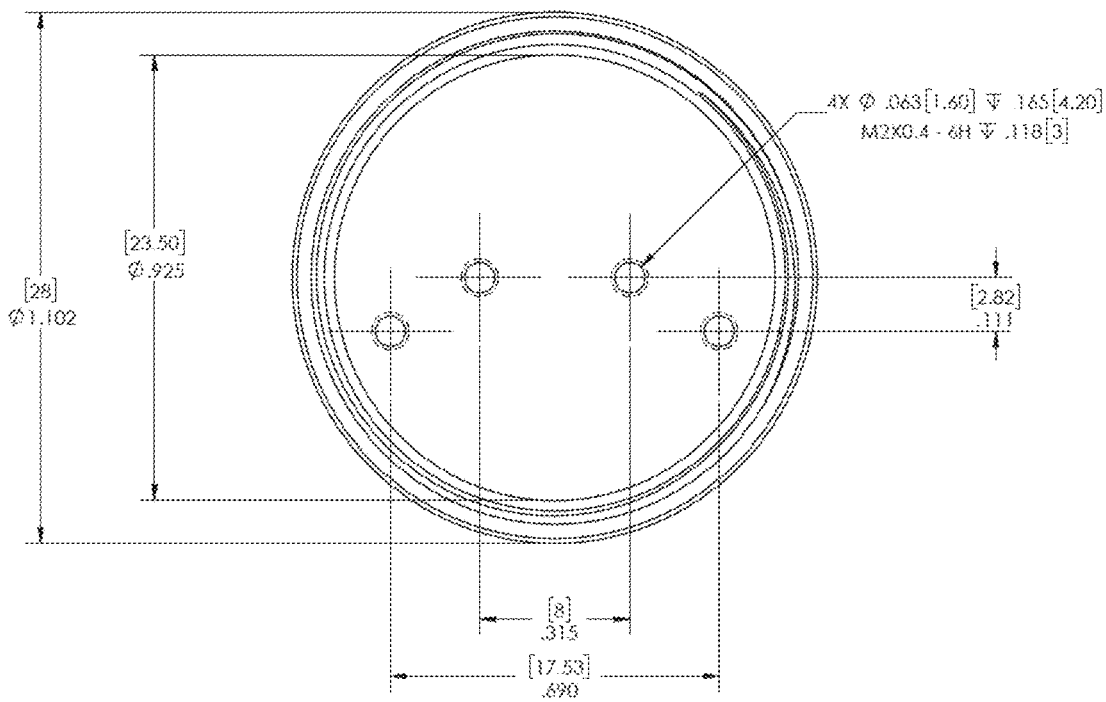
FIG. 16A depicts a mechanical diagram illustrating the non-pivoting base of FIG. 9A for the US market in accordance with embodiments of the present disclosure.
Figure 16B:
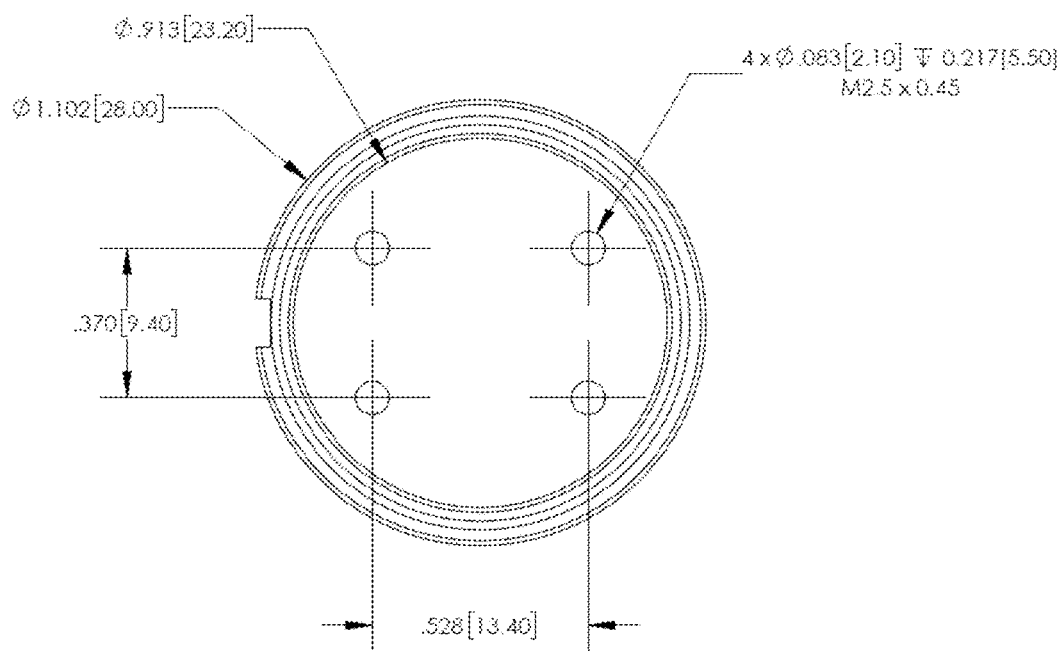
FIG. 16B depicts a mechanical diagram illustrating the non-pivoting base of FIG. 9B for the Japan market in accordance with embodiments of the present disclosure.
Figure 16C:
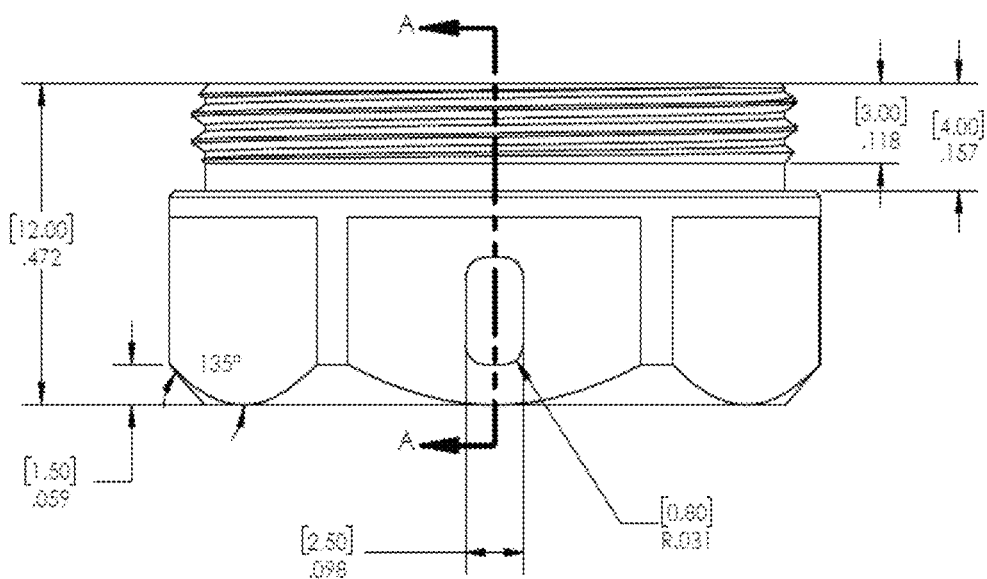
FIG. 16C depicts another mechanical diagram illustrating the non-pivoting base of FIG. 9A for the US market in accordance with embodiments of the present disclosure.
Figure 16D:
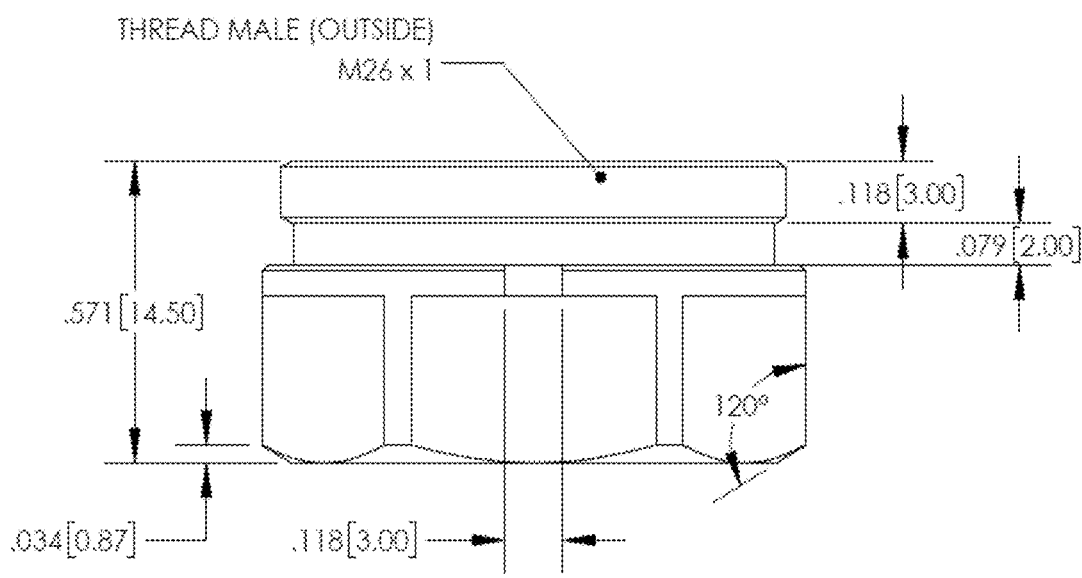
FIG. 16D depicts another mechanical diagram illustrating the non-pivoting base of FIG. 9B for the Japan market in accordance with embodiments of the present disclosure.
Figure 16E:
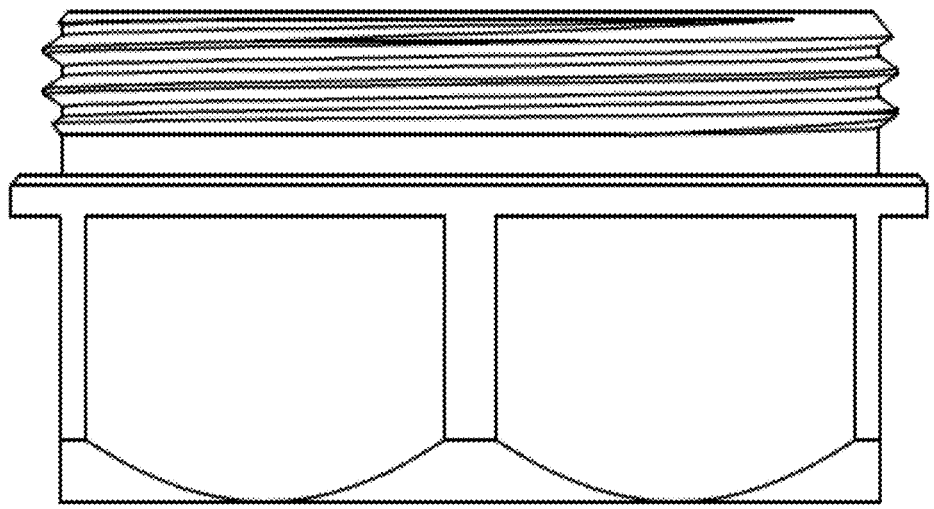
FIG. 16E depicts another mechanical diagram illustrating the non-pivoting base of FIG. 9A for the US market in accordance with embodiments of the present disclosure.
Figure 16F:
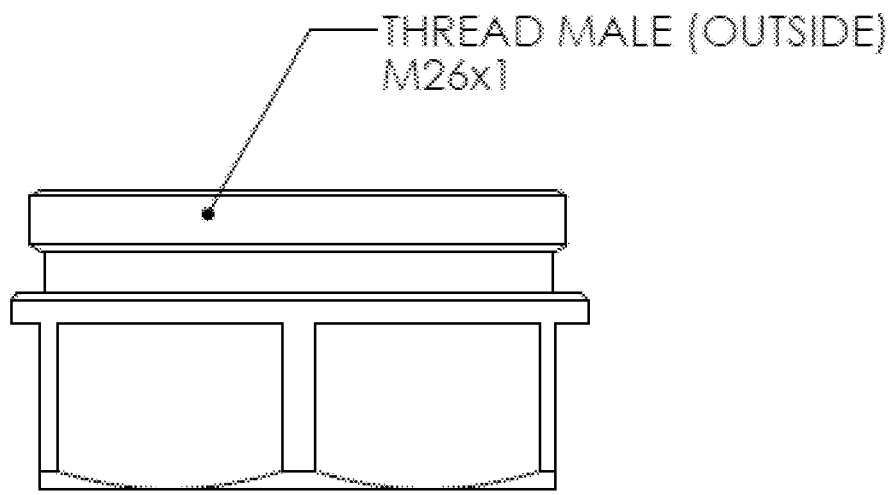
FIG. 16F depicts another mechanical diagram illustrating the non-pivoting base of FIG. 9B for the Japan market in accordance with embodiments of the present disclosure.
Figure 16G:
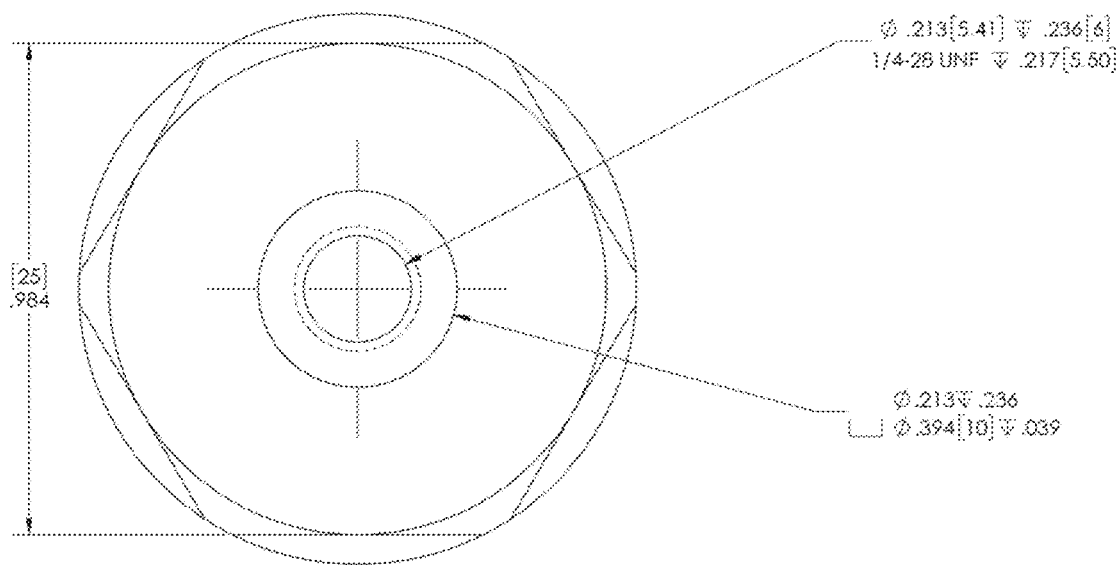
FIG. 16G depicts another mechanical diagram illustrating the non-pivoting base of FIG. 9A for the US market in accordance with embodiments of the present disclosure.
Figure 16H:
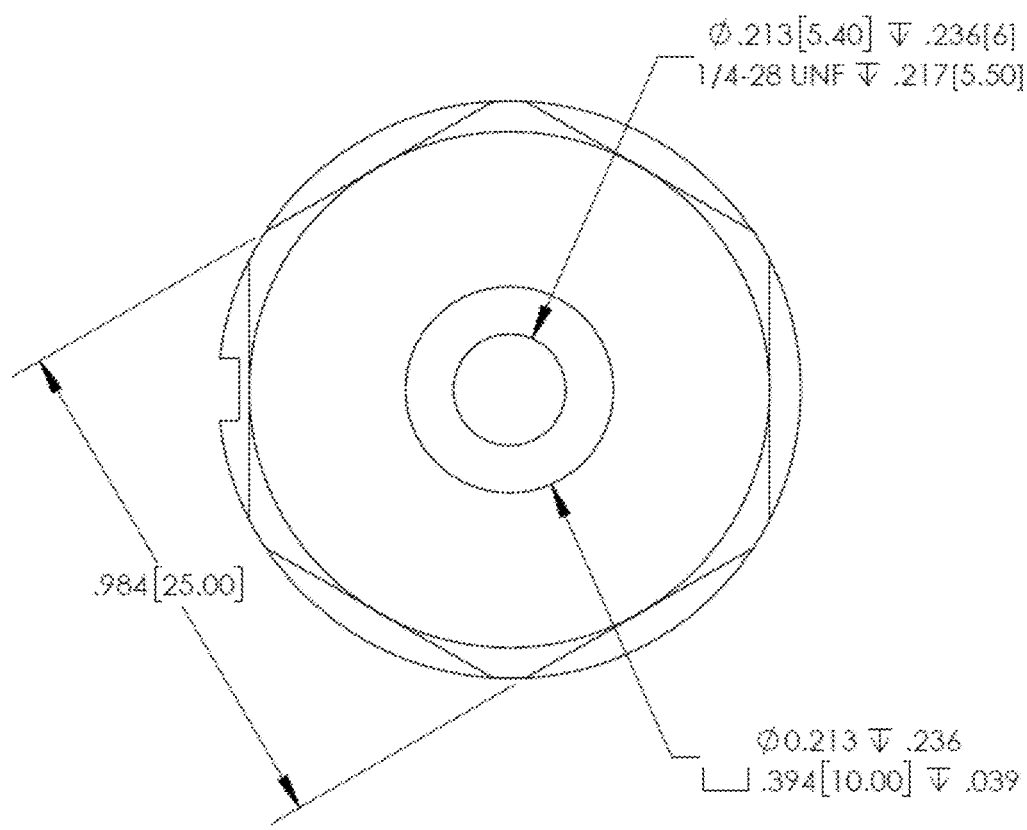
FIG. 16H depicts another mechanical diagram illustrating the non-pivoting base of FIG. 9B for the Japan market in accordance with embodiments of the present disclosure.

FIG. 16A depicts a mechanical diagram 1600 illustrating a first view of the non-pivoting base of FIG. 9A for the US market in accordance with embodiments of the present disclosure. FIG. 16B depicts a mechanical diagram 1610 illustrating a first view of the non-pivoting base of FIG. 9B for the Japan market in accordance with embodiments of the present disclosure. FIG. 16C depicts a mechanical diagram 1620 illustrating a second view of the non-pivoting base of FIG. 9A for the US market in accordance with embodiments of the present disclosure. FIG. 16D depicts a mechanical diagram 1630 illustrating a second view of the non-pivoting base of FIG. 9B for the Japan market in accordance with embodiments of the present disclosure. FIG. 16E depicts a mechanical diagram 1640 illustrating a third view of the non-pivoting base of FIG. 9A for the US market in accordance with embodiments of the present disclosure. FIG. 16F depicts a mechanical diagram 1650 illustrating a third view of the non-pivoting base of FIG. 9B for the Japan market in accordance with embodiments of the present disclosure. FIG. 16G depicts a mechanical diagram 1660 illustrating a fourth view of the non-pivoting base of FIG. 9A for the US market in accordance with embodiments of the present disclosure. FIG. 16H depicts a mechanical diagram 1670 illustrating a fourth view of the non-pivoting base of FIG. 9B for the Japan market in accordance with embodiments of the present disclosure. Dimensions are presented in inches and millimeters as applicable.

The US and Japan market versions use different fastener patterns. The US market version has two screw positions near the center of the part that help locate and hold sensing components close to the center of the part and are solely used to attach the PCB to the hex base. The Japan market version pattern positions the screws further away from these components, and uses an equidistance four position design. All four screws in the Japanese market version design sandwich the PCB with the metal support bracket, thus none are dedicated solely to positioning the PCB to the hex base.

Figure 17A:
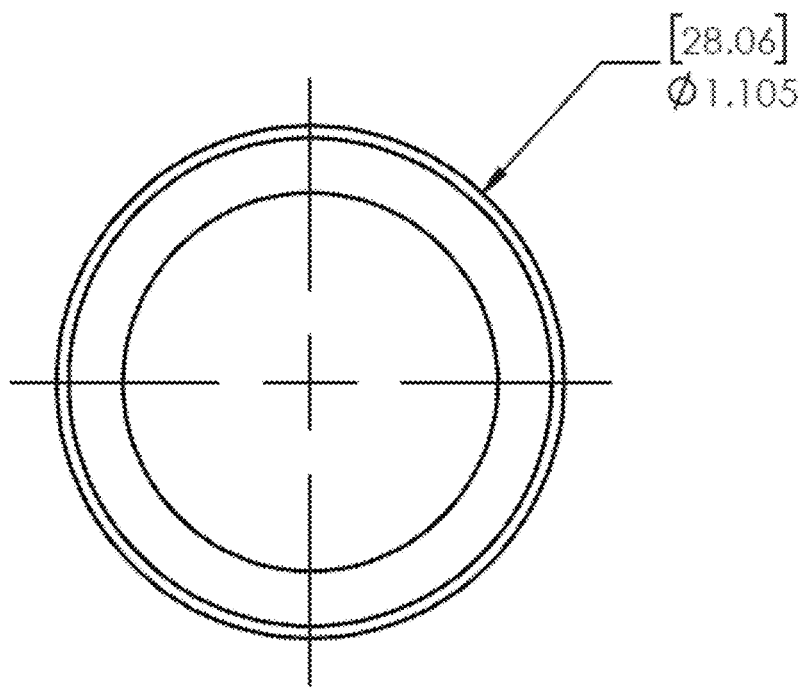
FIG. 17A depicts a mechanical diagram illustrating the cap of FIG. 6A and FIG. 6B for the US market in accordance with embodiments of the present disclosure.
Figure 17B:
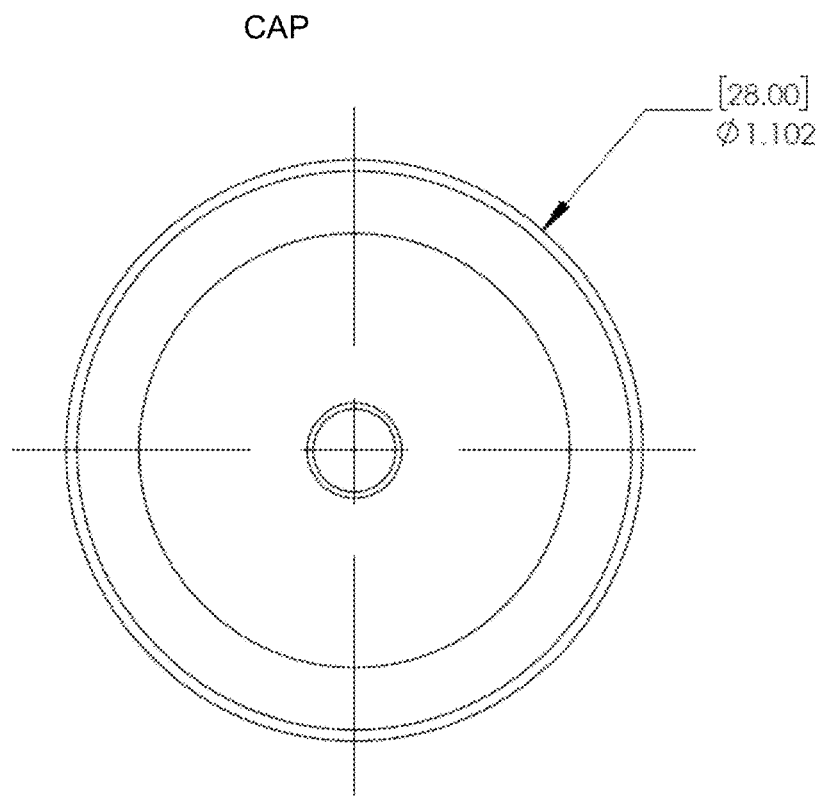
FIG. 17B depicts a mechanical diagram illustrating the cap of FIG. 6C and FIG. 6D for the Japan market in accordance with embodiments of the present disclosure.
Figure 17C:
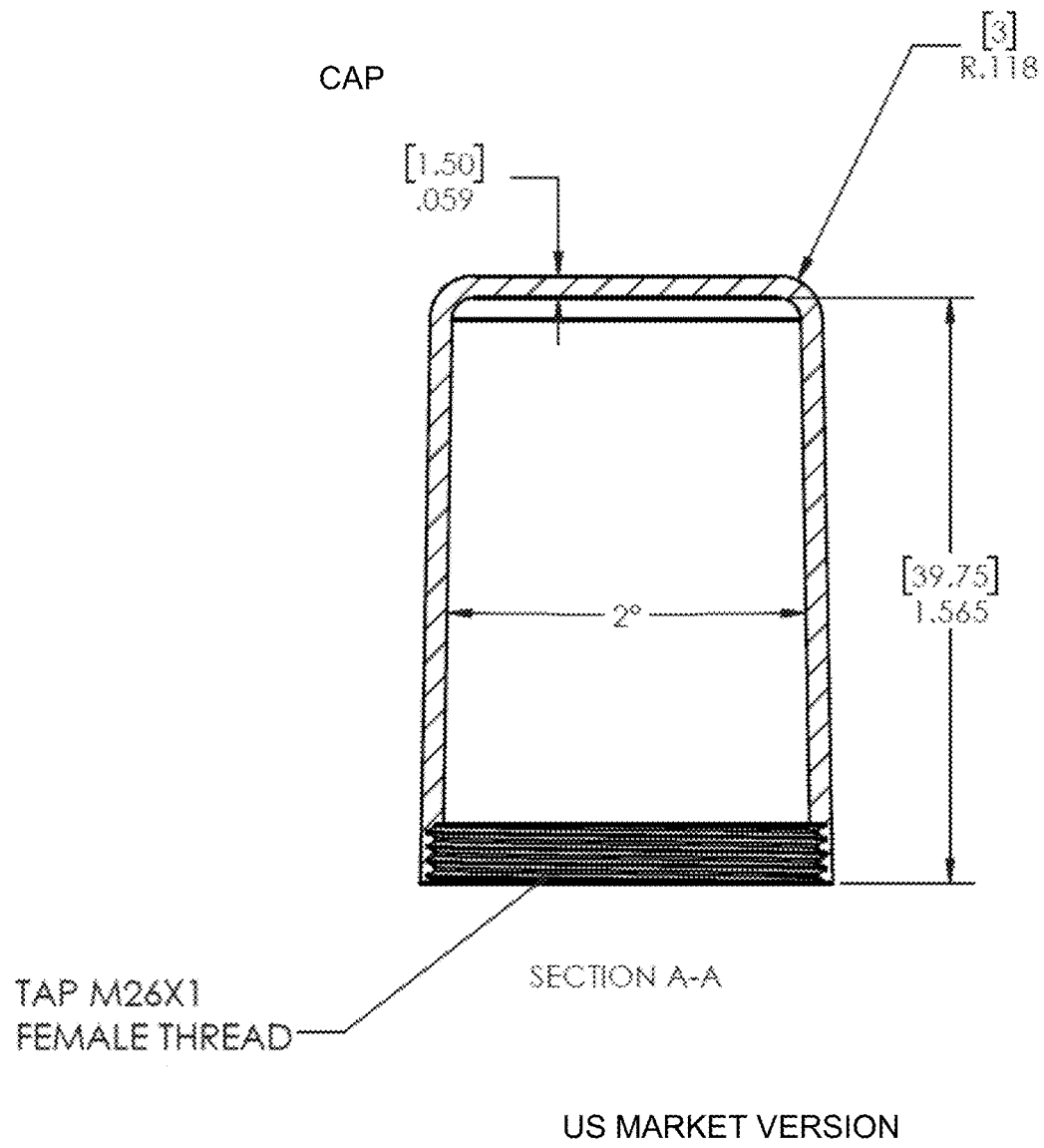
FIG. 17C depicts another mechanical diagram illustrating the cap of FIG. 6A and FIG. 6B for the US market in accordance with embodiments of the present disclosure.
Figure 17D:
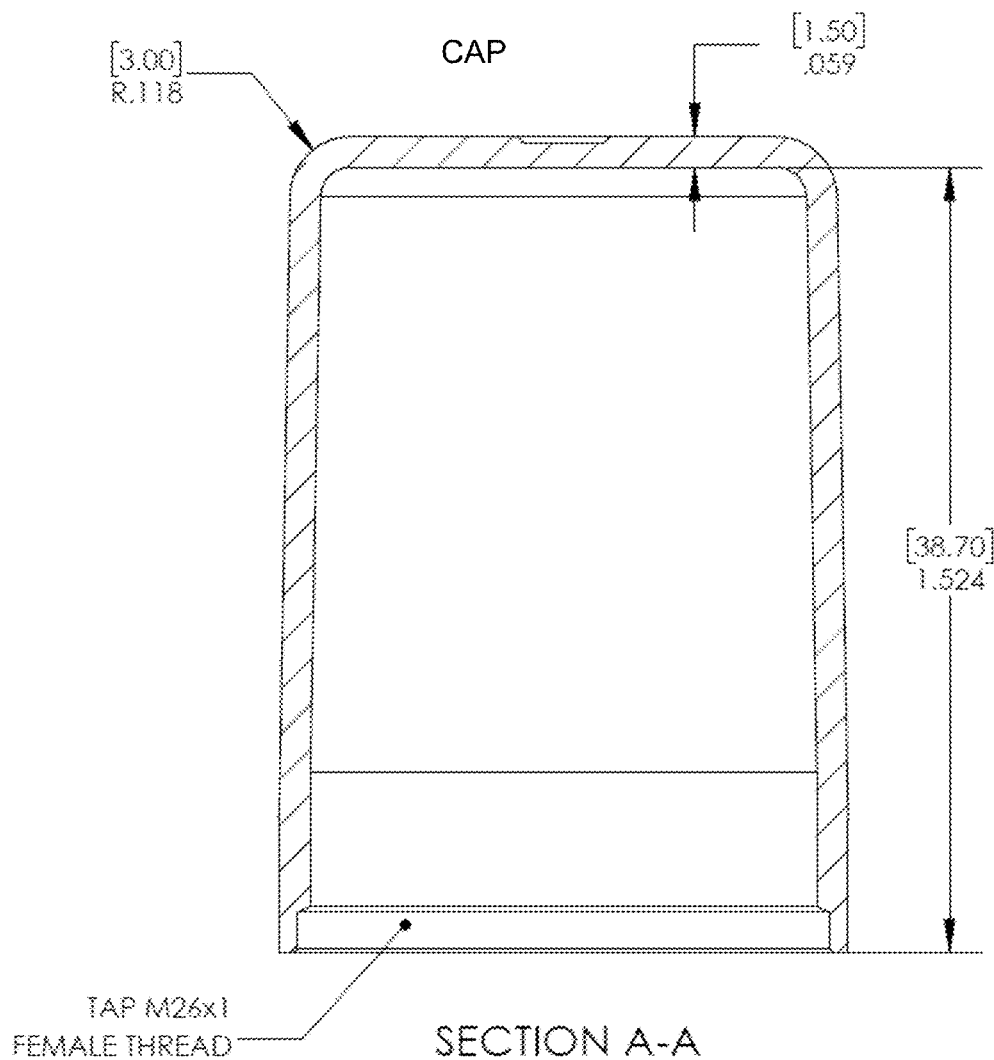
FIG. 17D depicts another mechanical diagram illustrating the cap of FIG. 6C and FIG. 6D for the Japan market in accordance with embodiments of the present disclosure.
Figure 17E:
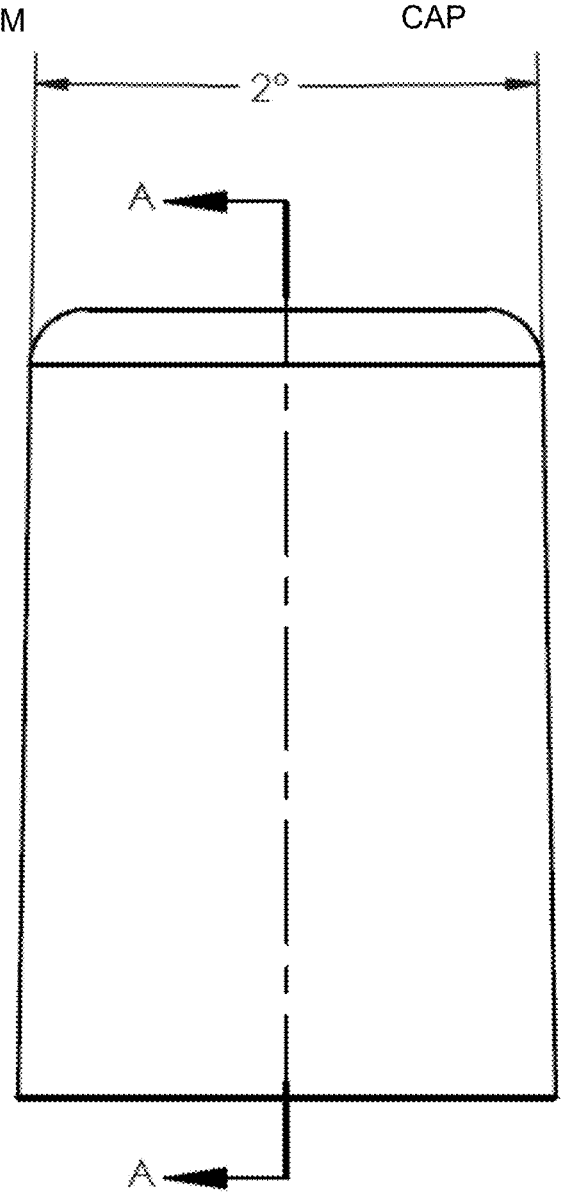
FIG. 17E depicts another mechanical diagram illustrating the cap of FIG. 6A and FIG. 6B for the US market in accordance with embodiments of the present disclosure.
Figure 17F:
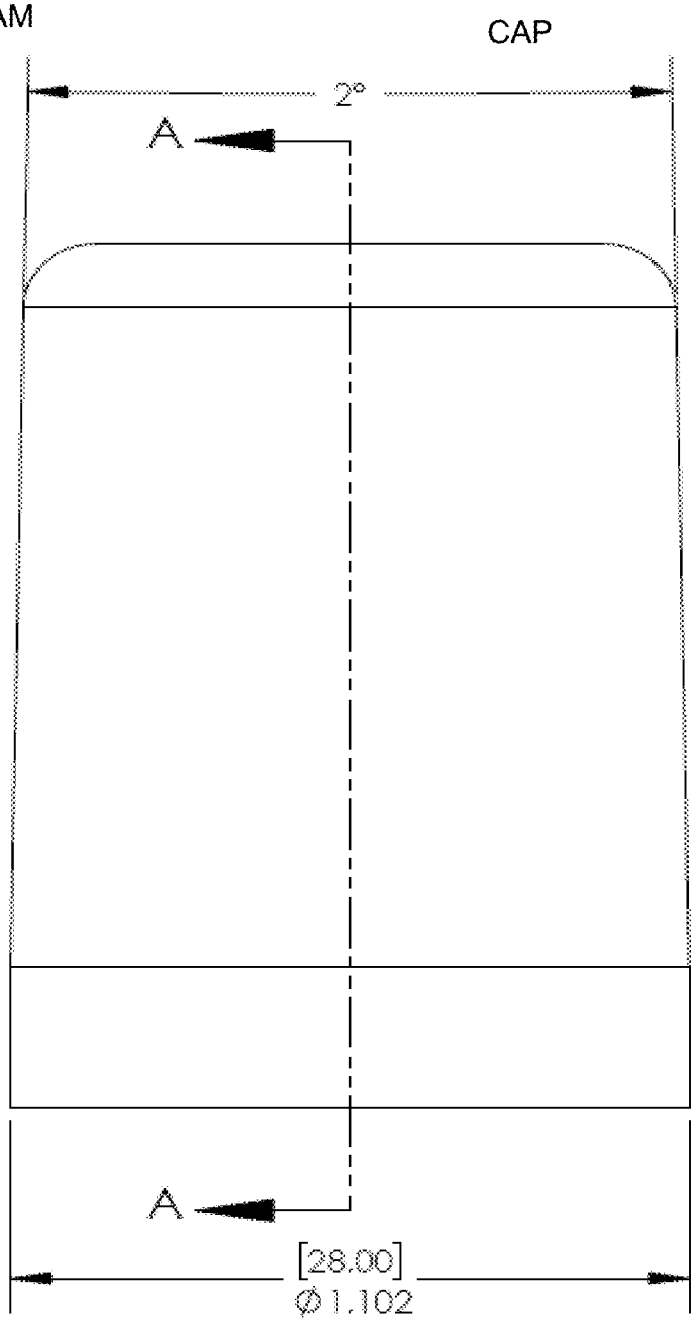
FIG. 17F depicts another mechanical diagram illustrating the cap of FIG. 6C and FIG. 6D for the Japan market in accordance with embodiments of the present disclosure.
Figure 17G:
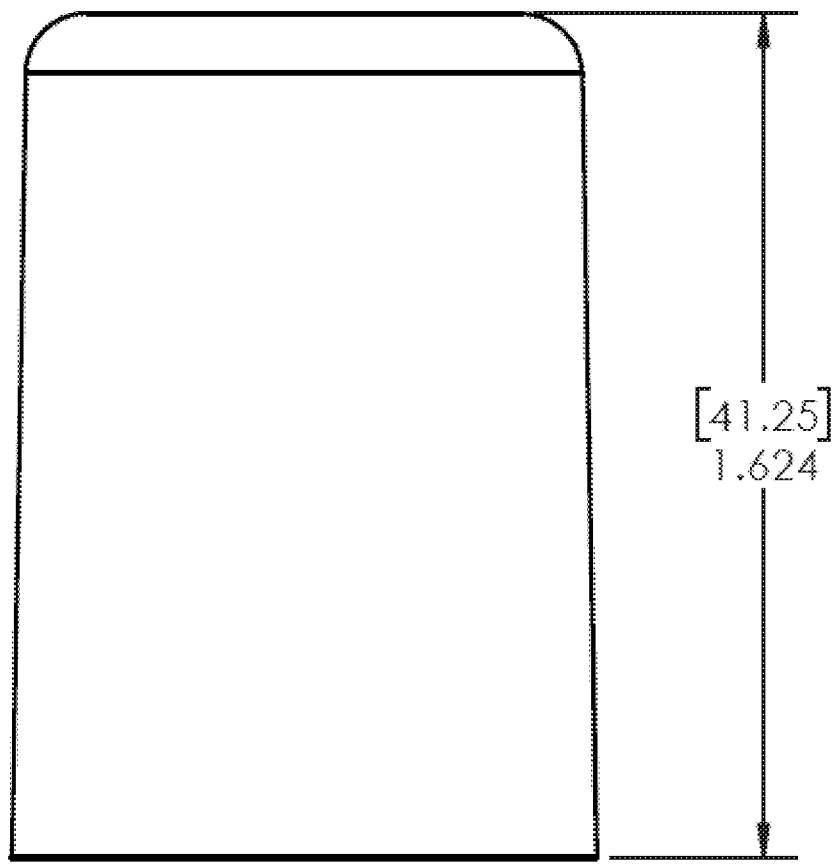
FIG. 17G depicts another mechanical diagram illustrating the cap of FIG. 6A and FIG. 6B for the US market in accordance with embodiments of the present disclosure.
Figure 17H:
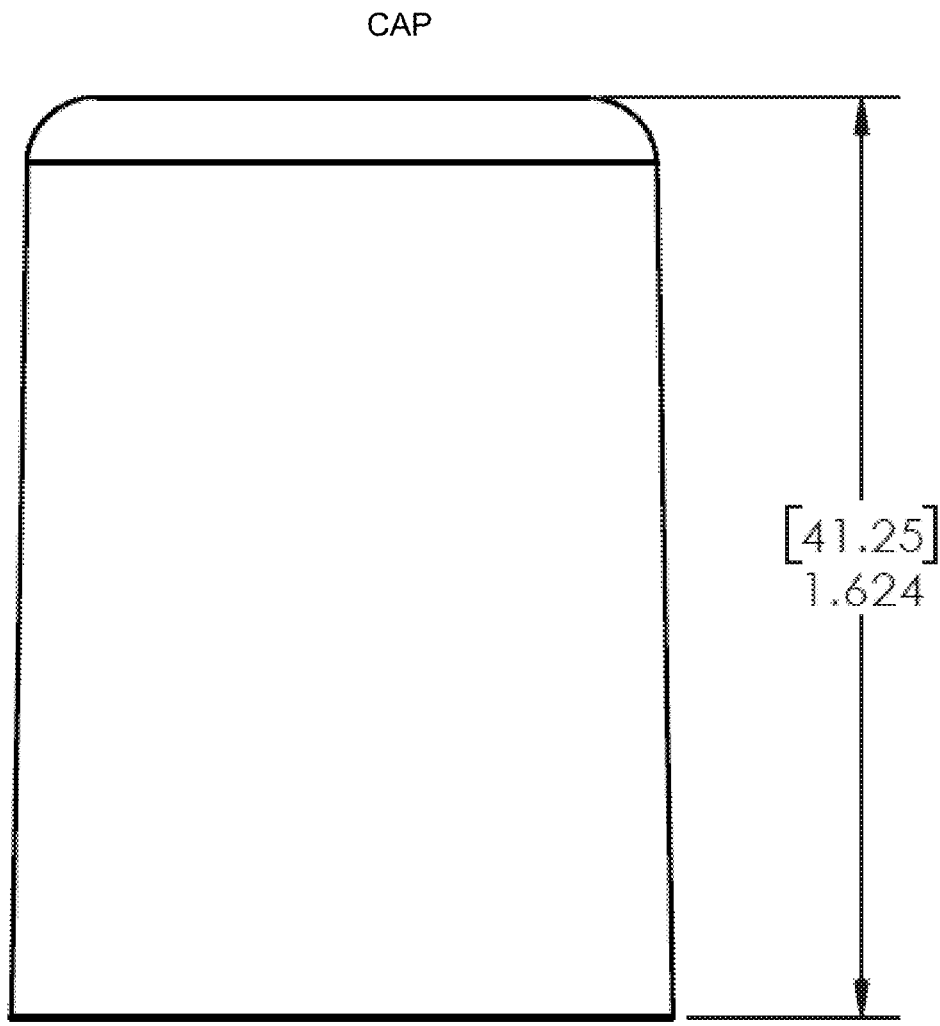
FIG. 17H depicts another mechanical diagram illustrating the cap of FIG. 6C and FIG. 6D for the Japan market in accordance with embodiments of the present disclosure.

FIG. 17A depicts a mechanical diagram 1700 illustrating a first view of the cap of FIG. 6A and FIG. 6B for the US market in accordance with embodiments of the present disclosure. FIG. 17B depicts a mechanical diagram 1710 illustrating a first view of the cap of FIG. 6C and FIG. 6D for the Japan market in accordance with embodiments of the present disclosure. FIG. 17C depicts a mechanical diagram 1720 illustrating a second view of the cap of FIG. 6A and FIG. 6B for the US market in accordance with embodiments of the present disclosure. FIG. 17D depicts a mechanical diagram 1730 illustrating a second view of the cap of FIG. 6C and FIG. 6D for the Japan market in accordance with embodiments of the present disclosure. FIG. 17E depicts a mechanical diagram 1740 illustrating a third view of the cap of FIG. 6A and FIG. 6B for the US market in accordance with embodiments of the present disclosure. FIG. 17F depicts a mechanical diagram 1750 illustrating a third view of the cap of FIG. 6C and FIG. 6D for the Japan market in accordance with embodiments of the present disclosure. FIG. 17G depicts a mechanical diagram 1760 illustrating a fourth view of the cap of FIG. 6A and FIG. 6B for the US market in accordance with embodiments of the present disclosure. FIG. 17H depicts a mechanical diagram 1770 illustrating a fourth view of the cap of FIG. 6C and FIG. 6D for the Japan market in accordance with embodiments of the present disclosure. Dimensions are presented in inches and millimeters as applicable.

Returning to performance criteria, the vibration sensor 106B of the device 102 (US and Japan market versions) is configured to measure acceleration and velocity on each of the three axes. Acceleration is measured in millimeters/second$^2$ as peak and root mean square (RMS). Velocity is measured in millimeters/second as peak and RMS. During the measurement interval a waveform is captured for each of the three axes. A fast Fourier transform (FFT) is extracted from the waveform. For a given frequency band a lines of resolution may be 800, 1600, or 3200. Up to six programmable bands are supported. The device 102 then calculates the root sum square (RSS) of the bands for transmitting via the RF interface.

The device 102 is further configured to take vibration measurements on a timed programmed schedule using the vibration sensor 106B. The timing interval of the measurement is programmable by a user. In certain embodiments, this timed schedule may range from once an hour to once a day. However, if during an interval where no measurement is to be made but the vibration sensor 10A senses a high vibration, the device 102 will wake up and take a measurement. This measurement can end up being just an overall value or also be a spectrum and/or a waveform measurement. During this event the temperature is also measured. The device 102 then goes and advertises that it has a measurement that needs to be uploaded via the RF interface 114. If a hub (or other aggregation device) responds to the advertisement, then the data is uploaded. If the device 102 does not receive a response to the advertisement, then the device 102 stores the data on the internal Flash memory to be uploaded at another time. Flash memory on the device 102 can store up to 300 measurements (100 for each axis). If the measurement is a timed measurement and there is no response to the advertisements, then the measurement is also stored in the internal memory. If during an advertisement the hub (or other aggregation device) is contacted and stored data is available, then the stored data is sent up in a first-in-first-out (FIFO) order until all data including the most recent measurement has been uploaded.

Typical battery life predictions for sensors have been specified as a number of days, weeks, and/or months. This way of specification creates false expectations to a user. The reason for this is the real battery life is directly affected by the (1) number of measurements performed and transmitted, (2) temperature of the environment and/or machine (i.e. batteries self-discharge rate is different for different temperatures), and (3) time the sensor device is active versus sleeping. However, device 102 is specified as a number of measurements cycles. Measuring all three axis takes consumes three measurement cycles. In certain embodiments, the battery 120 when fully charged is rated for a minimum of 1500 measurement cycles. In other embodiments, the battery 120 when fully charged is rated for a minimum of 1800 measurement cycles.

In conclusion, the previously described device 102 offers many improvements to sensor technology for condition monitoring. For example, the PCB assembly (i.e. single assembly), positions the communication interface 114 and the antenna 116 on the third rigid section (i.e. upper horizontal section) and at a highest point for an optimum line-of-sight RF transmission path and furthest from the machine being monitored.

Additionally, the PCB assembly provides for a direct mechanical transmission path to the vibration sensor 106B (e.g. precision triaxial MEMS accelerometer). The first rigid section (i.e. lower horizontal section) positions the vibration sensor 106B directly over the ¼-28 mounting stud. The first rigid section is mounted directly to the stainless steel base using two screws that are positioned at opposite sides of the vibration sensor 106B. This arrangement provides optimum vibration transfer for the condition monitoring of the machine.

Temperature transfer from the machine to the temperature sensor 108 via the ¼-28 mounting stud and the stainless steel base is further optimized using a copper feedthrough in the first rigid section of the PCB assembly. This arrangement eliminates the need to machine out the stainless steel base for positioning the temperature sensor 108 directly to the base. Such machining of the based and direct positioning of the temperature to the base may warp the first rigid section of the PCB assembly. This warping may also cause a reduction in vibration transfer to the vibration sensor 106B and reduce overall sensitivity of vibration measurements.

Other improvements include the use of a lower power lower sensitivity accelerometer (i.e. vibration sensor 106A) to allow the device 102 to operate in a sleep mode and wake up on a larger vibration to take more precise measurements including a wider frequency range using the vibration sensor 106B (e.g. precision triaxial MEMS accelerometer). The wake mode then activates the communication interface 114 and the antenna 116 for data transfer. This dual accelerometer arrangement allows for continuous vibration monitoring while maintaining low power usage.

Additionally the device 102 uses nonvolatile flash memory. As such, power may be shut down and data stored until a transmission opportunity is presented for the communication interface 114. For example the device 102 may not be within range of a sensor aggregation hub and/or network when data is recorded. Once the device 102 is moved within range of the hub and/or network the data may be transferred. The nonvolatile flash memory also allows the battery to fail and then be replaced without losing any recorded data.

Additional features and improvements include the ability to remotely program the device 102 for specific types of measurement including vibration spectrum ranges, temperature ranges, trigger levels, alarm reporting, etc.

The device 102 is compliant to International Electrotechnical Commission (IEC) 60529 including an IP66 rating including no ingress of dust and protected against powerful water jets. The device 102 is also compliant to National Fire Protection Association (NFPA) Publication 70, National Electric Code® (NEC) in Articles 500 to 506 for Class 1, Division 2, Groups A, B, C, & D.

While the embodiments have been described in connection with the preferred embodiments of the various FIG.s, it is to be understood that other similar embodiments may be used or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed is:

1. A machinery condition monitoring device comprising:
   an enclosure assembly comprising:
      a cap;
      a base mechanically coupled with the cap; and
      a support bracket mechanically coupled with the base; and
   a printed circuit board (PCB) assembly comprising:
      a first rigid section electrically coupled to a second rigid section using a first flexible PCB interconnect;
      a third rigid section electrically coupled with the second rigid section using a second flexible PCB interconnect, wherein the second rigid section comprises a battery clamp configured to secure a cylindrical shaped battery using a curved surface of the cylindrical shaped battery;
      a processor;
      a memory electrically coupled with the processor;
      a first sensor electrically coupled with the processor;
      a second sensor electrically coupled with the processor; and
      a communication interface electrically coupled with the processor; wherein:
      the first sensor is a wake-up sensor;

a height of the cylindrical shaped battery is greater than a diameter of the cylindrical shaped battery;

the first rigid section is positioned in a PCB arrangement to be perpendicular to the second rigid section and mechanically coupled with the support bracket using a first plurality of fastening devices, the third rigid section is positioned in the PCB arrangement to be perpendicular to the second rigid section and mechanically coupled with the support bracket using a second plurality of fastening devices;

the first rigid section is positioned in the PCB arrangement to be parallel to the third rigid section; and the support bracket and battery clamp are configured for allowing a replacement of the cylindrical shaped battery while maintaining the PCB arrangement.

2. The machinery condition monitoring device of claim 1, wherein the communication interface is a wireless communication interface and at least a portion of the cap is radio frequency (RF) transparent.

3. The machinery condition monitoring device of claim 2, wherein the machinery condition monitoring device when installed forms a shape of a tapered cylinder having a maximum height of 2.1 inches and a maximum diameter of 1.2 inches.

4. The machinery condition monitoring device of claim 3, wherein the wireless communication interface is a Bluetooth® Low Energy (BLE) interface.

5. The machinery condition monitoring device of claim 1, wherein the first sensor is a vibration sensor.

6. The machinery condition monitoring device of claim 5, wherein the vibration sensor is an accelerometer sensor.

7. The machinery condition monitoring device of claim 1, wherein the second sensor is a temperature sensor.

8. The machinery condition monitoring device of claim 7, wherein the temperature sensor comprises at least one of a thermocouple or a thermistor.

9. The machinery condition monitoring device of claim 1, wherein the cylindrical shaped battery is a lithium battery.

10. The machinery condition monitoring device of claim 1, wherein the processor and the memory are embedded in a microcontroller.

11. The machinery condition monitoring device of claim 1 further comprising a third sensor, wherein:

the first sensor is a low-sensitivity vibration sensor configured to operate in a sleep state of the machinery condition monitoring device and further configured to trigger the machinery condition monitoring device into an active state;

the second sensor is a temperature sensor; and the third sensor is a high-sensitivity vibration sensor configured to operate in the active state of the machinery condition monitoring device.

12. The machinery condition monitoring device of claim 11, wherein:

the third sensor is a triaxial accelerometer sensor having an x-axis, a y-axis, and a z-axis; and the triaxial accelerometer sensor is positioned such that the z-axis is perpendicular to a mounting surface of the base.

13. The machinery condition monitoring device of claim 12, wherein:

the base is configured to allow the mounting surface to be attached to a machine surface to allow monitoring of machine vibration and machine temperature;

the base is configured to allow the support bracket to be rotated by a user around a perpendicular axis of the mounting surface; and the PCB assembly and the triaxial accelerometer sensor are stationary relative to the support bracket.

14. The machinery condition monitoring device of claim 13, wherein the base comprises a threaded mounting stud positioned perpendicular to the mounting surface.

15. The machinery condition monitoring device of claim 1, wherein the cylindrical shaped battery is a ½AA battery.

16. The machinery condition monitoring device of claim 1, wherein:

the first rigid section is positioned between the base and the second rigid section; a the first sensor and the second sensor are positioned on the first rigid section; and the first sensor is configured to operate in a sleep state of the machinery condition monitoring device and further configured to trigger the machinery condition monitoring device into an active state.

17. The machinery condition monitoring device of claim 1, wherein:

the base includes a first set of threads in the shape of a helix positioned around a circumference of the base; and the cap is configured to be secured to the base using the first set of threads.

18. The machinery condition monitoring device of claim 17, wherein the cap forms a shape of a tapered cylinder.

19. A method of manufacturing a machinery condition monitoring device, the method comprising:

mechanically assembling a printed circuit board (PCB) assembly comprising:

a first rigid section electrically coupled to a second rigid section using a first flexible PCB interconnect;

a third rigid section electrically coupled with the second rigid section using a second flexible PCB interconnect, wherein the second rigid section comprises a battery clamp configured to secure a cylindrical shaped battery using a curved surface of the cylindrical shaped battery;

a processor;

a memory electrically coupled with the processor;

a first sensor electrically coupled with the processor;

a second sensor electrically coupled with the processor; and a communication interface electrically coupled with the processor;

and mechanically assembling the PCB assembly within an enclosure comprising;

a cap;

a base mechanically coupled with the cap; and a support bracket mechanically coupled with the base; wherein:

the first sensor is a wake-up sensor;

a height of the cylindrical shaped battery is greater than a diameter of the cylindrical shaped battery;

the first rigid section is positioned in a PCB arrangement to be perpendicular to the second rigid section and mechanically coupled with the support bracket using a first plurality of fastening devices, the third rigid section is positioned in the PCB arrangement to be perpendicular to the second rigid section and mechanically coupled with the support bracket using a second plurality of fastening devices;

the first rigid section is positioned in the PCB arrangement to be parallel to the third rigid section; and the support bracket and battery clamp are configured for allowing a replacement of the cylindrical shaped battery while maintaining the PCB arrangement.

20. A method comprising:

installing a machinery condition monitoring device on a machine, the machinery condition monitoring device comprising:
- a cylindrical shaped battery;
- an enclosure assembly comprising:
  - a cap;
  - a base mechanically coupled with the cap; and
  - a support bracket mechanically coupled with the base;

and a printed circuit board (PCB) assembly comprising:
- a first rigid section electrically coupled to a second rigid section using a first flexible PCB interconnect;
- a third rigid section electrically coupled with the second rigid section using a second flexible PCB interconnect, wherein the second rigid section comprises a battery clamp configured to secure the cylindrical shaped battery using a curved surface of the cylindrical shaped battery;
- a processor;
- a memory coupled with the processor;
- a first sensor coupled with the processor;
- a second sensor coupled with the processor; and
- a communication interface coupled with the processor;

wherein:
- the first sensor is a wake-up sensor;
- a height of the cylindrical shaped battery is greater than a diameter of the cylindrical shaped battery;
- the first rigid section is positioned in a PCB arrangement to be perpendicular to the second rigid section and mechanically coupled with the support bracket using a first plurality of fastening devices,
- the third rigid section is positioned in the PCB arrangement to be perpendicular to the second rigid section and mechanically coupled with the support bracket using a second plurality of fastening devices;
- the first rigid section is positioned in the PCB arrangement to be parallel to the third rigid section; and
- the support bracket and battery clamp are configured for allowing a replacement of the cylindrical shaped battery while maintaining the PCB arrangement;

and receiving first sensor data and second sensor data transmitted via the communication interface.

* * * * *